United States Patent
Ito

(10) Patent No.: US 11,043,962 B2
(45) Date of Patent: Jun. 22, 2021

(54) INFORMATION PROCESSING APPARATUS, INFORMATION PROCESSING METHOD, AND RECORDING MEDIUM

(71) Applicant: FUJITSU LIMITED, Kawasaki (JP)

(72) Inventor: Makiko Ito, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 120 days.

(21) Appl. No.: 16/267,531

(22) Filed: Feb. 5, 2019

(65) Prior Publication Data

US 2019/0265949 A1    Aug. 29, 2019

(30) Foreign Application Priority Data

Feb. 26, 2018    (JP) .............................. JP2018-032105

(51) Int. Cl.
*H03M 7/24*    (2006.01)
*G06F 7/38*    (2006.01)
*G06N 3/08*    (2006.01)

(52) U.S. Cl.
CPC .............. *H03M 7/24* (2013.01); *G06F 7/38* (2013.01); *G06N 3/084* (2013.01); *G06F 2207/3824* (2013.01)

(58) Field of Classification Search
CPC ........ G06F 7/483; G06F 7/38; G06F 9/30025; G06F 5/00; G06F 7/499–49921; G06F 7/49942; G06F 17/18; H03M 7/24; G06N 3/063; G06N 3/02–06; G06N 3/08
See application file for complete search history.

(56) References Cited

U.S. PATENT DOCUMENTS

| | | | | |
|---|---|---|---|---|
| 10,491,239 | B1* | 11/2019 | Hubara | G06F 7/49947 |
| 2017/0323197 | A1* | 11/2017 | Gibson | G06F 7/00 |
| 2017/0372202 | A1* | 12/2017 | Ginsburg | G06F 17/16 |
| 2018/0046894 | A1* | 2/2018 | Yao | G06F 7/483 |
| 2018/0157465 | A1* | 6/2018 | Bittner | G06N 3/063 |
| 2018/0315157 | A1* | 11/2018 | Ould-Ahmed-Vall | G06N 20/00 |
| 2018/0322391 | A1* | 11/2018 | Wu | G06N 3/084 |
| 2019/0042948 | A1* | 2/2019 | Lee | G06N 3/063 |
| 2019/0095175 | A1* | 3/2019 | Yamanaka | G06F 7/575 |
| 2019/0095777 | A1* | 3/2019 | Kim | G06N 3/063 |

(Continued)

FOREIGN PATENT DOCUMENTS

| | | | | |
|---|---|---|---|---|
| JP | 6-96048 | | 4/1994 | |
| JP | 7-84975 | | 3/1995 | |
| WO | WO-2018139266 | A1 * | 8/2018 | G06F 5/012 |

OTHER PUBLICATIONS

Lin et al. in "Fixed Point Quantization of Deep Convolutional Networks" on Proceedings of the 33rd International Conference on Machine Learning, 2016. Retrieved on [Jul. 21, 2020], Retrieved from the Internet <https://arxiv.org/pdf/1511.06393.pdf> (Year: 2016).*

(Continued)

*Primary Examiner* — Aimee Li
*Assistant Examiner* — Carlo Waje
(74) *Attorney, Agent, or Firm* — Fujitsu Patent Center

(57) ABSTRACT

An information processing apparatus includes a memory and a processor coupled to the memory. The processor acquires statistical information on a distribution of bits in floating point number data after executing an instruction on the floating point number data, and converts the floating point number data to fixed point number data.

16 Claims, 54 Drawing Sheets

(56) References Cited

U.S. PATENT DOCUMENTS

2019/0114142 A1* 4/2019 Yoda .................. G06F 9/30014
2019/0122094 A1* 4/2019 Chen ..................... G06F 7/483
2019/0236437 A1* 8/2019 Shin ...................... G06N 3/08
2019/0244097 A1* 8/2019 Notsu .................... G06N 3/063

OTHER PUBLICATIONS

T. Maruyama on "Fujitsu HPC and AI Processors" 2017. Retrieved on [Jul. 20, 2020], Retrieved from the Internet <https://www.fujitsu.com/global/Images/fujitsu-hpc-and-ai-processors.pdf> (Year: 2017).*
Ike et al. in "Technologies for Practical Application of Deep Learning" on Fujitsu Sci. Tech. J. vol. 53, pp. 14-19. Sep. 2017. Retrieved on [Jul. 20, 2020], Retrieved from the Internet <https://www.fujitsu.com/global/documents/about/resources/publications/fstj/archives/vol53-5/paper03.pdf> (Year: 2017).*
WO2018139266MT—Machine Translation of Foreign Patent Document WO-2018139266-A1. (Year: 2018).*
Dumas J. D. on Computer Architecture Fundamentals and Principles of Computer Design, Second Edition, Nov. 25, 2016. Retrieved from the Internet<https://doi.org/10.4324/9781315367118> (Year: 2016).*
M. Courbariaux et al., "Training Deep Neural Networks with Low Precision Multiplications", Accepted as a workshop contribution at ICLR 2015, International Conference on Learning Representations(ICLR), pp. 1-10, Sep. 23, 2015 (10 pages).

* cited by examiner

FIG. 4

| Format | Prop. | Up. | PI MNIST | MNIST | CIFAR-10 | SVHN |
|---|---|---|---|---|---|---|
| Goodfellow et al. (2013a) | 32 | 32 | 0.94% | 0.45% | 11.68% | 2.47% |
| Single precision floating point | 32 | 32 | 1.05% | 0.51% | 14.05% | 2.71% |
| Half precision floating point | 16 | 16 | 1.10% | 0.51% | 14.14% | 3.02% |
| Fixed point | 20 | 20 | 1.39% | 0.57% | 15.98% | 2.97% |
| Dynamic fixed point | 10 | 12 | 1.28% | 0.59% | 14.82% | 4.95% |

FIG. 13

| input | | | | | | | output |
|---|---|---|---|---|---|---|---|
| in[39] | in[38] | in[37] | in[36] | ... | in[1] | in[0] | out |
| 0 | 0 | 0 | 0 | ... | 0 | 0 | 0x8000000000 |
| 1 | 1 | 1 | 1 | ... | 1 | 1 | 0x8000000000 |
| 0 | 1 | b | b | ... | b | b | 0x4000000000 |
| 1 | 0 | b | b | ... | b | b | 0x4000000000 |
| 0 | 0 | 1 | b | ... | b | b | 0x2000000000 |
| 1 | 1 | 0 | b | ... | b | b | 0x2000000000 |
| 0 | 0 | 0 | 1 | ... | b | b | 0x1000000000 |
| 1 | 1 | 1 | 0 | ... | b | b | 0x1000000000 |
| ... | ... | ... | ... | ... | ... | ... | ... |
| 0 | 0 | 0 | 0 | ... | 1 | b | 0x0000000002 |
| 1 | 1 | 1 | 1 | ... | 0 | b | 0x0000000002 |
| 0 | 0 | 0 | 0 | ... | 0 | 1 | 0x0000000001 |
| 1 | 1 | 1 | 1 | ... | 1 | 0 | 0x0000000001 |

FIG. 15

| input | | | | | | | output |
|---|---|---|---|---|---|---|---|
| in[39] | in[38] | in[37] | in[36] | ... | in[1] | in[0] | out |
| 0 | b | b | b | ... | b | 1 | 0x0000000001 |
| 1 | b | b | b | ... | b | 0 | 0x0000000001 |
| 0 | b | b | b | ... | 1 | 0 | 0x0000000002 |
| 1 | b | b | b | ... | 0 | 1 | 0x0000000002 |
| ... | ... | ... | ... | ... | ... | ... | ... |
| 0 | b | b | 1 | ... | 0 | 0 | 0x1000000000 |
| 1 | b | b | 0 | ... | 1 | 1 | 0x1000000000 |
| 0 | b | 1 | 0 | ... | 0 | 0 | 0x2000000000 |
| 1 | b | 0 | 1 | ... | 1 | 1 | 0x2000000000 |
| 0 | 1 | 0 | 0 | ... | 0 | 0 | 0x4000000000 |
| 1 | 0 | 1 | 1 | ... | 1 | 1 | 0x4000000000 |
| 0 | 0 | 0 | 0 | ... | 0 | 0 | 0x8000000000 |
| 1 | 1 | 1 | 1 | ... | 1 | 1 | 0x8000000000 |

INFORMATION PROCESSING APPARATUS, INFORMATION PROCESSING METHOD, AND RECORDING MEDIUM

CROSS-REFERENCE TO RELATED APPLICATION

This application is based upon and claims the benefit of priority of the prior Japanese Patent Application No. 2018-032105, filed on Feb. 26, 2018, the entire contents of which are incorporated herein by reference.

FIELD

The embodiments discussed herein are related to an information processing apparatus, an information processing method, and recording medium.

BACKGROUND

Among the machine learning methods using artificial intelligence, the need for the deep learning (DL) is especially increasing. The deep learning may be considered as a machine learning method using a multilayered neural network (DNN: Deep Neural Network). FIG. 1 is a view exemplifying a configuration of a neural network. The neural network is a model of neurons set on a computer. Neurons have a cell body, dendrites that receive signals input from other cell bodies, and axons that output signals to other cell bodies. A signal transmission structure called a synapse is formed between the end of the axon that outputs a signal and the dendrite that receives the signal. In the neural network, information transmission between the neurons via the synapse is modeled.

In a multilayered neural network in which a neural network is multilayered, deep learning is executed. Then, the multilayered neural network tends to be scaled up in order to improve a recognition accuracy of the multilayered neural network where the deep learning is executed. For example, the number of parameters processed in the multilayered neural network ranges from several million to one hundred and several tens of millions. In order for the multilayered neural network to come close to a human brain, it is thought that the number of parameters ultimately approaches one hundred and several tens of billions. Therefore, in the future, it is expected that training data in the deep learning increases, and thus a calculation load and a memory load in the multilayered neural network will increase. Thus, for continuously increasing training data, improvement of recognition accuracy and a training speed is required. It is desirable to reduce the weight of the multilayered neural network so that the recognition accuracy and the training speed are improved so as to reduce a load.

Meanwhile, in the deep learning, various operations including a multiplication, a product-sum operation, and a vector multiplication are executed. Meanwhile, in the deep learning, a requirement for an individual operational accuracy is not as precise as in a normal operation processing. In the normal operation processing, for example, a programmer develops a computer program so as not to cause an occurrence of overflow of digits as much as possible. Meanwhile, in the deep learning, it is permissible that large values are saturated to some extent. This is because in the deep learning, the main processing is an adjustment of a coefficient (weight) at the time of a convolution operation of a plurality of input data pieces, and extreme data among the input data pieces is not regarded as important in many cases. Also, this is because since the coefficient is adjusted by repeatedly using a large amount of data, when digit adjustment is performed according to the progress of learning, even a value that was saturated once may be reflected in the adjustment of the coefficient without being saturated.

Therefore, in consideration of such a characteristic of the deep learning, in order to achieve, for example, a reduction of a chip area and an improvement of a power efficiency of an arithmetic processing apparatus for the deep learning, using an operation by a fixed point number without using a floating point number may be taken into consideration. This is because a circuit configuration may become simpler by a fixed point operation rather than a floating point number operation.

FIG. 2 exemplifies a configuration of bits used for data expression. Similarly to a 32-bit floating point number, a 16-bit fixed point number, and a 8-bit fixed point number, it is possible to reduce an amount of data to be handled in the multilayered neural network by reducing a bit width used for data expression in data (weights and parameters) to be processed by the deep learning. When the amount of data to be handled is reduced, it is expected that the throughput of the deep learning is increased, and a learning time is shortened.

However, since the dynamic range of a fixed point number is narrow, an operational accuracy may be deteriorated as compared to that of a floating point number. FIG. 3 exemplifies a modeled relationship between processings by a 32-bit floating point number, a 16-bit fixed point number, and an 8-bit fixed point number, and the accuracy of inference. In the drawing, a "fixed point number" is described as an "integer." The fixed point number is not limited to an integer. The fixed point number may also be understood as a binary integer, and thus, in the present specification, the fixed point number may be referred to as an integer. As in the drawing, it is expected that when a bit width is reduced, an operational accuracy is lowered. When the operational accuracy is lowered, the deep learning may not be properly implemented. That is, in the deep learning, product-sum operations may be repeated many times in forward and backward directions, so that an operation result may exceed the dynamic range of the fixed point number. Therefore, it is desired to overcome the above described problem caused by reduction of a bit width through a technique of improving the operational accuracy. Thus, a technique has been suggested in which the fixed point number is expanded.

For example, in a processing by a mixed fixed point, a unified decimal point position is not used for an entire program, but a decimal point position (Q format) suitable for each variable is used. As the Q format, for example, a Q3.12 format defines data of 16 bits including 1 digit for a sign bit, 3 digits for an integer part, and 12 digits below a decimal point. In the mixed fixed point, it is possible to perform a processing by varying a decimal point position for each variable, that is, digits of an integer part and digits below a decimal point.

In another example, in a processing by a dynamic fixed point (a dynamic fixed point number), a value range of a variable is acquired during execution, and a decimal point position is reviewed at a fixed timing. Accordingly, it may be said that in the mixed fixed point operation and the dynamic fixed point operation, aspects of the floating point operation are added to the fixed point operation that has a simple processing as compared to the floating point operation.

Also, there has been proposed a digital signal processor (DSP) that has a function for a program for executing a processing by a mixed fixed point operation and a dynamic fixed point operation. For example, there is a DSP that executes an operation instruction with a block•shift designation. In the operation instruction with a block•shift designation, an operation is executed with a bit width larger than a bit width of a variable, and a value from an operation result is shifted, cut out, and stored in a register for the variable. By this instruction, a shift amount S (e.g., −128 to 127) when the value is cut out from the operation result may be designated by an immediate value/general-purpose register. For example, when the DSP executes an instruction of Result=Saturate(((in1(operator)in2)>>S), 16), the operation result is shifted by S bits, and higher order bits are saturated while lower order 16 bits are left. When S>=0, the DSP arithmetically shifts the operation result to the right (that is, embeds a sign bit and shifts the operation result to the right), and then removes the lower order bits. Meanwhile, when S<0, the DSP arithmetically shifts the operation result to the left (that is, maintains a sign bit and shifts the operation result to the left), and removes the lower order bits in the complement.

Also, there has been proposed a DSP that executes a block count leading sign (BCLS) output. The BCLS output is a function by which the DSP takes a count leading sign of an operation result, and writes the result in a register. Here, the count leading sign refers to the most significant position of bit 1 with a positive number (the most significant position of bit 0 with a negative number). For example, when the DSP executes max(block_count_leading_sign(in1(operator) in2)−1), from an operation result by operators of variables in1 and int, the most significant position of bit 1 with a positive number (the most significant position of bit 0 with a negative number) is written in a register.

FIG. 4 exemplifies recognition error rates when a single precision floating point number, a half precision floating point number, a fixed point number, and a dynamic fixed point number are applied in deep learning (see Non-Patent Document 1). In FIG. 4, data in the first row (Goodfellow et al. (2013)) is an evaluation result of another article. In the table of FIG. 4, the symbol "Prop." indicates a bit width at the time of data propagation in the recognition (forward direction) and the learning (backward direction). The symbol "Up." indicates a bit width at the time of update of a weighting factor. The symbols "PI MNIST," "MNIST," "CIFAR-10," and "SVHN" indicate data sets used for the deep learning.

In a processing by a dynamic fixed point number according to Non-Patent Document 1, a presence or absence of overflow is recorded for each operation or variable assignment, and a rate of overflow (e.g., the number of times of overflowing operation with respect to the total number of times of operation and the number of times of overflowing assignment with respect to the total number of times of assignment) is calculated. Then, in this processing, for each predetermined period, a decimal point position of each variable is changed by the following procedures 1 and 2.

(Procedure 1) When the rate of overflow is larger than a prescribed value ($r_{max}$), a decimal point position is moved to the right by one.

(Procedure 2) When the value that is twice the rate of overflow is equal to or less than a prescribed value ($r_{max}$), a decimal point position is moved to the left by one.

As exemplified in FIG. 4, in the processing according to a conventional technique, a recognition error rate does not greatly increase even in the results by a single precision floating point number, a half precision floating point number, a fixed point number, and a dynamic fixed point number.

Related techniques are disclosed in, for example, Japanese Laid-open Patent Publication Nos. 06-096048 and 07-084975.

In addition, related techniques are disclosed in, for example, Courbariaux et al., "TRAINING DEEP NEURAL NETWORKS WITH LOW PRECISION MULTIPLICATIONS" accepted as a workshop contribution at ICLR 2015, International Conference on Learning Representations (ICLR), Sep. 23, 2015 (Non-Patent Document 1).

SUMMARY

According to an aspect of the embodiments, an information processing apparatus includes, a memory and a processor coupled to the memory. The processor acquires statistical information on a distribution of bits in floating point number data after executing an instruction on the floating point number data, and converts the floating point number data to fixed point number data.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 4 is a view exemplifying recognition error rates in deep learning;

FIG. 13 is a view exemplifying a truth table of a statistical information acquisition circuit that detects a most significant bit position;

FIG. 15 is a view exemplifying a truth table of a statistical information acquisition circuit that detects a least significant bit position;

DESCRIPTION OF EMBODIMENTS

As described above, even in the result of a processing by a dynamic fixed point number in a conventional technology, a recognition error rate does not greatly increase. However, in the technology of the related art, since a decimal point position is adjusted bit by bit based on an overflow rate, the accuracy of a learning result is deteriorated. For example, in a case where for each learning of k data pieces, a decimal point position is adjusted, when the decimal point position is shifted from a proper position by n bits, learning progresses (n*k) times until the decimal point position is adjusted to the proper position. As a result, an amount of data to be saturated or data to underflow increases until the decimal point position is placed at the proper position, so that the learning may not converge or the learning result accuracy may be deteriorated.

Hereinafter, descriptions will be made on an information processing apparatus according to an embodiment, with reference to the accompanying drawings. The following configuration of the embodiment is exemplary, and does not limit the present information processing apparatus.

Comparative Example

Figure 1:
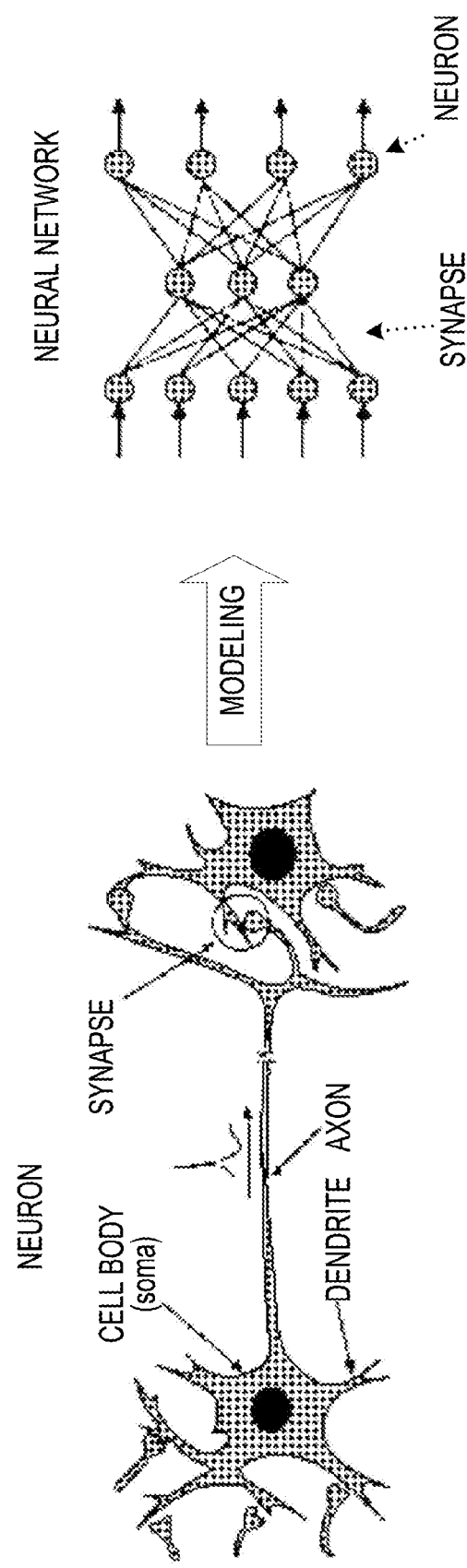
FIG. 1 is a view exemplifying a configuration of a neural network.
Figure 2:
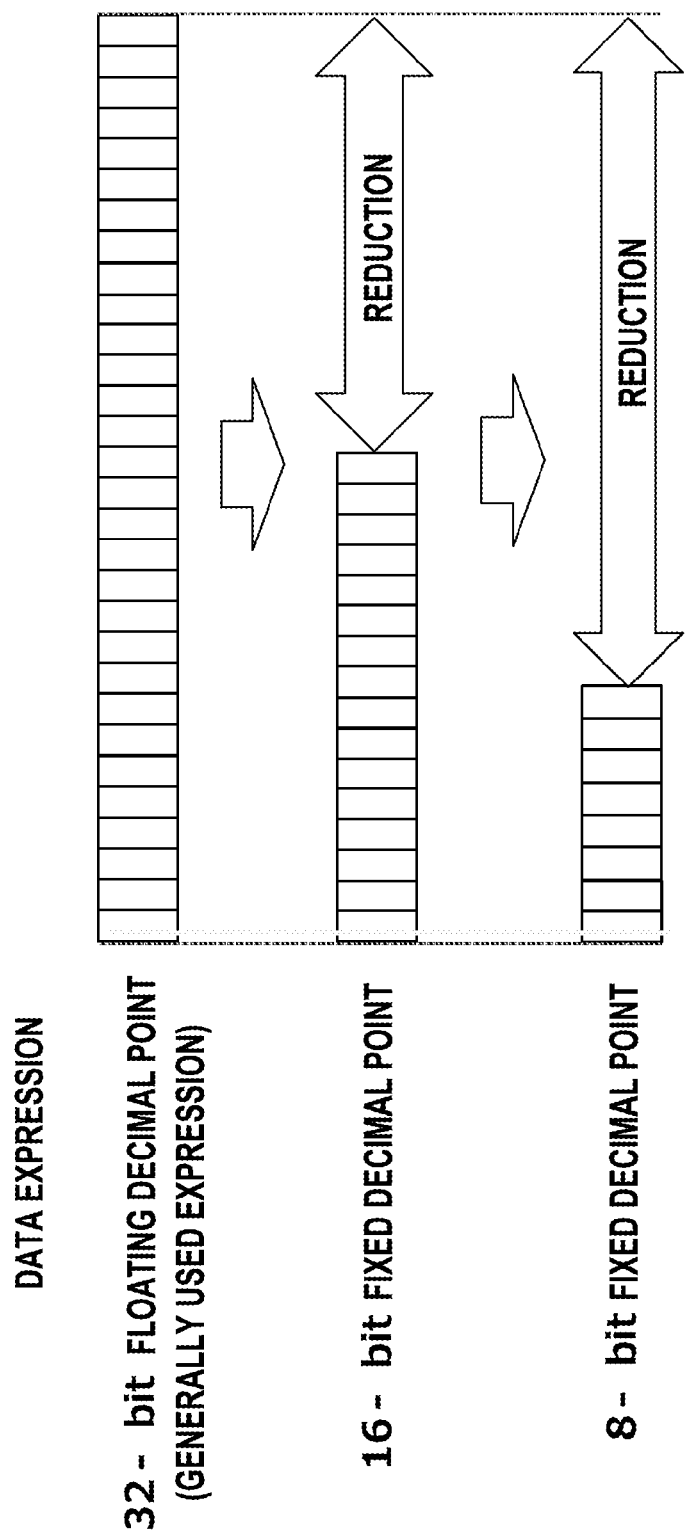
FIG. 2 is a view exemplifying a configuration of bits used for data expression.
Figure 3:
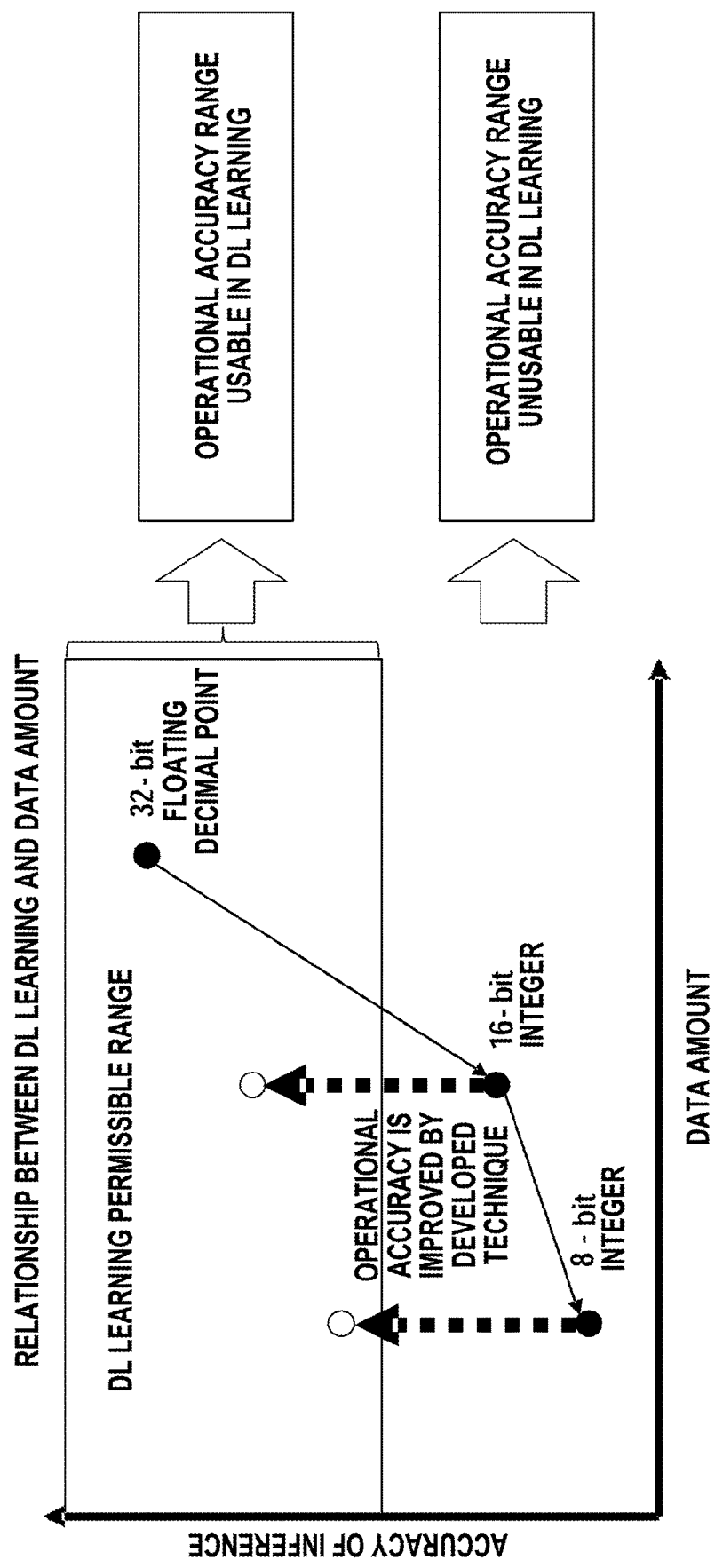
FIG. 3 is a view exemplifying a modeled relationship between processings by a 32-bit floating point number, a 16-bit fixed point number, and a 8-bit fixed point number, and the accuracy of inference.
Figure 5:
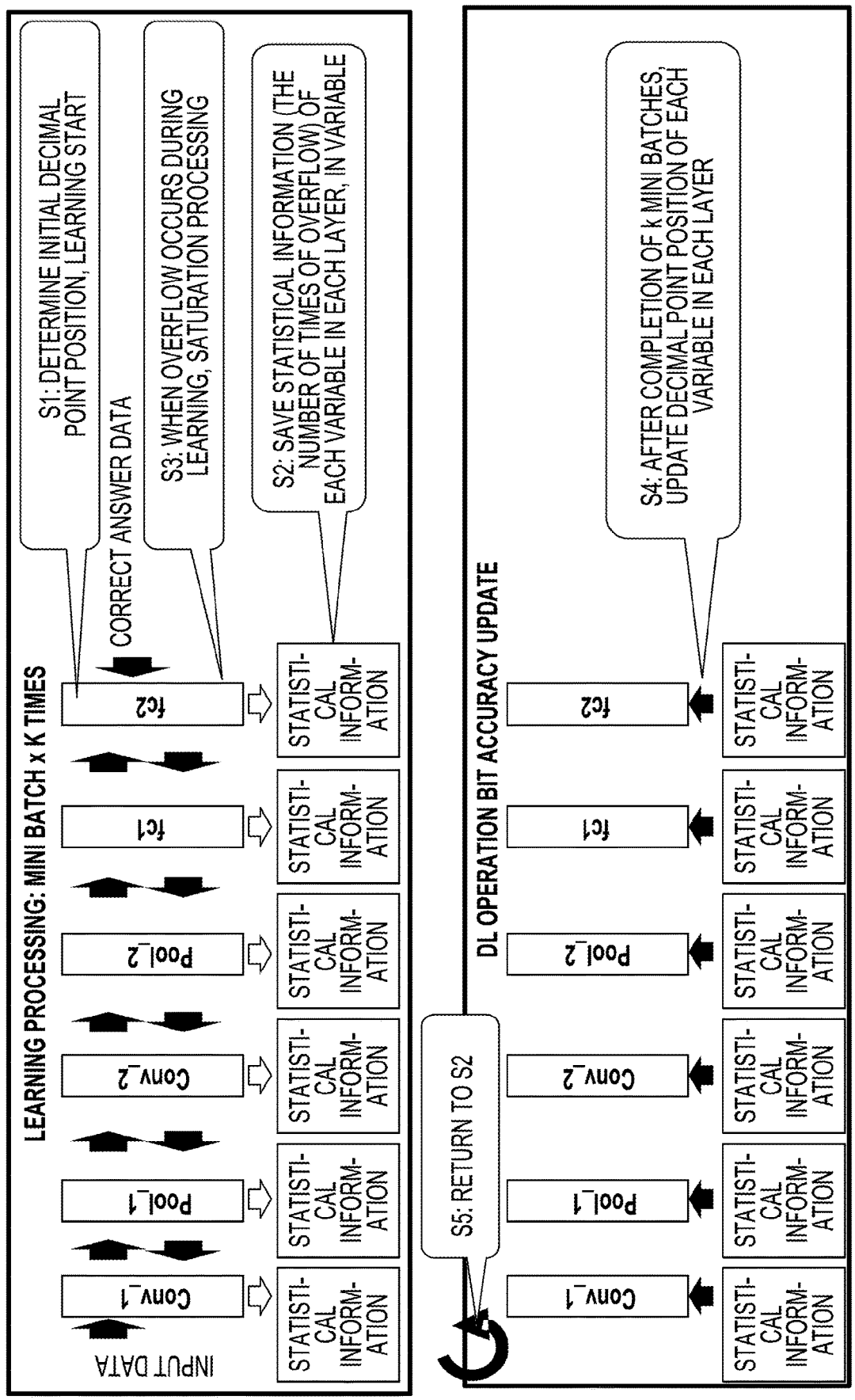
FIG. 5 is a view exemplifying a procedure of deep learning related to Comparative Example.
Figure 6:
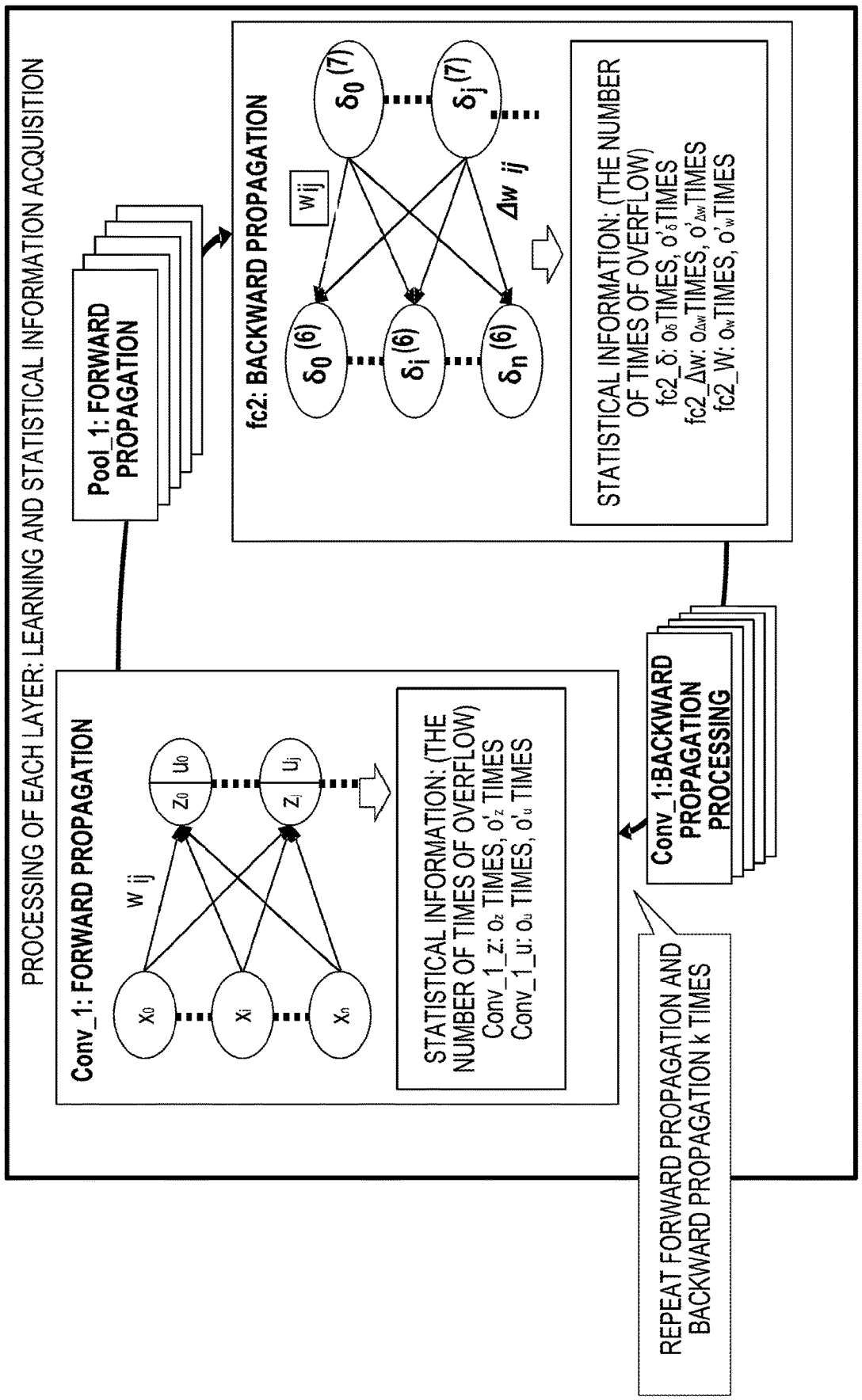
FIG. 6 is a view exemplifying details of a processing in each layer.
Figure 7:
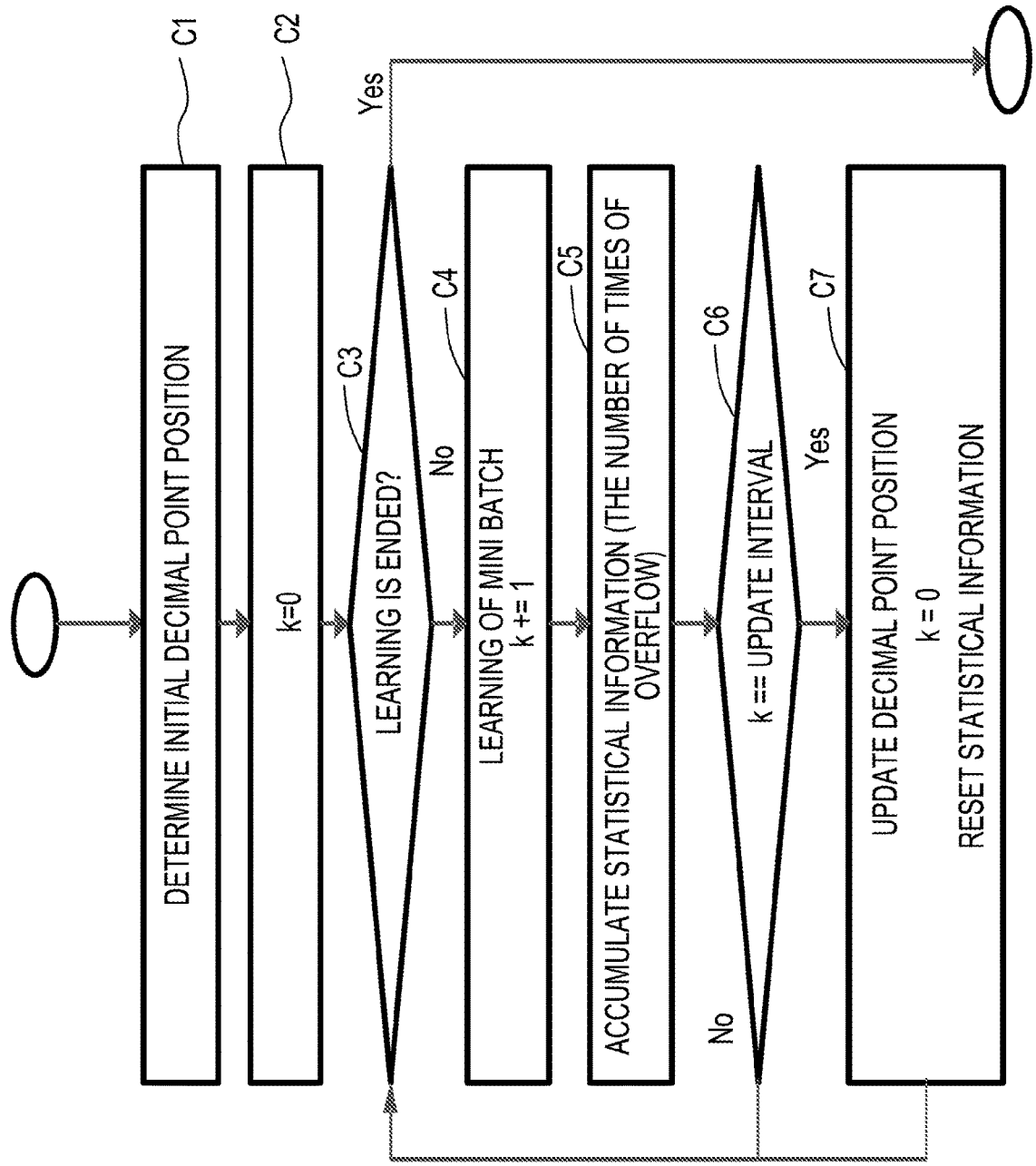
FIG. 7 is a view exemplifying a flowchart of a learning processing by an information processing apparatus according to Comparative Example.

With reference to FIGS. 5 to 7, descriptions will be made on deep learning in an information processing apparatus according to Comparative Example. FIG. 5 is a view exemplifying a procedure of deep learning related to Comparative Example. The information processing apparatus according to Comparative Example executes deep learning according to a computer program. The information processing apparatus according to Comparative Example has a processor capable of executing a processing of a dynamic fixed point number.

As in FIG. 5, the deep learning in Comparative Example is executed by processings of a convolution layer Conv_1 and a pooling layer Pool_1 in the first layer, a convolution layer Conv_2 and a pooling layer Pool_2 in the second layer, a fully connected layer 1 (fc1), and a fully connected layer 2 (fc2). The deep learning is executed while divided into processing apparatuses called mini batches. Here, the mini batch refers to a set of input data {(Ini, Ti), i=1 to N} to be learned. The mini batch refers to a processing apparatus of learning which is executed with such an individual set of input data (N data pieces). Here, the symbol "Ini" is input data (vector), and the symbol "Ti" is correct answer data (vector). The information processing apparatus according to Comparative Example acquires statistical information (e.g., the number of times of overflow of each variable) of each variable of each layer per predetermined number (k times) of mini batches during deep learning as described below, and accumulates the acquired statistical information in a variable in the computer program, so as to automatically adjust a decimal point position of fixed point number of a variable used for the deep learning.

The information processing apparatus according to Comparative Example determines an initial decimal point position of each variable by, for example, a trial with a floating point number (e.g., one mini batch) or a user designation, and starts learning (S1). Then, while learning k mini batches, the information processing apparatus saves the number of times of overflow of each variable of each layer, as statistical information (S2). Here, the information processing apparatus determines the presence or absence of overflow, counts the number of times, and substitutes the number of times for a counter variable that holds the number of times each time, for example, operation or substitution is performed for each variable in a program that executes learning.

When overflow occurs in a variable during the learning of a mini batch, a saturation processing is performed on the variable, and the learning is continuously performed (S3). Here, the saturation processing is a processing of clipping to a positive maximum value when a positive number overflows, and clipping to a negative minimum value when a negative number overflows.

Then, after completion of mini batches on k sets of data (after k learning processings are completed), the information processing apparatus obtains, for example, an overflow rate from the statistical information accumulated in the counter variable, and adjusts a decimal point position of a fixed point number based on the overflow rate (S4). Then, the information processing apparatus returns to the processing in S2, and carries on the learning.

FIG. 6 is a view exemplifying details of a processing in each layer in FIG. 5. In the drawing, the convolution layer Conv_1 and the pooling layer Pool_1 in the first layer, and the fully connected layer 2 (fc2) are exemplified. In this example, in the convolution layer Conv_1 in the first layer, a convolution operation is executed between input data ini=(x0, . . . , xn) and a weight (Wij), and, for example, z0, . . . , zj, . . . are calculated. With respect to, for example, z0, . . . , zj, . . . , an activation function is operated, and, for example, u0, . . . , uj, . . . are calculated. The information processing apparatus accumulates the number of times of overflow of the variables z0, . . . , zj, . . . in the convolution layer Conv_1 in the first layer, in a counter variable Conv_1_z. The information processing apparatus accumulates the number of times of overflow in, for example, the variables u0, . . . , uj, . . . in the convolution layer Conv_1 in the first layer, in the counter variable Conv_1_u. For example, when the counter variable Conv_1_u has an array, in the counter variable Conv_1_u(1), the number of overflowing variables among the variables u0, . . . , uj, . . . , is accumulated. In the counter variable Conv_1_u(2), the number of variables that overflow by doubling, among the variables u0, . . . , uj, . . . , is accumulated.

The operation result in the convolution layer Conv_1 in the first layer is propagated from the pooling layer Pool_1 in the first layer, to a further upper layer. Here, the information processing apparatus executes operation and accumulation of the number of times of overflow in the same manner in the second or higher layers as well. The information processing apparatus executes the above described operation in the upper layer as well and propagates the operation result to a further upper layer. Then, the information processing apparatus finally calculates error gradients $\delta 0^{(7)}, \ldots, \delta j^{(7)}, \ldots$ from a difference value between the obtained operation result, and correct answer data Ti. Then, the information processing apparatus executes propagation in the backward direction based on the error gradients $\delta 0^{(7)}, \ldots, \delta j^{(7)}, \ldots$. As a result, the information processing apparatus calculates errors $\delta 0^{(6)}, \ldots, \delta j^{(6)}, \ldots \delta n^{(6)}$ at the output of a lower order hierarchy (e.g., the fully connected layer 1 (fc1)) and a weight gradient value $\Delta Wij$ of the weight variable Wij with respect to the following weight. The weight Wij is updated using the weight gradient value $\Delta Wij$. Here, the information processing apparatus accumulates the number of times of overflow in the errors $\delta 0^{(6)}, \ldots, \delta j^{(6)}, \ldots, \delta n^{(6)}$, in a counter variable fc2_$\delta$. The information processing apparatus accumulates the number of times of overflow in the difference value $\Delta Wij$, in a counter variable fc2_$\Delta W$. The information processing apparatus accumulates the number of times of overflow in the weight variable Wij, in a counter variable fc2_W. The number of variables that overflows by doubling is also accumulated.

Then, the information processing apparatus calculates the weight gradients while propagating error gradients from the fully connected layer1 (fc1) to the convolution layer Conv_1 in the first layer by the inverse direction, so that the weight is updated. The information processing apparatus repeats a forward propagation and a backward propagation as described above k times by using k sets of input data. After completion of learning by these k mini batches, the information processing apparatus updates a decimal point position of fixed point number of each variable based on the number of times of overflow of a counter variable corresponding to each variable.

FIG. 7 exemplifies a flowchart of a learning processing by the information processing apparatus according to Comparative Example. In this processing, the information processing apparatus determines an initial decimal point position (C1). Then, the information processing apparatus initializes the number of times k to a value 0. Then, the information processing apparatus determines whether learning completion conditions are satisfied (C3). The learning is completed in a case where an error is equal to or less than a reference value in the fully connected layer (fc2) or the number of times of learning has reached a prescribed maximum value.

When the learning completion conditions are not satisfied, the information processing apparatus executes the following mini batch and counts up a variable k (C4). Then, the information processing apparatus accumulates the number of times of overflow, as statistical information, in each counter variable (C5). That is, the information processing apparatus accumulates the number of overflowing variables and the number of variables that overflow by doubling, in each layer.

Then, the information processing apparatus determines whether the number of times k has reached an update interval (C6). When it is determined that the number of times k has not reached the update interval, the information processing apparatus returns to the processing in C3. Meanwhile, when it is determined that the number of times k has reached the update interval, the information processing apparatus updates a decimal point position according to the number of times of overflow of a variable. For example, the information processing apparatus may obtain an overflow rate obtained by dividing the number of times of overflow by the number of times of operation execution, as in Non-Patent Document 1. Then, when the overflow rate exceeds a prescribed value, the information processing apparatus may extend an integer part of a corresponding variable by one bit by moving a decimal point position to the right by one. When a value that is twice the overflow rate is equal to or less than the prescribed value, the information processing apparatus may reduce an integer part by one bit by moving a decimal point position to the left by one. Then, the information processing apparatus 1 returns to the processing in C3.

However, in the above described processing, the number of times of overflow is accumulated for each operation of each layer, and then when an overflow rate exceeds a prescribed value, or when a value that is twice the overflow rate is less than the prescribed value, a decimal point position of fixed point number is shifted by one bit. This processing is a processing of updating a decimal point position of fixed point number based on the number of times of overflow or the overflow rate. It is difficult for the information processing apparatus to determine a proper decimal point position, from the number of times of overflow or the overflow rate.

Therefore, the processing in Comparative Example has a procedure in which a trial on a proper position is made through, for example, a processing of moving a decimal point position to the left or right by one at the time of update of a decimal point position of fixed point number, and a determination is repeatedly made from the result. Thus, until the information processing apparatus determines a proper decimal point position, the decimal point position is updated a plurality of times. For example, as described above, in a case where the information processing apparatus determines an overflow rate per k mini batches, and updates the decimal point position bit by bit, in order to shift the decimal point position by N bits, mini batches are executed N*k times (* indicates a multiplication). Thus, learning processing is repeated in a state where the decimal point position is improper. That is, saturation or underflow of fixed point number data may occur at an undesirable level during learning, which leads to deterioration in the accuracy of the learning result, and then to delay of convergence.

Since the information processing apparatus according to Comparative Example executes a processing of simply acquiring and accumulating the number of times of overflow in a program of deep learning, a learning time may increase. That is, since the information processing apparatus does not have a function of providing the program with information for determining a proper decimal point position, a code that accumulates the number of times of overflow may be embedded in the program and thus a processing time may increase.

First Embodiment

Hereinafter, descriptions will be made on an information processing apparatus 1 according to a first embodiment, an information processing method executed by the information processing apparatus 1, and a program executed by the information processing apparatus 1, with reference to FIGS. 8 to 25. The present embodiment is exemplary, and the information processing apparatus 1 is not limited by the configuration of the present embodiment.

<Statistical Information>

In the present embodiment, a processor of the information processing apparatus 1 acquires statistical information, thereby reducing overhead in a program for acquiring the statistical information. Here, the statistical information acquired by the processor refers to, for example, any one of the followings, or a combination thereof. An application program executed by the information processing apparatus 1 acquires the statistical information from the processor so as to optimize a decimal point position. According to the processing of the application program, the processor executes an instruction for a dynamic fixed point operation.

(1) Distribution of Most Significant Bit Positions

Figure 8:
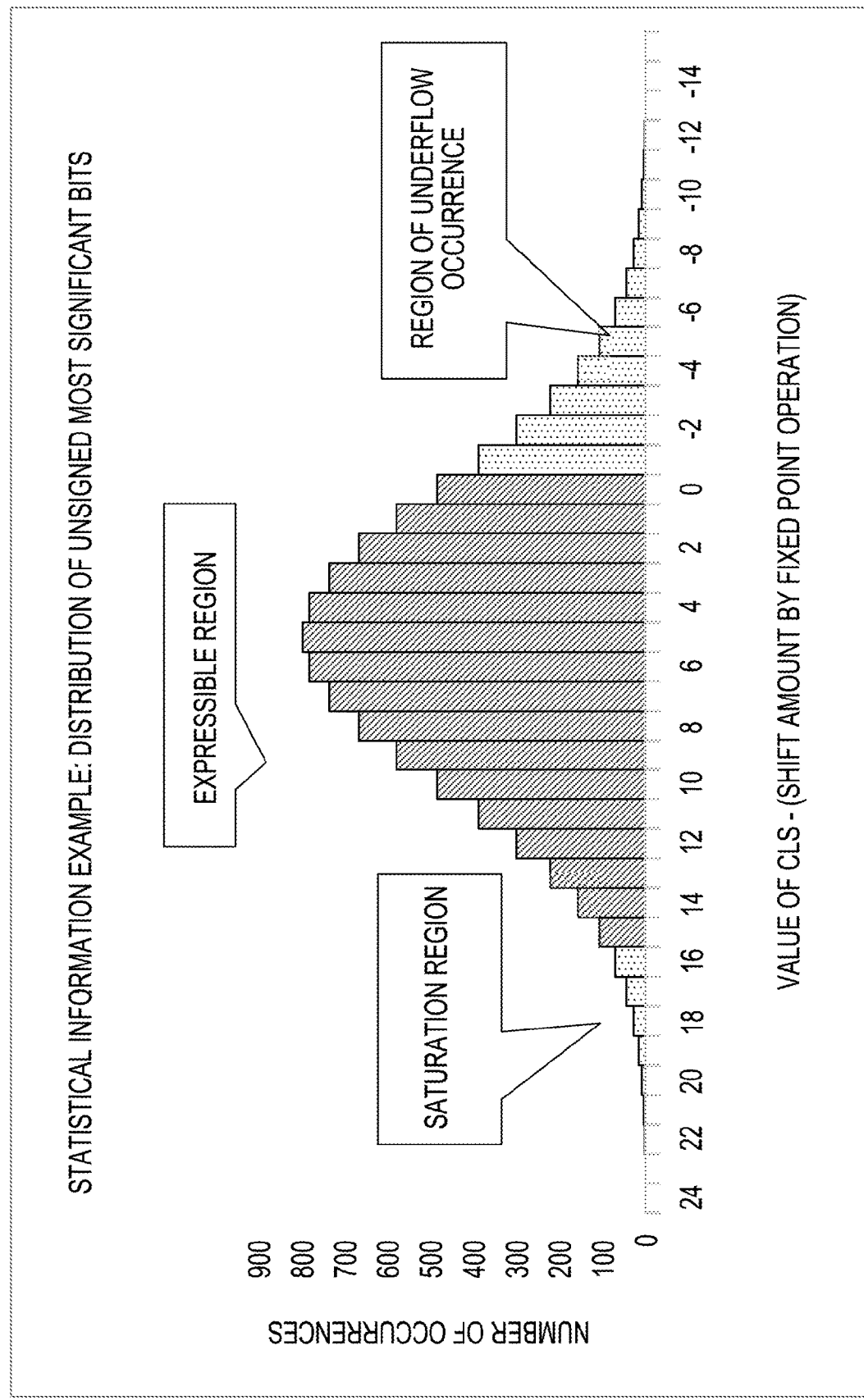
FIG. 8 is a view exemplifying distribution data of most significant bit positions.

FIG. 8 exemplifies distribution data of most significant bit positions. FIG. 8 corresponds to an example on data shifted to the right by 14 bits for the purpose of a digit alignment of a fixed point number, in which an intermediate result of an operation is 40 bits. The most significant bit position refers to the most significant bit position where the bit is 1 for a positive number, and refers to the most significant bit position where the bit is 0 for a negative number. The most significant bit position indicates, for example, a bit position having the largest index k among bits[k] different from bit[39] (a sign bit) when bits are arranged from bit[39] as the most significant bit, to bit[0] as the least significant bit. When a distribution of the most significant bit positions is obtained, it becomes possible to grasp a distribution range of values as absolute values.

In FIG. 8, the vertical axis indicates the number of occurrences of a most significant bit position, and the horizontal axis indicates a position count leading sign (CLS) of the most significant bit. In FIG. 8, it is assumed that there is a decimal point on the right side of bit 0. In the present embodiment, an arithmetic circuit of the processor of the information processing apparatus 1 and a register within the arithmetic circuit have a bit width (e.g., 40 bits) equal to or greater than the number of bits (e.g., 16 bits) of a register specified by an operand of an instruction. Meanwhile, the bit width of the arithmetic circuit of the processor of the information processing apparatus 1, and the register within the arithmetic circuit is not limited to 40 bits. The operation result is stored in a register (a register specified by an operand of an instruction) having a smaller bit width than the arithmetic circuit such as a register of 16 bits. As a result, the operation result (e.g., 40 bits) is shifted by a shift amount specified by the operand. Then, bits corresponding to the bits less than bit 0 are subjected to a predetermined rounding processing, and data (data exceeding bit 15) exceeding the bit width of the register specified by the operand is saturated.

Numerical values given to the horizontal axis in FIG. 8 indicate numerical values that may be represented by a fixed decimal point. For example, when the information processing apparatus 1 shifts the fixed point number by −2 bits (shifts to the right by 2 bits), the most significant bit shifts to a position of 14. Then, a region to be saturated is extended by 2 bits, and a region which becomes 0 by occurrence of an underflow is reduced by 2 bits. That is, when the information processing apparatus 1 moves a decimal point position to the left by 2 bits, the region to be saturated is extended by 2 bits, and the region in which an underflow occurs is reduced by 2 bits. For example, when the information processing apparatus shifts the fixed point number by 2 bits in the positive direction (shifts to the left by 2 bits), the most significant bit shifts to a position of 18. Then, a region to be saturated is reduced by 2 bits, and a region where an underflow occurs is extended by 2 bits. That is, when the information processing apparatus 1 moves a decimal point position to the right by 2 bits, the region to be saturated is reduced by 2 bits, and the region in which an underflow occurs is extended by 2 bits.

The information processing apparatus 1 may obtain a distribution of most significant bit positions during learning execution, so as to immediately determine a proper shift amount in a dynamic fixed point operation, that is, a proper decimal point position of fixed point number. For example, the information processing apparatus 1 may determine the decimal point position of fixed point number such that a ratio of data to be saturated becomes a specified ratio or less. That is, in an example, the information processing apparatus 1 may determine the decimal point position of fixed point number by prioritizing that data is saturated to a predetermined extent rather than that an underflow of data occurs to a predetermined extent.

Figure 9:
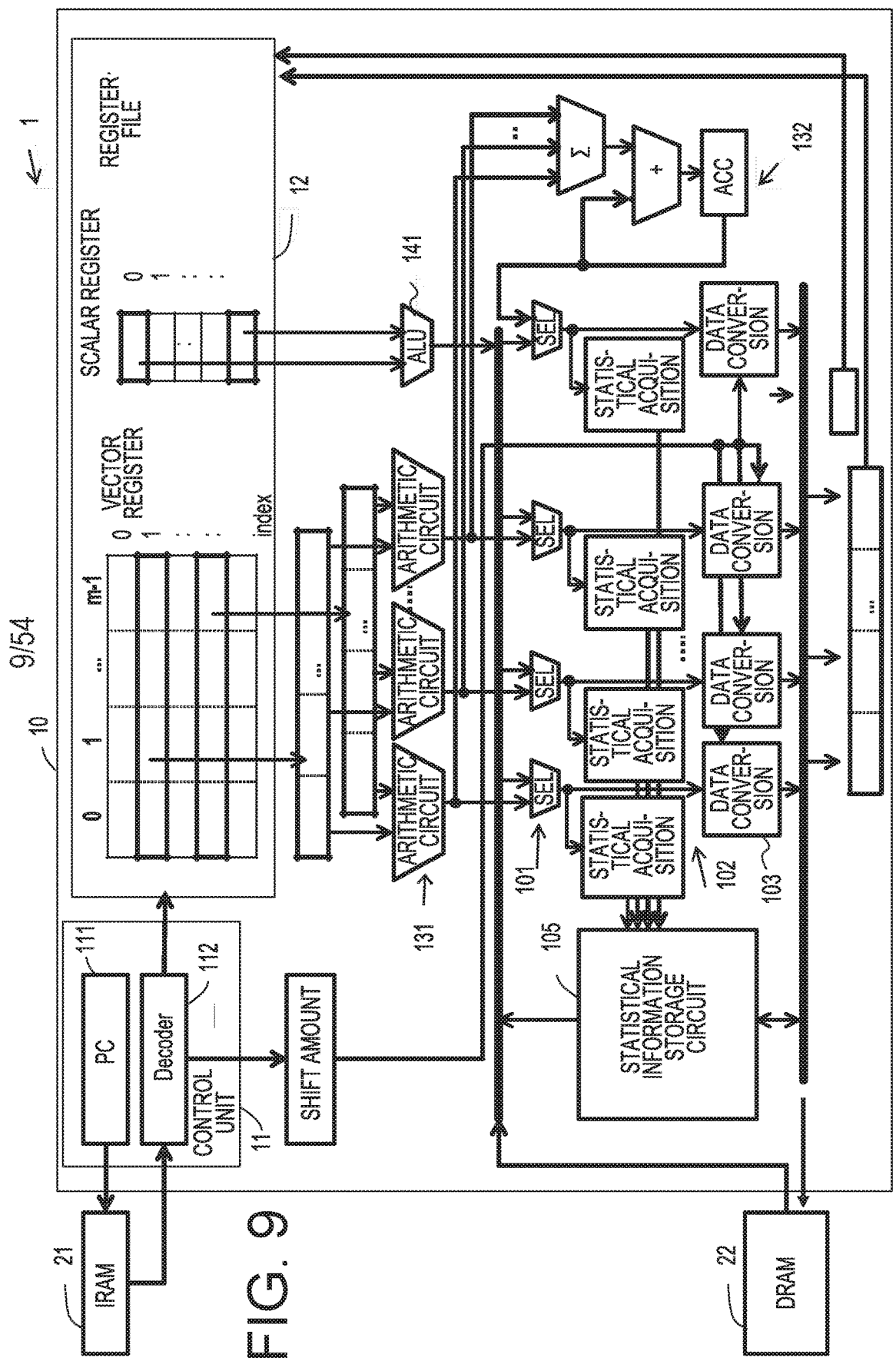
FIG. 9 is a view exemplifying a configuration of a processor.

The distribution of the most significant bit positions is integrated within a predetermined register (also referred to as a statistical information register) within a processor 10 of the information processing apparatus 1 (see FIG. 9). The processor 10 executes commands such as reading and writing of distribution data from/to the corresponding statistical information register, and clearing of the statistical information register. Thus, in the statistical information register, distribution data on one or more fixed point numbers that become command execution targets from the execution of a previous-time clear command to the present time is accumulated. The accumulated distribution data is read to a memory by a read command. The processor 10 may execute a command to perform loading into the statistical information register instead of the clear command, so that a value 0 may be loaded in the statistical information register.

(2) Distribution of Least Significant Bit Positions

The distribution of least significant bit positions indicates the least significant bit position where a bit has a value different from a sign. For example, the least significant bit position indicates a bit position having the smallest index k among bits[k] different from bit[39] (a sign bit) when bits are arranged from bit[39] as the most significant bit to bit[0] as the least significant bit. In the distribution of the least significant bit positions, least significant bits including valid data are grasped.

(3) Maximum Value of Most Significant Bit Positions

A maximum value of most significant bit positions is the maximum value among most significant bit positions having values different from a value of a sign bit with respect to one or more fixed point numbers that become command execution targets from the time of execution of a previous-time clear command to the present time. The information processing apparatus 1 may use the maximum value of the most significant bit positions in determining a proper shift amount in a dynamic fixed point operation, that is, a proper decimal point position.

The processor 10 executes commands such as reading of the maximum value from the statistical information register, and clearing of the statistical information register. Therefore, in the statistical information register, maximum values from the execution of the previous-time clear command to the present time are accumulated, and the maximum values are read to the memory by a read command.

(4) Minimum Value of Least Significant Bit Positions

A minimum value of least significant bit positions is the minimum value among least significant bit positions having different values from a sign with respect to one or more fixed point numbers from the time of execution of a previous-time clear command to the present time. The information processing apparatus 1 may use the minimum value of the least significant bit positions in determining a proper shift amount in a dynamic fixed point operation, that is, a proper decimal point position.

The processor 10 executes commands such as reading and clearing of the minimum value from the statistical information register. Accordingly, in the statistical information register, the minimum values from the execution of the previous-time clear command to the present time are accumulated, and then are read to the memory by a read command.

<Configuration>

FIG. 9 exemplifies a configuration of the processor 10 in the information processing apparatus 1. In FIG. 9, together with the processor 10, an instruction memory (IRAM) 21 and a data memory (DRAM) 22 are also exemplified. The processor 10 is a single instruction multiple data (SIMD)-type arithmetic processing apparatus.

The processor 10 includes a control unit 11 including a program counter (PC) 111 and a decoder 112, a register file 12, a vector operation arithmetic circuit 131, a scalar operation arithmetic circuit (arithmetic logic unit (ALU)) 141, and an accumulator 132 that adds the result of the vector operation arithmetic circuit 131. The processor 10 includes a plurality of selectors 101 that select operation results of, for example, the vector operation arithmetic circuit 131, the scalar operation arithmetic circuit 141, and the accumulator 132, and read results from the data memory 22. In the drawing, a plurality of selectors are collectively referred to as the selector 101. A plurality of vector operation arithmetic circuits are collectively referred to as the arithmetic circuit 131.

The processor 10 includes a statistical information acquisition circuit 102 that acquires statistical information from data selected by the selector 101, and a statistical information storage circuit 105 that stores the statistical information acquired by the statistical information acquisition circuit 102. The statistical information acquisition circuit 102 and the statistical information storage circuit 105 are examples of an acquisition circuit that acquires statistical information on a distribution of bits in fixed point number data after an instruction is executed for the fixed point number data. In the drawing, a plurality of statistical information acquisition circuits are collectively referred to as the statistical information acquisition circuit 102.

The processor 10 includes a data converting circuit 103 that changes a decimal point position of fixed point number of data selected by the selector 101. In the drawing, a plurality of data converting circuits are collectively referred to as the data converting circuit 103.

As in the drawing, an instruction is fetched from an address of the instruction memory 21 indicated by the program counter 111, and the decoder 112 decodes the fetched instruction. In the drawing, an instruction fetching control circuit that executes fetching of an instruction is omitted.

When the decoder 112 decodes the instruction, respective units of the processor 10 are controlled according to the decoded result. For example, when the decoded result is a vector operation instruction, data in a vector register of the register file 12 is input to the vector operation arithmetic circuit 131, and a vector operation is executed. The operation result of the vector operation arithmetic circuit 131 is supplied to the statistical information acquisition circuit 102 and the data converting circuit 103 through the selector 101. The operation result of the vector operation arithmetic circuit 131 is input to the accumulator 132, and the operation result of the vector operation arithmetic circuit 131 is added to, for example, a cascade. The operation result of the accumulator 132 is supplied to the statistical information acquisition circuit 102 and the data converting circuit 103 through the selector 101.

For example, when, as a result of the decoding, the instruction is a scalar operation instruction, data in a scalar register of the register file 12 is input to the scalar operation arithmetic circuit 141. Similarly to the operation result of the accumulator 132, the operation result of the arithmetic circuit 141 is supplied to the statistical information acquisition circuit 102 and the data converting circuit 103 through the selector 101.

For example, when, as a result of the decoding, the instruction is a load instruction, data is read from the data memory 22, and is supplied to the statistical information acquisition circuit 102 and the data converting circuit 103 through the selector 101. The result obtained through data conversion in the data converting circuit 103 is stored in a register of the register file 12.

When, as a result of decoding, the instruction is an instruction to execute a dynamic fixed point operation, the decoder 112 instructs a shift amount to be supplied to the data converting circuit 103. The shift amount is acquired from, for example, an operand (immediate value) of an instruction, a register specified by an operand, and the data memory 22 of an address indicated by an address register specified by an operand and is supplied to the data converting circuit 103. The processing in FIG. 9 is an example in which a decoder acquires specifying shift amount from an instruction.

The data converting circuit 103 shifts fixed point number data obtained from, for example, the result of the vector operation, the result of the scalar operation, the operation result of the accumulator 132, or the result read from the data memory 22, by a specified shift amount S. The data converting circuit 103 executes not only shifting, but also a saturation processing of higher order bits and a rounding of lower order bits. The data converting circuit 103 includes a rounding processing circuit that rounds lower order S bits as a decimal part with respect to, for example, an operation result of 40 bits as input, a shifter that executes arithmetic shifting, and a saturation processing circuit that performs a saturation processing.

The rounding processing circuit rounds lower order S bits as a decimal part. When S is negative, the rounding processing circuit does not perform anything. As for the rounding, rounding to nearest, rounding to 0, rounding to positive infinity, rounding to negative infinity, and random number rounding are exemplified. The shift amount when the data converting circuit 103 shifts the fixed point number data is a shift amount acquired from the instruction by the decoder as exemplified in, for example, FIG. 9.

A shifting circuit performs an arithmetic shift to the right by S bits when S is positive, and performs an arithmetic shift to the left, that is, an arithmetic left shift by −S bits when S is negative. The saturation processing circuit outputs 2E15 with respect to a shift result equal to or greater than 2E15-1 (positive maximum value), outputs −2E15 with respect to a shift result equal to or less than −2E15 (negative minimum value), or outputs lower order 16 bits of the input in other cases. Here, 2E15 represents the fifteenth power of 2.

Then, the data converting circuit 103 maintains a sign of higher order bits at the time of the left shift, and performs a saturation processing on bits other than the sign bit. That is, the data converting circuit 103 discards a higher order bit, and embeds 0 into a lower order bit. At the time of the right shift, the data converting circuit 103 embeds a sign bit into a higher order bit (a bit at a lower order than a sign bit). Then, the data converting circuit 103 outputs data obtained as described above through rounding, shifting, and saturation processing, with the same bit width (e.g., a register of 16 bits) as, for example, a register of the register file 12.

Accordingly, a computer program executed in the processor 10 specifies a shift amount in an operand of an instruction that executes a dynamic fixed point operation, so that the processor 10 updates a decimal point position of a fixed point number by the specified shift amount during program execution.

As a result of decoding, when the instruction is an instruction that indicates acquisition of statistical information (referred to as an instruction with a statistical information acquisition function), the statistical information is acquired by the statistical information acquisition circuit 102, and is stored in the statistical information storage circuit 105. Here, as described above, the statistical information is (1) a distribution of most significant bit positions, (2) a distribution of least significant bit positions, (3) a maximum value of most significant bit positions, (4) a minimum value of least significant bit positions, or a combination thereof.

Figure 10:
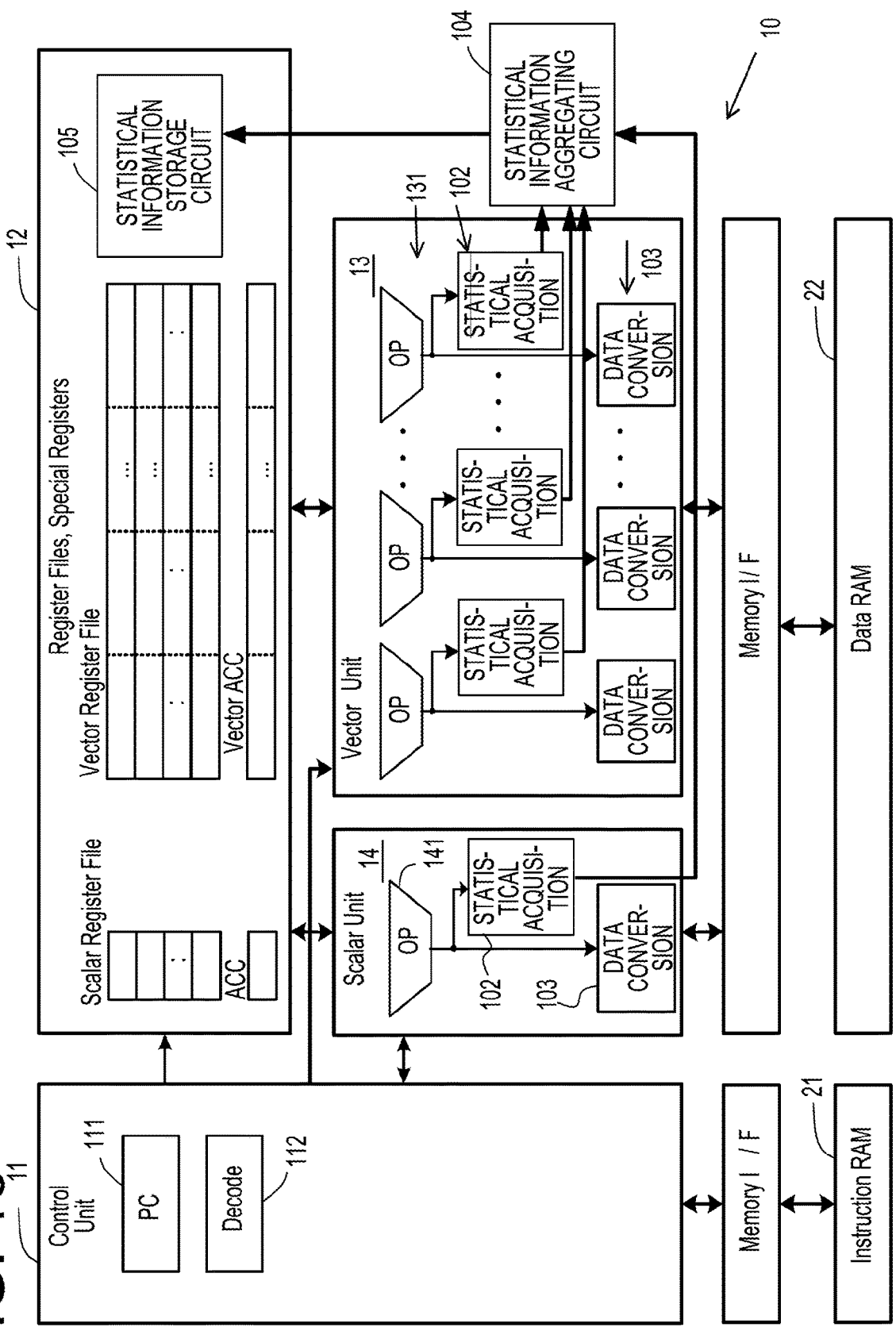
FIG. 10 is a view exemplifying a circuit block of the processor.

FIG. 10 exemplifies a circuit block of the processor 10 in FIG. 9. The processor 10 includes the control unit 11, the register file 12, a vector unit 13, and a scalar unit 14. The control unit 11 includes the program counter 111 and the decoder 112. The register file includes a vector register file, an accumulator register (Vector ACC) for a vector operation, a scalar register file, and an accumulator register (ACC) for a scalar operation. The vector unit 13 includes the vector operation arithmetic circuit 131, the statistical information acquisition circuit 102, and the data converting circuit 103. The scalar unit 14 includes the scalar operation arithmetic circuit 141, the statistical information acquisition circuit 102, and the data converting circuit 103.

In the configuration example of FIG. 10, a statistical information aggregating circuit 104 that aggregates statistical information from the plurality of statistical information acquisition circuits 102 is added. The statistical information storage circuit 105 is set as a part of the register file 12. The instruction memory 21 is connected to the control unit 11 via a memory interface (memory I/F). The data memory 22 is connected to the vector unit 13 and the scalar unit 14 via the memory interface (memory I/F).

Figure 11:
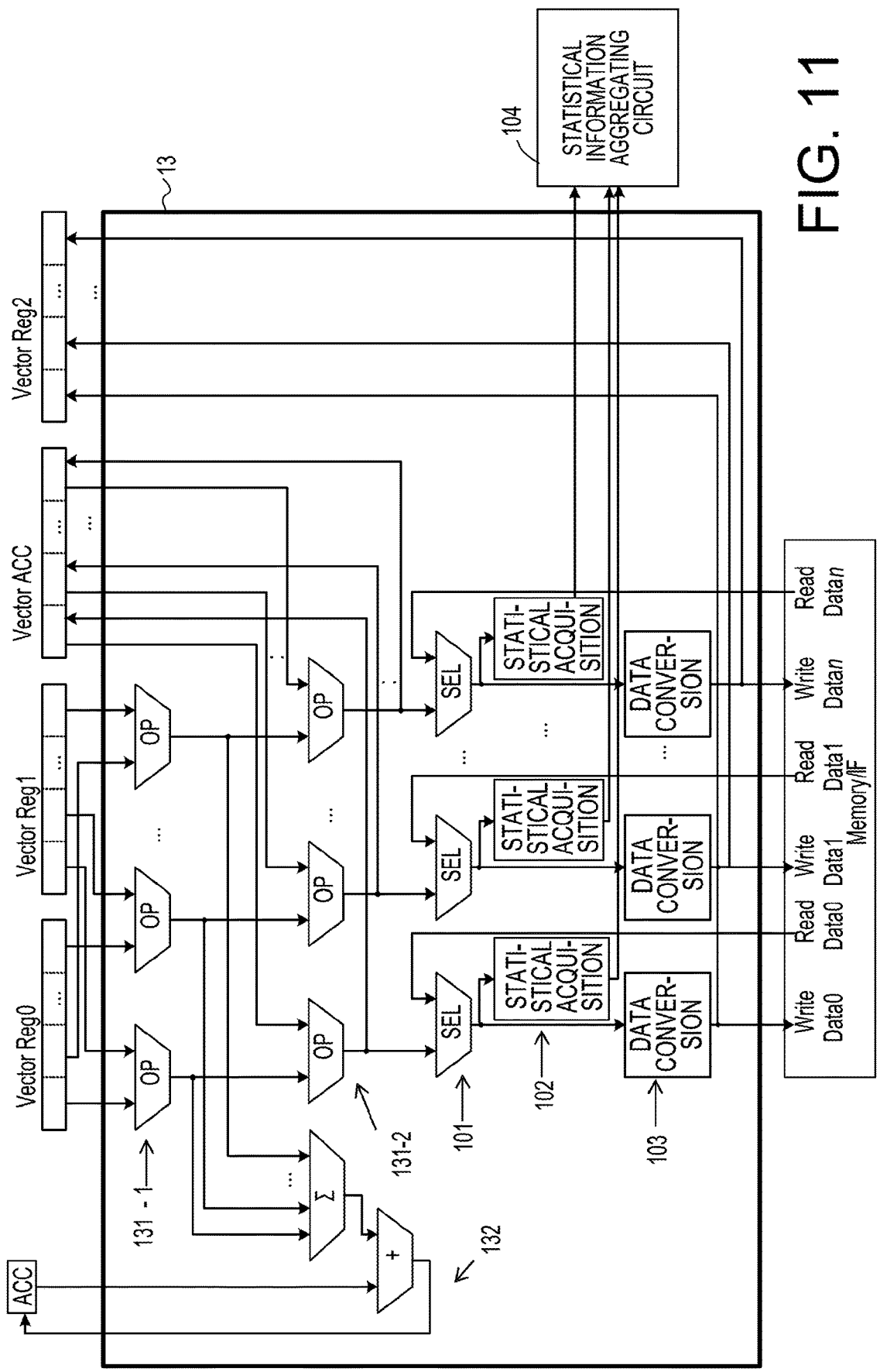
FIG. 11 is a view exemplifying details of a vector unit.

FIG. 11 exemplifies details of the vector unit 13. In FIG. 11, the statistical information aggregating circuit 104 is also exemplified. The vector unit 13 operates data in vector registers Vector Reg0 and Vector Reg1 by the vector operation arithmetic circuit 131-1. The operation result of the vector operation arithmetic circuit 131-1 is input to the accumulator 132 for a product-sum operation, and the vector operation arithmetic circuit 131-2.

The accumulator 132 for the product-sum operation scalar-adds the operation result of the vector operation arithmetic circuit 131-1, and stores the result in the accumulator register (ACC) for a scalar operation. According to an operation mode specified by the instruction, the vector operation arithmetic circuit 131-2 outputs the operation result of the vector operation arithmetic circuit 131-1, data of the accumulator register (Vector ACC) for a vector operation, or an addition result thereof.

The selector 101 selects either the output result of the vector operation arithmetic circuit 131-2, or the result read from the data memory 22 (Read Data 0, . . . , Read Data n), and inputs the selected one to the statistical information acquisition circuit 102 and the data converting circuit 103. The statistical information acquired by the statistical information acquisition circuit 102 is input to the statistical information aggregating circuit 104. The data obtained through a data conversion by the data converting circuit 103 is stored in the data memory 22 (Write Data 0, . . . , Write Data n) or held in the vector register (Vector Reg2) via a selector (not illustrated).

Figure 12:
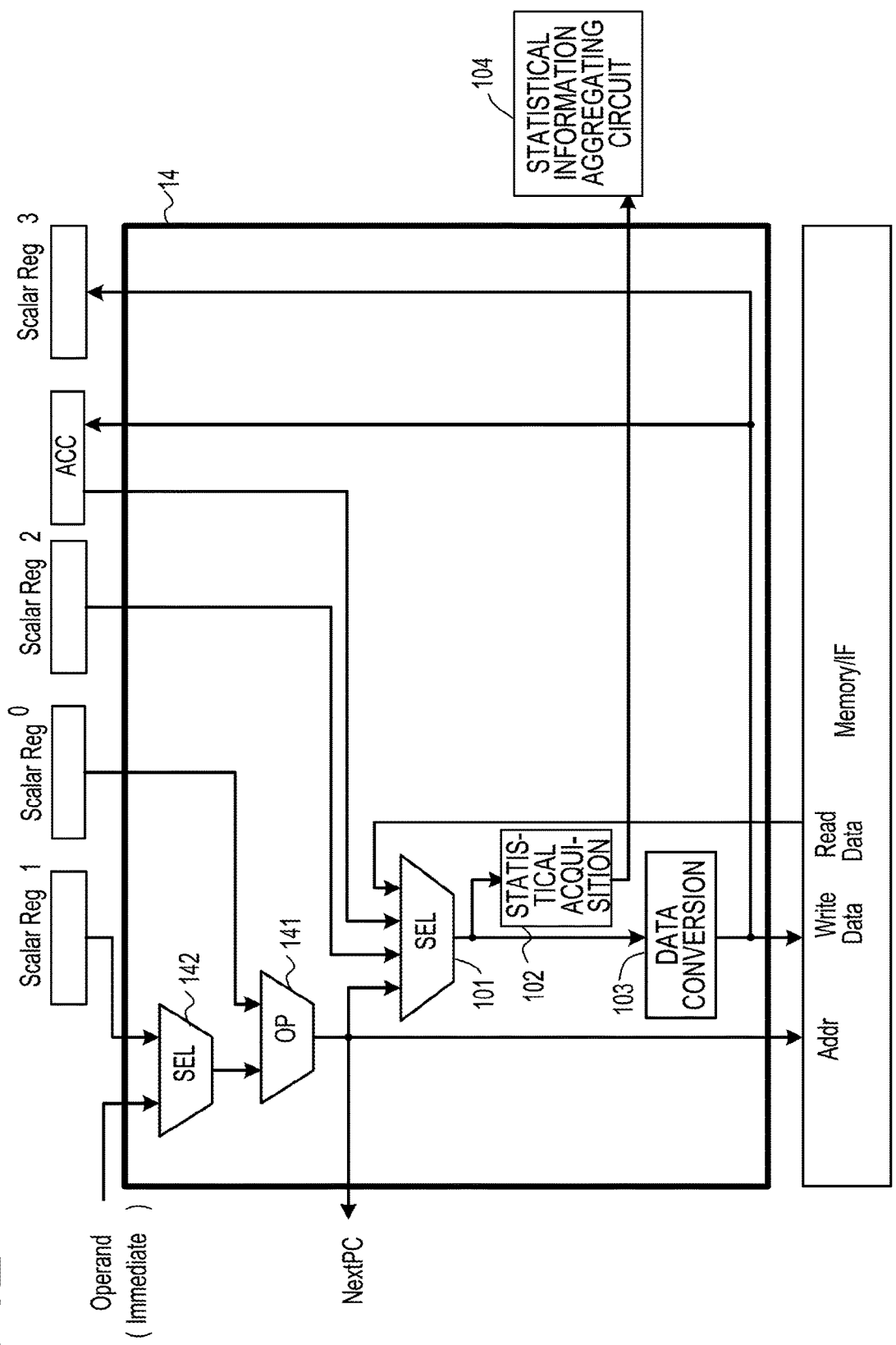
FIG. 12 is a view exemplifying a configuration of a scalar unit.

FIG. 12 exemplifies the configuration of the scalar unit 14. The scalar unit 14 includes a selector 142 that selects either data obtained from an immediate operand or data from a scalar register Scalar Reg1, and the scalar arithmetic circuit 141 that operates the selection result of the selector 142 and data of a scalar register Scalar Reg0. The operation result of the scalar arithmetic circuit 141 is stored in an address (e.g., Addr) of the data memory 22 via the memory interface (memory I/F). The operation result of the scalar arithmetic circuit 141 is input to the statistical information acquisition circuit 102 and the data converting circuit 103 via the selector 101.

The selector 101 selects any one of the operation result of the scalar arithmetic circuit 141, data of a scalar register Scalar Reg2, data of the accumulator register (ACC) for a scalar operation, and data (Read Data) read through the memory interface (memory I/F). The selector 101 inputs the selected data to the statistical information acquisition circuit 102 and the data converting circuit 103. The statistical information acquisition circuit 102 acquires statistical information from data input from the selector 101, and inputs the acquired statistical information to the statistical information aggregating circuit 104.

Hereinafter, among the statistical information acquisition circuits 102, one that acquires a most significant bit position will be referred to as a statistical information acquisition circuit 102A. Among the statistical information acquisition circuits 102, the one that acquires a least significant bit position will be referred to as a statistical information acquisition circuit 102B. Among the statistical information aggregating circuits 104, the one that counts bit positions acquired by the statistical information acquisition circuit 102 and acquires a bit distribution with respect to the bit positions will be referred to as a statistical information aggregating circuit 104A. Among the statistical information aggregating circuits 104, the one that performs an OR operation of bit positions acquired by the statistical information acquisition circuit 102 in a preliminary step of acquiring a maximum value and a minimum value of the bit positions will be referred to as a statistical information aggregating circuit 104B.

FIG. 13 exemplifies a truth table of the statistical information acquisition circuit 102A that detects a most significant bit position. As in FIG. 13, the statistical information acquisition circuit 102A outputs a binary bit pattern in which a position of a bit that firstly becomes 1 is set to 1, and other bit positions are set to 0, through a search on bits in a direction from bit in[38] toward the lower order bit, for a positive number. The statistical information acquisition circuit 102A outputs a binary bit pattern in which a position of a bit that firstly becomes 0 is set to 1, and other bit positions are set to 0, through a search on bits in a direction from in[38] toward the lower order bit, for a negative number. When all bits of input data are 0 or all bits are 1, the statistical information acquisition circuit 102A outputs 1 to a 39th bit, and 0 to 38th or lower bits.

Figure 14:
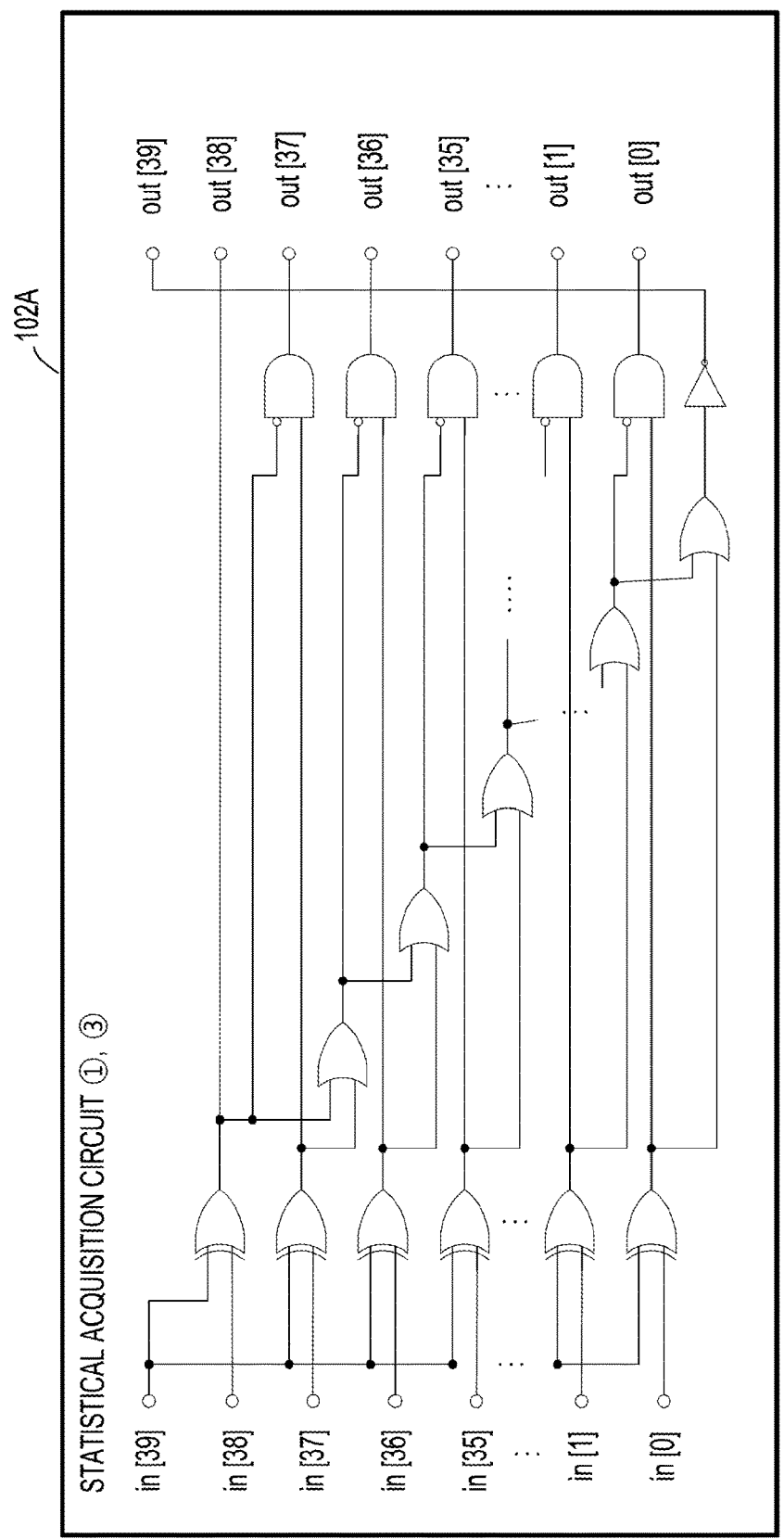
FIG. 14 is a view exemplifying a configuration of a hardware circuit of the statistical information acquisition circuit that acquires a most significant bit position.

FIG. 14 exemplifies a configuration of a hardware circuit in the statistical information acquisition circuit 102A that acquires a most significant bit position. In this circuit, exclusive OR (EXOR) between the sign bit in[39] and other bits (in[38] to in[0]) is executed. Then, the exclusive OR value by a bit having the same value as the sign bit in[39] becomes 0, and the exclusive OR value by a bit having a different value from the sign bit in[39] becomes 1.

Here, for example, when in[38] and in[39] have different values, out[38] of output data becomes 1 by exclusive OR. Meanwhile, the exclusive OR value of in[39] and in[37] is input to out[37] of the output data via an AND gate. To one input of the AND gate, a bit value obtained by inverting the exclusive OR value of in[39] and in[38] is input. Thus, when in[39] does not match in[38], regardless of the exclusive OR value of in[39] and in[37], the output of the AND gate becomes 0.

Hereinafter, in a similar situation, the input with logical NOT of the AND gate from which out[i] (i is 37 or less) is output becomes 0 when all the exclusive ORs of in[39] and in[j] (j is i+1 or more, and 38 or less) are 0. When the exclusive OR value of in[39] and in[i] (i is 37 or less) becomes 1, 1 is set to out[i]. For the bits at lower orders than the corresponding bit position (i), the input with logical NOT of the AND gate from which out[i] is output becomes 1, and thus 0 is set to out[i]. Accordingly, by the circuit of FIG. 14, output data out (40 bits) is acquired in which 1 is set to the most significant bit position, and 0 is set to other bit positions. The statistical information acquisition circuit 102A that acquires the most significant bit position as in FIGS. 13 and 14 is an example of a circuit that acquires a position of the most significant bit not matching a sign bit in fixed point number data after instruction execution. The output data out (40 bits) in which 1 is set to the most significant bit position, and 0 is set to other bit positions is an example of a bit string that indicates the position of the most significant bit not matching the sign bit, with a true value (1).

FIG. 15 exemplifies a truth table of the statistical information acquisition circuit 102B that detects a least significant bit position. As in FIG. 15, the statistical information acquisition circuit 102B outputs a binary bit pattern in which a position of a bit that becomes 1 for the first time is set to 1, and other bit positions are set to 0 through a search on bits in a direction from in[0] toward the higher order bit, for a positive number. Further, the statistical information acquisition circuit 102B outputs a binary bit pattern in which a position of a bit that becomes 0 for the first time is set to 1, and other bit positions are set to 0, through a search on bits in a direction from in[0] toward the higher order bit, for a negative number. When all bits of input data are 0, or all bits are 1, the statistical information acquisition circuit 102B outputs 1 to a 39th bit, and 0 to 38th or lower bits.

Figure 16:
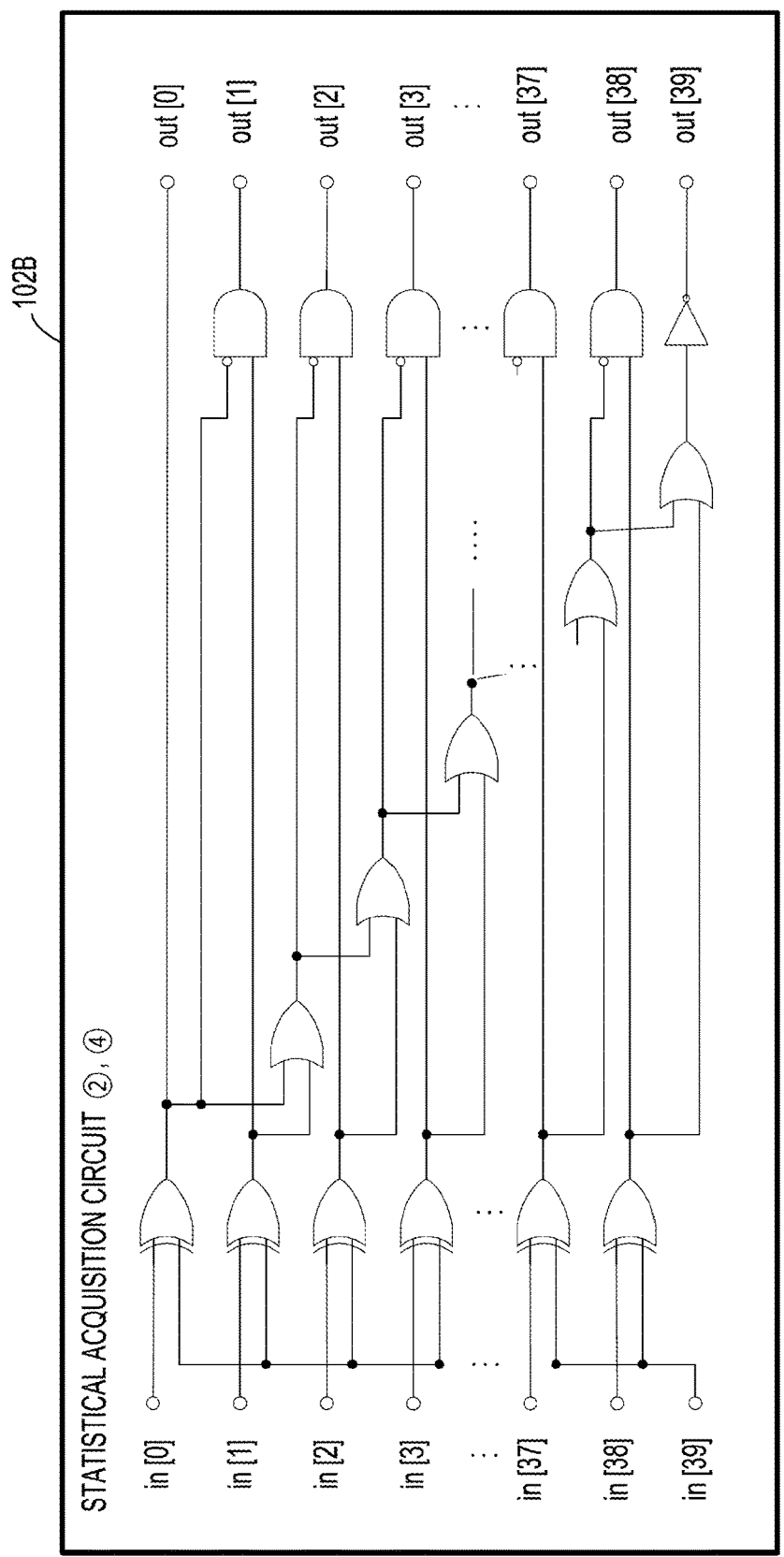
FIG. 16 is a view exemplifying a configuration of a hardware circuit of the statistical information acquisition circuit that acquires a least significant bit position.

FIG. 16 exemplifies a configuration of a hardware circuit in the statistical information acquisition circuit 102B that acquires a least significant bit position. When the sign bit in[39] is 0, the statistical information acquisition circuit 102B may search for a bit position where the bit is 1 from the least significant bit in[0] toward the higher order side. Meanwhile, when the sign bit in[39] is 1, since data is complementary, the statistical information acquisition circuit 102B may search for a bit position where the bit is 0 from the least significant bit in[0] toward the higher order side.

That is, in this circuit, exclusive OR (EXOR) between the sign bit in[39] and other bits (in[0] to in[38]) is executed. Then, the exclusive OR value by a bit having the same value as the sign bit in[39] becomes 0, and the exclusive OR value by a bit having a different value from the sign bit in[39] becomes 1.

Here, for example, when in[0] and in[39] have different values, out[0] of output data becomes 1 by exclusive OR. Meanwhile, the exclusive OR value of in[39] and in[1] is input to out[1] of the output data via an AND gate. To one input of the AND gate, a bit value obtained by inverting the exclusive OR value of in[39] and in[0] is input. Thus, when the exclusive OR value of in[39] and in[0] is 1, regardless of the exclusive OR value of in[39] and in[1], the output of the AND gate becomes 0.

Hereinafter, in a similar situation, the input with logical NOT of the AND gate from which out[i] (i is 1 or more) is output becomes 0 when all the exclusive ORs of in[39] and in[j] (j is 0 or more, and i−1 or less) are 0. When the exclusive OR value of in[39] and in[i] (i is 1 or more) becomes 1, 1 is set to out[i]. To the output data out[i] at a higher order than the corresponding bit, 0 is set. Accordingly, by the circuit of FIG. 16, output data out (40 bits) is acquired in which 1 is set to the least significant bit position, and 0 is set to other bits. The statistical information acquisition circuit 102B that acquires the least significant bit position as in FIGS. 15 and 16 is an example of a circuit that acquires the least significant bit position not matching a sign bit. The output data out (40 bits) in which 1 is set to the least significant bit position, and 0 is set to other bit positions is an example of a bit string that indicates the position of the least significant bit not matching the sign bit, with a true value (1).

Figure 17:
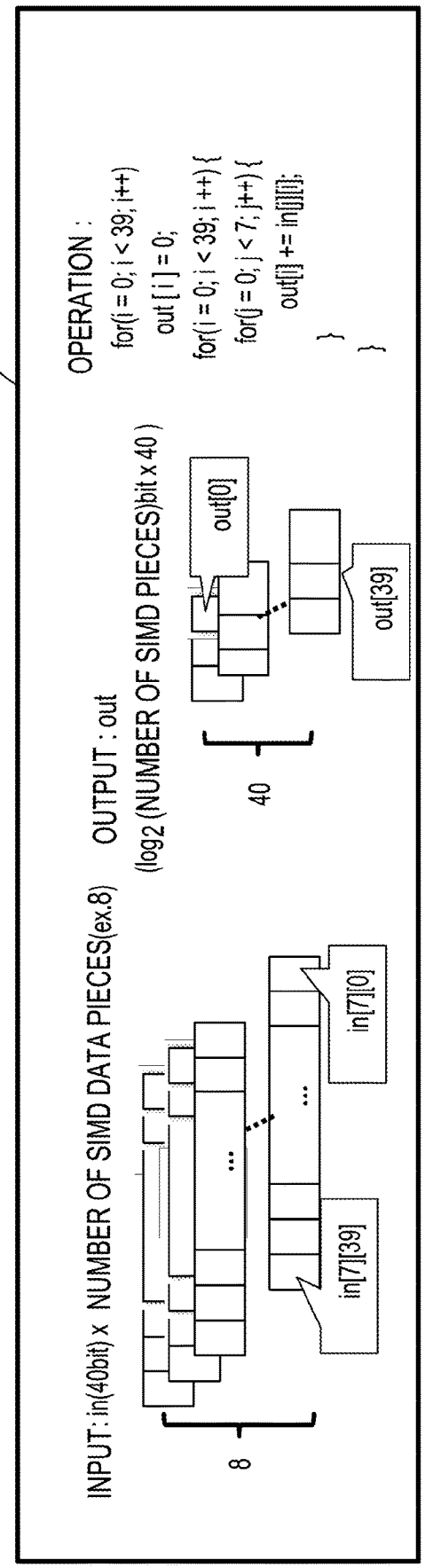
FIG. 17 is a view exemplifying a processing of a statistical information aggregating circuit.

FIG. 17 is a view exemplifying a processing of the statistical information aggregating circuit 104A that acquires a distribution of bits from data acquired by the statistical information acquisition circuit 102. In the drawing, a processing of acquiring a distribution of bits from SIMD data in which eight pieces of 40-bit data are processed in parallel is exemplified. In FIG. 17, a processing of the statistical information aggregating circuit 104A which is a hardware circuit is described in pseudo code.

That is, input data is exemplified as array data of 8 (rows)*40 (bits). The input data of 40 bits in each row is data of a most significant bit position (output of the statistical information acquisition circuit 102A in FIG. 14) or a least significant bit position (output of the statistical information acquisition circuit 102B in FIG. 16). In this processing, with respect to 40-bit output data out, first, all the bits are cleared. Then, values of elements of each column i in the array in[j][i] of the input data are added with respect to all the rows (j=0 to 7). Therefore, unlike FIGS. 13 and 15, in the pseudo code of FIG. 17, the output data (an array element) out[j] is an integer of $\log_2$ (the number of SIMD data pieces) bits (3 bits in the example of FIG. 17). In FIG. 17, it is assumed that the number of SIMD data pieces (the number of data pieces processed in parallel) is 8, but the number of SIMD data pieces is not limited to 8.

Figure 18:
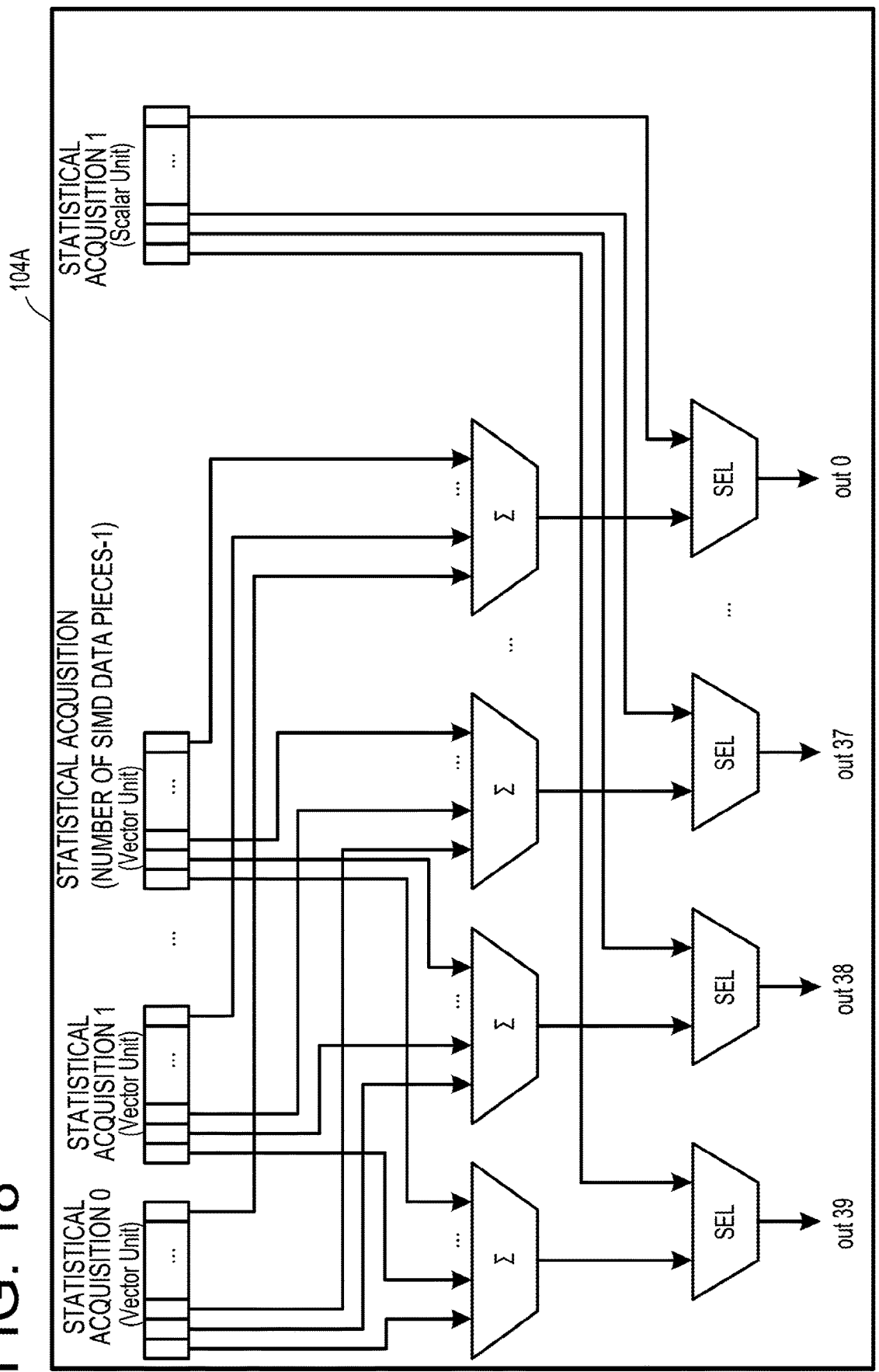
FIG. 18 is a view exemplifying a configuration of a hardware circuit of the statistical information aggregating circuit.

FIG. 18 exemplifies a configuration of a hardware circuit of the statistical information aggregating circuit 104A that acquires a distribution of bits from data acquired by the statistical information acquisition circuit 102. By a bit population count operation on data acquired by the statistical information acquisition circuit 102 (here, statistical acquisition (the number of SIMD data pieces-1), from statistical acquisition 0), the number of 1s is counted at ith bits (i=0 to 39) in eight pieces of statistical information. The input data is a most significant bit position acquired by the statistical information acquisition circuit 102A (FIGS. 13 and 14). Accordingly, the statistical information aggregating circuit 104A counts the number of occurrences of '1' at each bit with respect to as many most significant bit positions as the number of SIMD data pieces, which are acquired by the statistical information acquisition circuit 102A, so as to count the number of occurrences of the most significant bit position. The statistical information aggregating circuit 104A stores the count result in each of output data out0 to out39.

The input data may be set as a least significant bit position by the statistical information acquisition circuit 102B (FIGS. 15 and 16). The statistical information aggregating circuit 104A counts the number of occurrences of '1' at each bit with respect to as many least significant bit positions as the number of SIMD data pieces, which are acquired by the statistical information acquisition circuit 102B, so as to count the number of occurrences of the least significant bit position. The statistical information aggregating circuit 104A stores the count result in each of output data out0 to out39. That is, the statistical information aggregating circuit 104A may process either the most significant bit positions or the least significant bit positions.

In FIG. 18, a selection circuit SEL selects data acquired from a bit population count arithmetic circuit ($\Sigma$) and the scalar unit 14. The data selected by the selection circuit SEL is output to output data out0 to out39. Therefore, data acquired by the statistical information acquisition circuit 102 through the scalar unit 14 is output, as it is, to output data from out0 to out39 without being added in the first time operation of the scalar unit 14. The output data out0 to out39 are data to be delivered to the statistical information storage circuit 105. The statistical information aggregating circuit 104A in FIGS. 17 and 18 is an example of a circuit that accumulates and counts the position of the most significant bit not matching the sign bit with respect to a plurality of fixed point number data pieces. The statistical information aggregating circuit 104A in FIGS. 17 and 18 is also an example of a circuit that accumulates and counts the position of the least significant bit not matching the sign bit with respect to a plurality of fixed point number data pieces.

Figure 19:
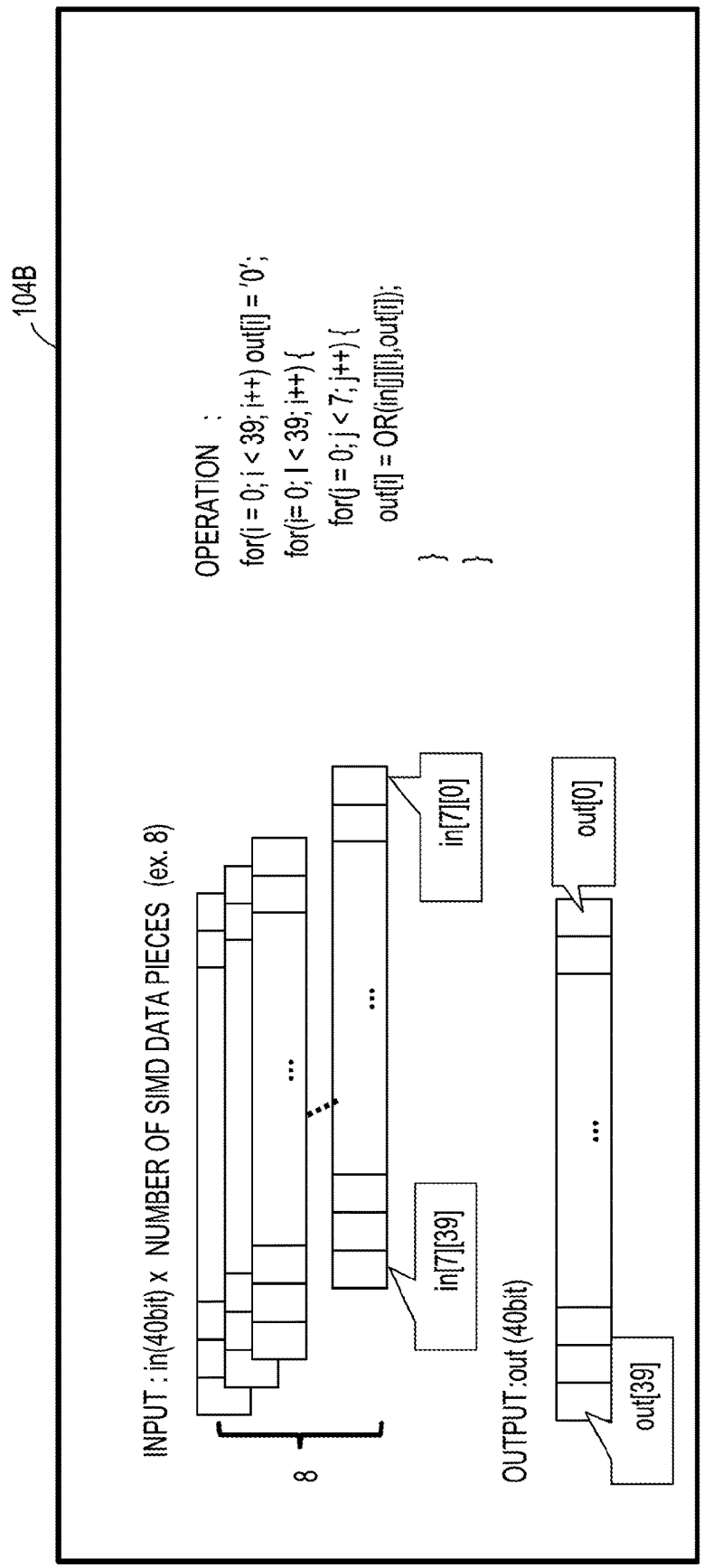
FIG. 19 is a view exemplifying a processing of a statistical information aggregating circuit.

FIG. 19 is a view exemplifying a processing of the statistical information aggregating circuit 104B that aggregates bit positions by an OR operation, as a precondition for acquiring a maximum value and a minimum value of bit positions from data acquired by the statistical information acquisition circuit 102. Also, in FIG. 19, as in FIG. 17, a processing of acquiring a distribution of bits from SIMD data in which eight pieces of 40-bit data are processed in parallel is exemplified. In FIG. 19, a processing of the statistical information aggregating circuit 104B which is a hardware circuit is described in pseudo code.

In this processing, a result obtained through OR operations of each column in the array in[j][i] of input data, with respect to all rows (j=0, . . . , 7), is input to 40-bit output data out[i] (i=0, . . . , 39). Accordingly, in the pseudo code of FIG. 19, unlike FIG. 17, the output data (an array element) out[i] (i=0, . . . , 39) is a bit string. As a result of the above processing, in the output data out[i] (i=0, . . . , 39), a position of a bit that firstly becomes 1 in a direction from out[38] toward the lower order bit is the maximum bit position. A position of a bit that firstly becomes 1 in a direction from out[0] toward the higher order bit is the minimum bit position.

Figure 20:
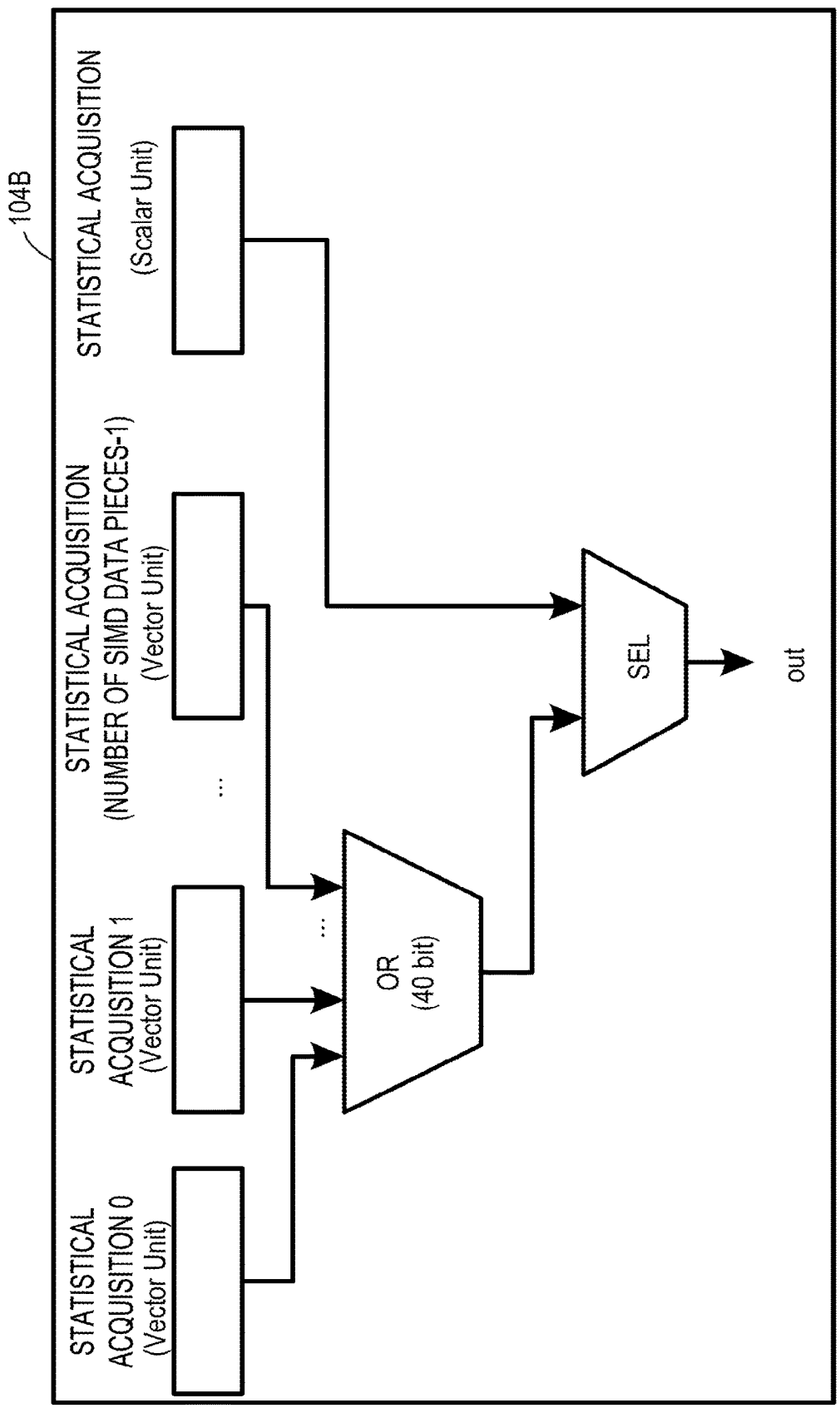
FIG. 20 is a view exemplifying a configuration of a hardware circuit of the statistical information aggregating circuit.

FIG. 20 exemplifies a configuration of a hardware circuit of the statistical information aggregating circuit 104B that aggregates bit positions by an OR operation as a precondition for acquiring a maximum value and a minimum value of bit positions from data acquired by the statistical information acquisition circuit 102. The data acquired by the statistical information acquisition circuit 102 (here, from statistical acquisition, 0, to statistical acquisition, the number of SIMD data pieces−1) is ORed by an OR gate (40 bits). In FIG. 20, the selection circuit SEL selects data acquired from an OR operation (OR) and the scalar unit 14. The data selected by the selection circuit SEL is output to output data out. Therefore, data acquired by the statistical information acquisition circuit 102 through the scalar unit 14 is output, as it is, to output data out without being ORed in the first time operation. The output data out is data to be delivered to the statistical information storage circuit 105.

The statistical information aggregating circuit 104B that aggregates bit positions by an OR operation is an example of a circuit that accumulates a bit string indicating the position of the most significant bit not matching a sign bit, with a true value, by an OR operation with respect to a plurality of fixed point number data pieces. The statistical information aggregating circuit 104B that aggregates bit positions by an OR operation is also an example of a circuit that accumulates a bit string indicating the position of the least significant bit that does not match the sign bit, with a true value, by an OR operation with respect to a plurality of fixed point number data pieces.

Figure 21:
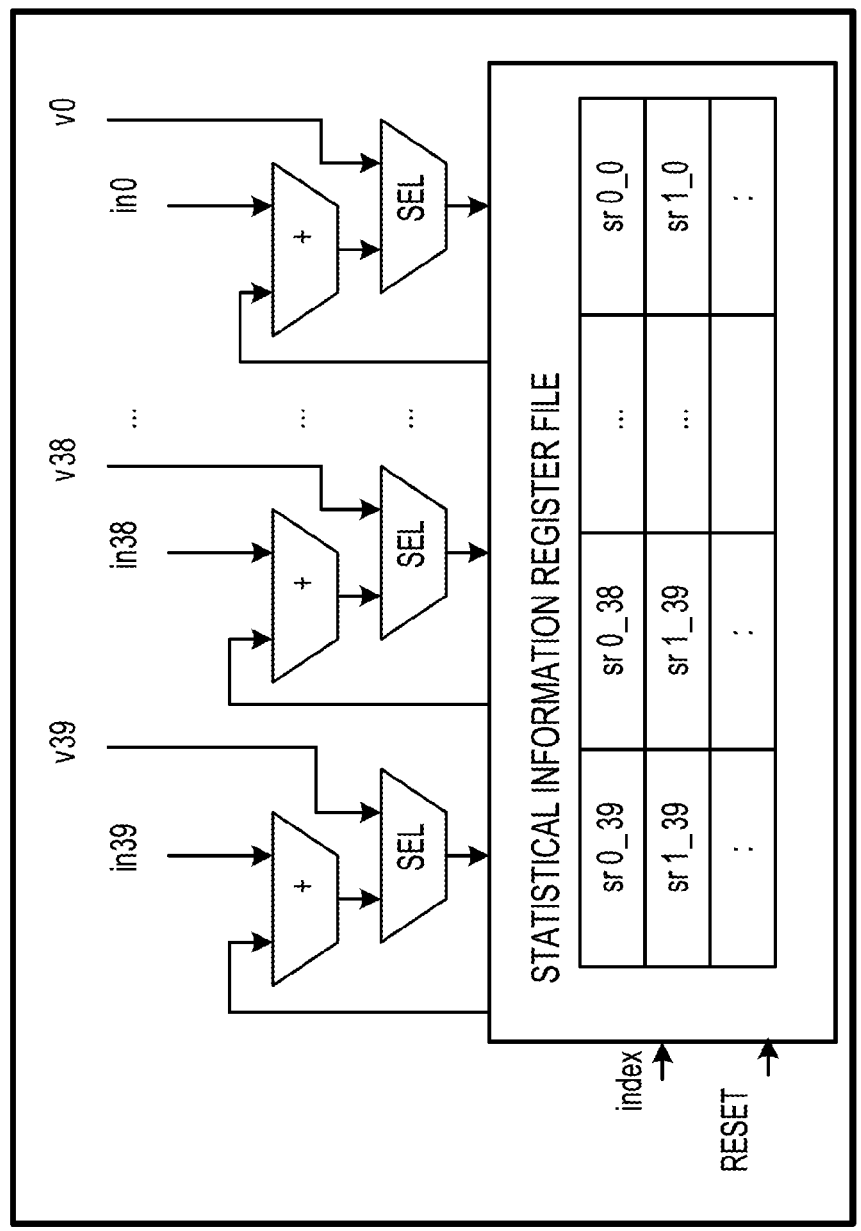
FIG. 21 is an example of a specific configuration of the statistical information aggregating circuit.

FIG. 21 is an example of a specific configuration of the statistical information aggregating circuit 104, and is an example of a configuration of a circuit in which a storage destination of statistical information is specified by an index from the decoder 112. In the drawing, for example, a region of sr[j][i] (j=0, . . . , k, i=0, . . . , 39) is secured, and a row j of a register file is specified by an index.

The processor 10 writes initial values to one or more registers in the row j of the register file specified by the index, via the selection circuit SEL by a write command. Meanwhile, the processor 10 may reset the row j of the register file specified by the index, by a control signal from the decoder 112. Then, the processor 10 accumulates statistical information of in39 to in0 by using an adding circuit, and stores the statistical information in the row j of the register file specified by the index. The processor 10 reads the statistical information from the row j of the register file specified by the index, by a control signal from the decoder 112. The processor 10 reads any one or more values from the row j of the register file specified by the index, and saves the read value in a data memory specified by a read command, or stores the read value in a general-purpose register specified by a read command.

Figure 22:
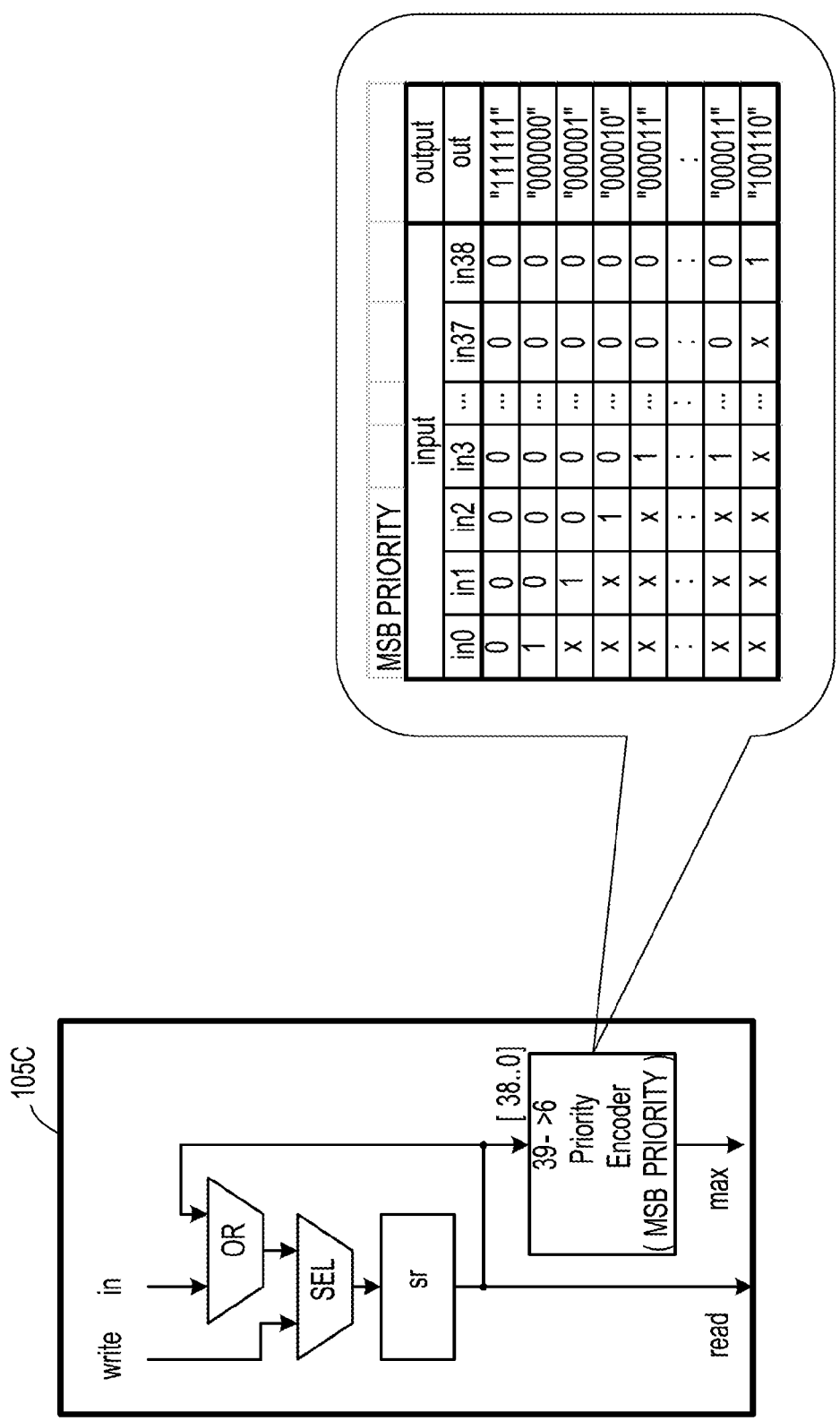
FIG. 22 is a view exemplifying a configuration of a hardware circuit of a statistical information storage circuit.

FIG. 22 is a view exemplifying a configuration of a hardware circuit of a statistical information storage circuit 105C that accumulates statistical information of bit positions ORed by the statistical information aggregating circuit 104B exemplified in FIGS. 19 and 20, and reads the maximum value of the bit positions in the accumulated statistical information. The statistical information storage circuit 105C includes a register (sr) that accumulates the statistical information of the bit positions ORed by the statistical information aggregating circuit 104B. The processor 10 is capable of writing an initial value to the register (sr) via the selection circuit SEL by a write command (write). Meanwhile, the processor 10 may reset the register (sr) by a reset signal.

The statistical information storage circuit 105C executes an OR operation of an OR operation result (in) of the statistical information aggregating circuit 104B, and statistical information already accumulated in the register (sr), and accumulates the result of the OR operation in the register (sr) via the selection circuit SEL.

The processor 10 reads a value of the register (sr) by a read command, and saves the read value in a data memory specified by the read command or a general-purpose register specified by the read command. The statistical information storage circuit 105C may include a priority encoder (MSB priority). The priority encoder (MSB priority) outputs the position (−1 to 38) of the most significant bit 1 in a bit string accumulated in the register (sr), as a binary number. For example, when all the bits 0 are input as input data in, the priority encoder (MSB priority) outputs "111111" (−1). When data, in which in0=1, and all other bits are 0, is input as input data in, the priority encoder (MSB priority) outputs "000000" (0). When data, in which in0=x (0 or 1), in1=1, and all other bits are 0, is input as input data in, the priority encoder (MSB priority) outputs "000001" (1). Likewise, when data, in which in0 to in37 are x (0 or 1), and in38=1, is input as input data in, the priority encoder (MSB priority) outputs "100110" (38). The processor 10 may acquire the maximum value of the bit positions as a binary value through the priority encoder (MSB priority), from the statistical information of the bit positions ORed by the statistical information aggregating circuit 104B. A combination of the statistical information aggregating circuit 104B (FIGS. 19 and 20) that aggregates bit positions by an OR operation as in FIGS. 19 and 20, and the statistical information storage circuit 105C is an example of a circuit that accumulates a bit string which indicates the position of the most significant bit not matching a sign bit with a true value by an OR operation with respect to a plurality of fixed point number data pieces, and acquires the position of the most significant true value in the accumulated bit string.

Figure 23:
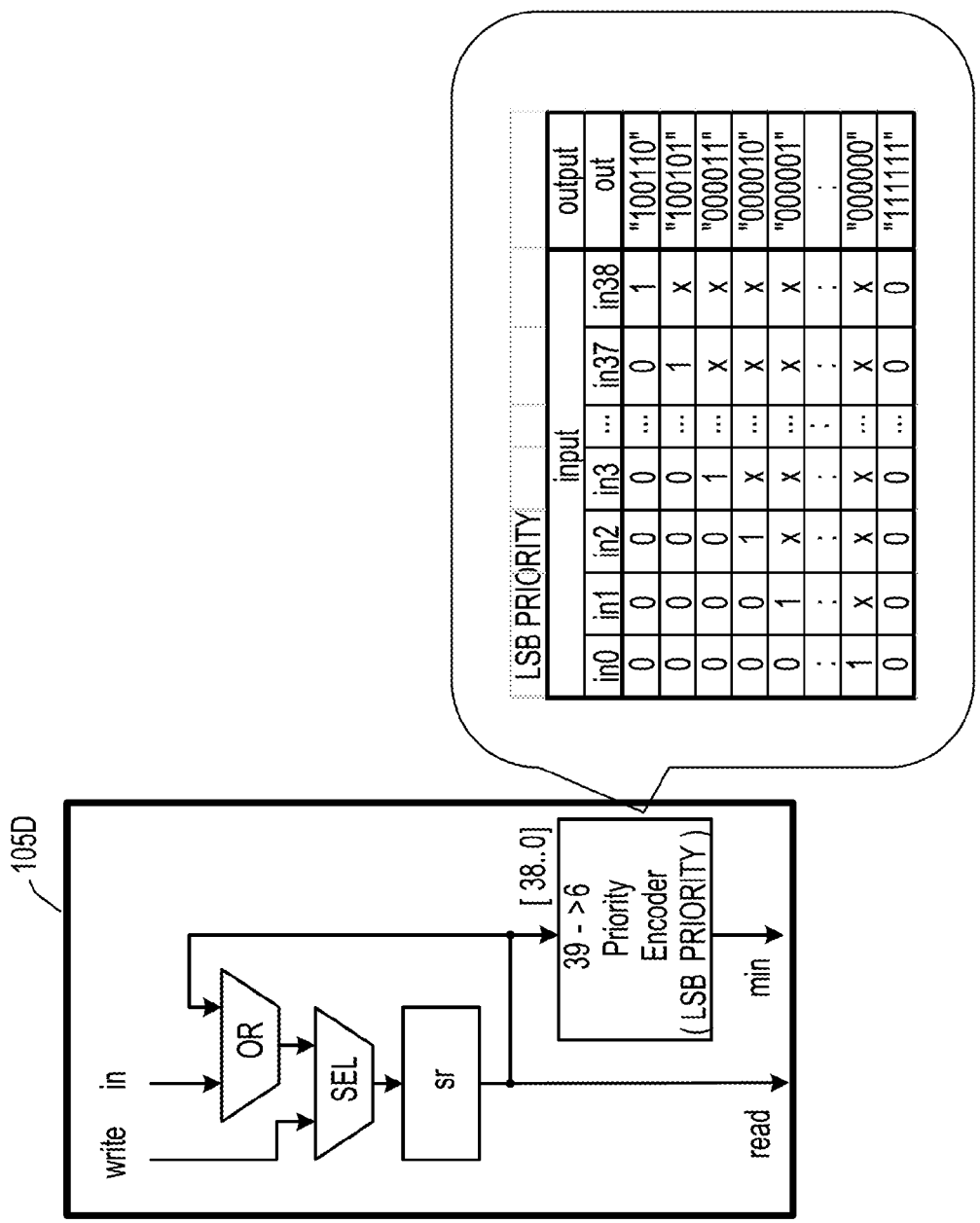
FIG. 23 is a view exemplifying a configuration of a hardware circuit of a statistical information storage circuit.

FIG. 23 is a view exemplifying a configuration of a hardware circuit of a statistical information storage circuit 105D that accumulates statistical information of bit positions ORed by the statistical information aggregating circuit 104B exemplified in FIGS. 19 and 20 and reads the minimum value of the bit positions in the accumulated statistical information. The statistical information storage circuit 105D includes a priority encoder (LSB priority) instead of the priority encoder (MSB priority) of the statistical information storage circuit 105C. The configuration of the statistical information storage circuit 105D except for the priority encoder (LSB priority) is the same as that of the statistical information storage circuit 105C, and thus explanations thereof will be omitted.

The priority encoder (LSB priority) outputs the position (−1 to 38) of the least significant bit 1 in a bit string accumulated in the register (sr), as a binary number. For example, when all the bits 0 are input as input data in, the priority encoder (LSB priority) outputs "111111" (−1). When data, in which in0=1, and other bits are x (0 or 1), is input as input data in, the priority encoder (LSB priority) outputs "000000" (0). When data, in which in0=0, in1=1, and other bits (in2 to in38) are x (0 or 1), is input as input data in, the priority encoder (LSB priority) outputs "000001" (1). Likewise, when data, in which in0 to in37 are 0, and in38=1, is input as input data in, the priority encoder (LSB priority) outputs "100110" (38). The processor 10 may acquire the minimum value of the bit positions as a binary value through the priority encoder (LSB priority), from the statistical information of the bit positions ORed by the statistical information aggregating circuit 104B. A combination of the statistical information aggregating circuit 104B (FIGS. 19 and 20) that aggregates bit positions by an OR operation, and the statistical information storage circuit 105D (FIG. 23) is an example of a circuit that accumulates a bit string which indicates the position of the least significant bit not matching a sign bit, with a true value, by an OR operation with respect to a plurality of fixed point number data pieces, and acquires the position of the least significant true value in the accumulated bit string.

Figure 24:
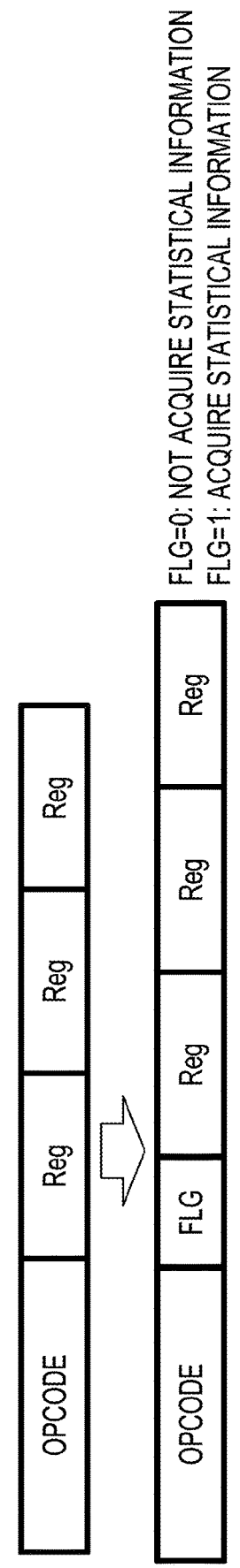
FIG. 24 is a view exemplifying an instruction format.

FIG. 24 exemplifies an instruction format of an instruction indicating acquisition of statistical information in the first embodiment. As in FIG. 24, an existing instruction format may be extended so that a bit of designating whether to acquire statistical information may be added. According to the example of FIG. 24, for example, a statistical information acquisition function may be added for all instructions. As in the drawing, FLG=1 designates acquisition of statistical information. Meanwhile, FLG=0 does not designate acquisition of statistical information but indicates the same instruction as before.

Figure 25:
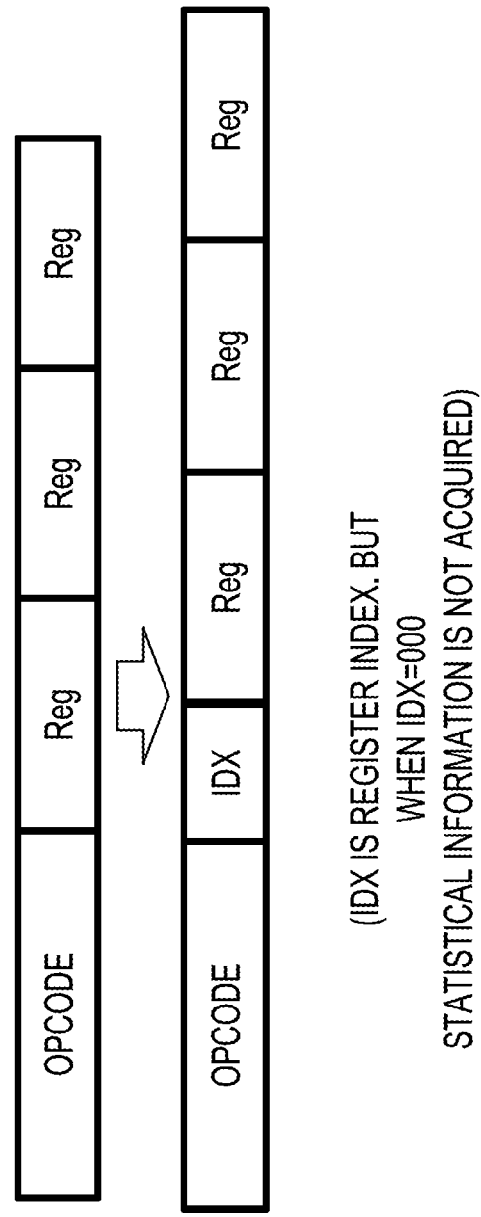
FIG. 25 is a view exemplifying an instruction format.

FIG. 25 exemplifies a modification of an instruction format. As in FIG. 25, an instruction format may be extended so that a register index storing statistical information may be specified. In the drawing, IDX indicates a register index (e.g., an index in FIG. 21). Meanwhile, when the IDX has a value other than values that may be specified by the register index, the processor 10 does not acquire statistical information. The decoder 112 in FIG. 9 that decodes the instruction format in FIG. 25 and acquires the register index IDX is an example of a decoder that acquires designation of a storage destination of statistical information.

An instruction with a statistical information acquisition function may be executed by a dedicated subroutine so that the information processing apparatus 1 may execute the instruction with a statistical information acquisition function as described above. When compiling the dedicated subroutine, a compiler may embed the instruction with a statistical information acquisition function in an execution form. The dedicated subroutine may be generated in assembly language, so that execution of the instruction with a statistical information acquisition function may be designated. In a computer program causing the information processing apparatus 1 to execute deep learning, the above described dedicated subroutine may be called.

<Execution Procedure>

Figure 26:
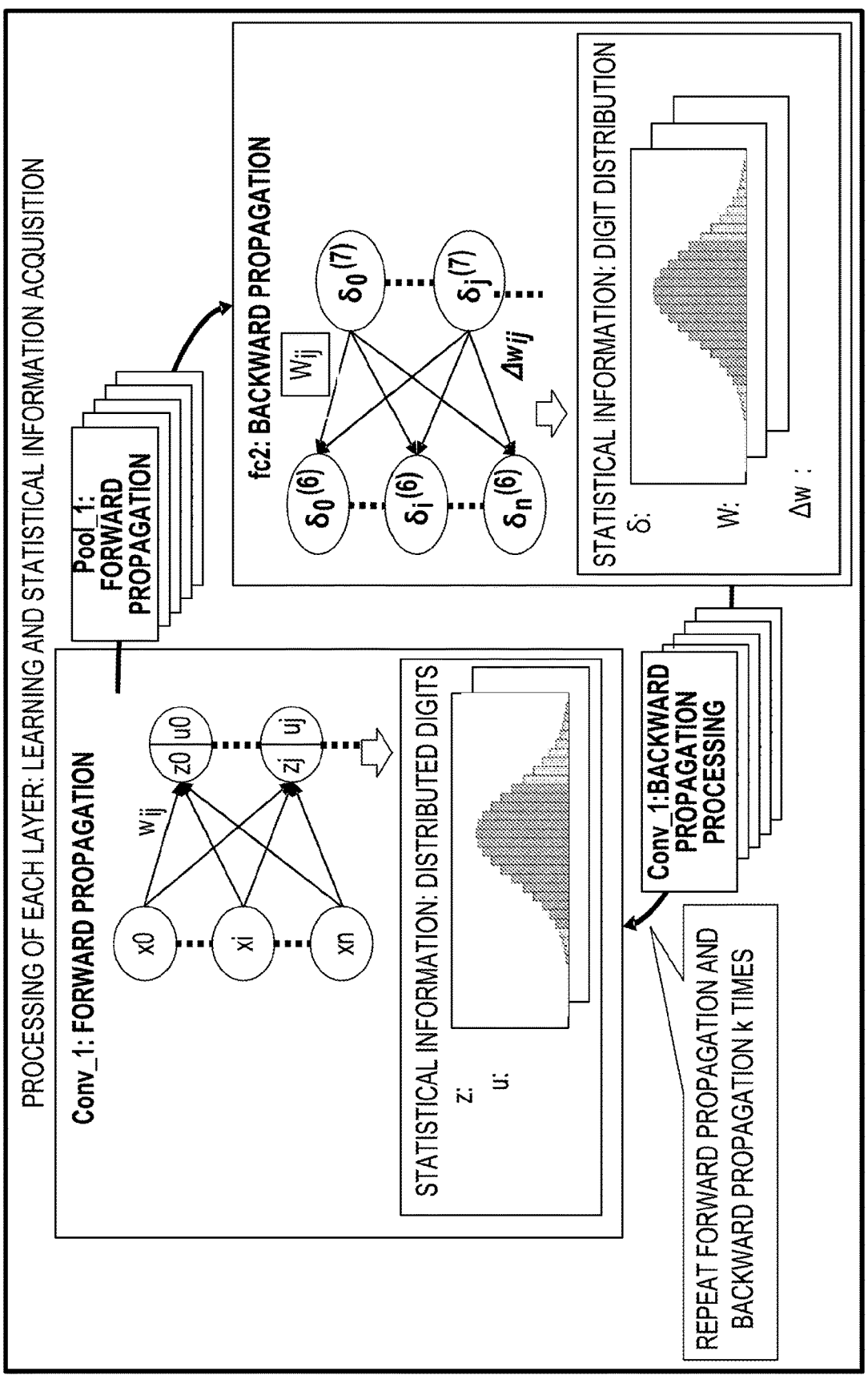
FIG. 26 a view exemplifying details of a processing in each layer when an information processing apparatus executes deep learning.

FIG. 26 exemplifies details of a processing in each layer when the information processing apparatus 1 according to the present embodiment executes deep learning. The information processing apparatus 1 that executes the processing in FIG. 26 is an example of an information processing apparatus that executes deep learning by operations in one or more layers. In the drawing, a convolution layer Conv_1 and a pooling layer Pool_1 and a fully connected layer 2 (fc2) are exemplified. In this example as well, similarly to FIG. 6 in Comparative Example, in the convolution layer Conv_1, a convolution operation is executed between input data ini=(x0, . . . , xn) and a weight (Wij), and, for example, z0, . . . , zj, . . . are calculated. With respect to, for example, z0, . . . , zj, . . . , an activation function is operated, and, for example, u0, . . . , uj, . . . are calculated. The information processing apparatus 1 accumulates statistical information in, for example, the variables z0, . . . , zj, . . . in the convolution layer Conv_1 in the first layer, in an internal statistical information register or a statistical information register file specified by a register index. When the statistical information register or the register file is insufficient, the statistical information is saved in a memory after an operation in each layer is completed, and the statistical information is restored before the next operation starts. Likewise, the information processing apparatus 1 accumulates statistical information in, for example, the variables u0, . . . , uj, . . . in the convolution layer Conv_1 in the first layer, in an internal register or a statistical information register file specified by a register index. The statistical information in Comparative Example is the number of times of overflow, whereas the statistical information in the present embodiment is (1) a distribution of most significant bit positions, (2) a distribution of least significant bit positions, (3) a maximum value of most significant bit positions, (4) a minimum value of least significant bit positions, or a combination of any two or more of these as described above.

The operation result in the convolution layer Conv_1 in the first layer is propagated from the pooling layer Pool_1 in the first layer, to a further upper layer. Here, the information processing apparatus 1 executes operation and accumulation of statistical information in the same manner in the second or higher layers as well. Then, the information processing apparatus 1 calculates error gradient variables $\delta 0^{(7)}, \ldots, \delta j^{(7)}, \ldots$ from a difference value between the obtained operation result, and correct answer data Ti. Then, the information processing apparatus 1 executes a propagation processing in the backward direction based on the error gradient variables $\delta 0^{(7)}, \ldots,$ or, . . . . That is, the information processing apparatus 1 calculates error variables $\delta 0^{(6)}, \ldots, \delta j^{(6)}, \ldots \delta n^{(6)}$ at the output of a lower order hierarchy (e.g., the fully connected layer 1(fc1)) and a weight gradient value $\Delta Wij$ of the weight variable Wij with respect to the following weight. Here, the information processing apparatus 1 accumulates statistical information in the error gradient variables $\delta 0^{(7)}, \ldots, \delta j^{(7)}, \ldots$ and the error variables $\delta 0^{(6)}, \ldots, \delta j^{(6)}, \ldots, \delta n^{(6)}$ in the same manner as in the convolution layer Conv_1 in the first layer. The information processing apparatus 1 also accumulates statistical information in the weight gradient $\Delta Wij$. The information processing apparatus 1 accumulates statistical information in the weight variable Wij.

Then, the information processing apparatus 1 calculates the weight gradient while propagating an error gradient from the fully connected layer 1 (fc1) to the convolution layer Conv_1 in the first layer, by the inverse direction. The information processing apparatus 1 repeats a forward propagation and a backward propagation as described above k times by using k sets of input data. After completion of these k mini batches, the information processing apparatus 1 updates a decimal point position of fixed point number of each variable based on the statistical information of each variable.

Figure 27:
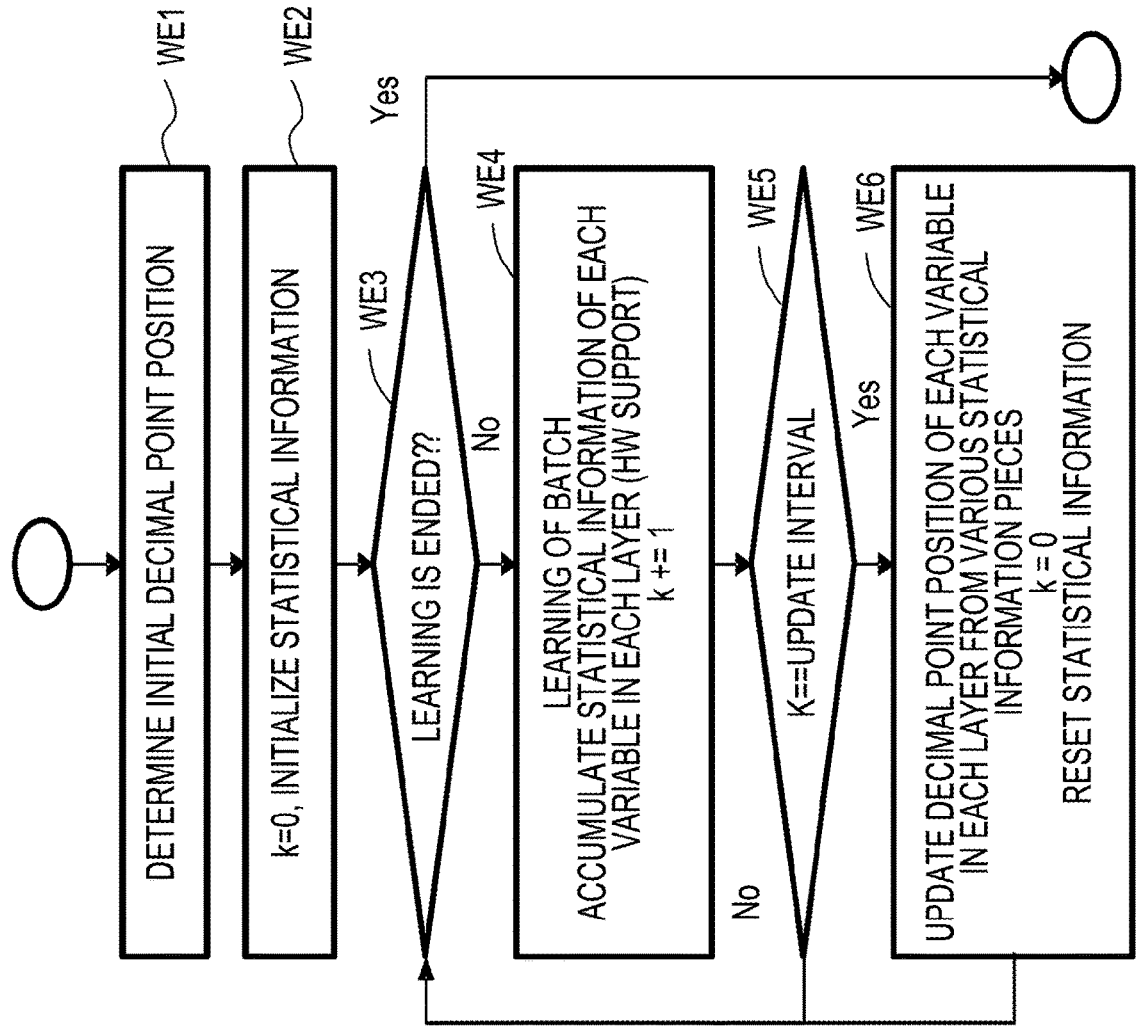
FIG. 27 is a view exemplifying a flowchart of a learning processing by the information processing apparatus.

FIG. 27 exemplifies a flow chart of a learning processing by the information processing apparatus 1 according to the present embodiment. In this processing, the information processing apparatus 1 determines an initial decimal point position (WE1). The information processing apparatus 1 may determine the initial decimal point position of each variable by a past experiment value, an actual value, or user designation.

Then, the information processing apparatus 1 initializes the number of times k to 0. The information processing apparatus 1 initializes a variable storing statistical information within a program (WE2). Then, the information processing apparatus 1 determines whether learning completion conditions are satisfied (WE3). The learning is completed in a case where an error is equal to or less than a reference value or the number of times of learning has reached a prescribed maximum value.

When the learning completion conditions are not satisfied, the information processing apparatus 1 executes the following mini batch. Here, the information processing apparatus 1 accumulates statistical information of each variable of each layer, in a statistical information register or a statistical information register file. Accumulation of the statistical information is executed by hardware of the processor 10, as described above. Then, the information processing apparatus 1 counts up the variable k (WE4).

Then, the information processing apparatus 1 determines whether the number of times k has reached an update interval (WE5). When it is determined that the number of times k has not reached the update interval, the information processing apparatus 1 returns to the processing in WE3. Meanwhile, when it is determined that the number of times k has reached the update interval, the information processing apparatus 1 reads statistical information from a statistical information register or a statistical information register file in which various statistical information pieces are accumulated, or a memory region in which statistical information is saved. Then, the information processing apparatus 1 updates a decimal point position of each variable in each layer based on the read statistical information (WE6).

Here, the information processing apparatus 1 may determine the decimal point position so that, for example, a ratio of data to be saturated and a ratio of data to underflow with respect to the total number of data pieces satisfy target conditions. When it is difficult for both the ratio of data to be saturated with respect to the entire data and the ratio of data to underflow with respect to the entire data to satisfy target conditions, the information processing apparatus 1 may prioritize one of the two ratios. The information processing apparatus 1 may set the decimal point position by positioning the average of an upper limit bit position where saturation not occurs, and a lower limit bit position where valid data is present, at the center of a range expressible by a fixed point number. The information processing apparatus 1 initializes the number of times k to 0, so as to reset again the register storing the statistical information. Then, the information processing apparatus 1 returns to the processing in WE3.

Accumulating the statistical information of each variable in each layer in WE4, and reading the statistical information from the register or the register file in which various statistical information pieces are accumulated in WE6 correspond to an example of acquiring statistical information on a bit distribution in fixed point number data at the time of execution of instructions including an instruction of the operation as described above, in at least one layer of one or more layers. In WE6, updating the decimal point position of each variable in each layer based on the read statistical information is an example of updating a decimal point position of fixed point number data based on statistical information on a bit distribution.

<Effect of First Embodiment>

The information processing apparatus 1 accumulates statistical information of each variable of each layer, in a register or a register file, at the time of mini batch execution of deep learning. Then, the information processing apparatus 1 may update a decimal point position of each variable of each layer based on the accumulated statistical information. That is, the processor 10 acquires statistical information of a bit distribution. Here, the statistical information includes, at the time of command execution, (1) a distribution of most significant bit positions, (2) a distribution of least significant bit positions, (3) a maximum value of most significant bit positions, (4) a minimum value of least significant bit positions, or a combination thereof. Accordingly, when the information processing apparatus 1 executes deep learning, it is possible to implement a dynamic fixed point operation in a practical time without overhead during the deep learning program for acquiring statistical information of data.

That is, in the present embodiment, the processor 10 of the information processing apparatus 1 executes an instruction with a statistical information acquisition function, and executes an instruction to perform bit-shifting and rounding/saturation on an operation result and to store the result in a register. Accordingly, the information processing apparatus 1 may reduce overhead for acquiring statistical information indicating a bit distribution. Further, it is possible to immediately determine a proper bit shift, that is, a decimal point position, from the statistical information indicating a bit distribution. That is, as in the information processing apparatus 1, without a procedure of performing a trial of a proper decimal point position by adjusting a decimal point position bit by bit, and confirming the result in the next operation, it is possible to immediately determine the decimal point position from the statistical information indicating a bit distribution. Therefore, the information processing apparatus 1 is less likely to repeat a learning processing in a state where a decimal point position is improper, unlike in Comparative Example. In the information processing apparatus 1, there is little possibility that the accuracy of a learning result is deteriorated and thus convergence of deep learning is delayed.

The processor 10 may acquire a position of the most significant bit not matching a sign bit in fixed point number data after execution of an instruction, by the statistical information acquisition circuit 102A. The processor 10 may accumulate and count the position of the most significant bit not matching a sign bit with respect to a plurality of fixed point number data pieces, by the statistical information aggregating circuit 104A. The processor 10 accumulates a bit string indicating the position of the most significant bit not matching a sign bit, with a true value, by an OR operation with respect to a plurality of fixed point number data pieces. Then, the processor 10 may acquire the position of the most significant true value in the accumulated bit string.

The processor 10 may acquire a position of the least significant bit not matching a sign bit in fixed point number data after execution of an instruction, by the statistical information acquisition circuit 102B. The processor 10 may accumulate and count the position of the least significant bit not matching a sign bit with respect to a plurality of fixed point number data pieces, by the statistical information aggregating circuit 104A. The processor 10 accumulates a bit string indicating the position of the least significant bit not matching a sign bit, with a true value, by an OR operation with respect to a plurality of fixed point number data pieces. Then, the processor 10 may acquire the position of the least significant true value in the accumulated bit string. Through the above-described configuration, the processor 10 may acquire the statistical information.

Second Embodiment

Hereinafter, with reference to FIGS. 28 to 54, descriptions will be made on an information processing apparatus 1A according to a second embodiment. In the above first embodiment, descriptions have been made on the processor 10 that acquires statistical information by the statistical information acquisition circuit 102 (102A, 102B), and adjusts a decimal point position of fixed point number data such that, for example, the number of times of overflow falls within a predetermined limit so as to efficiently execute deep learning with the fixed point number data.

However, in the configuration of the first embodiment, the following problems are assumed. As a first problem, for example, learning may not be stabilized depending on the configuration of a network in which the learning is performed. The reason the learning is not stabilized is presumed to be due to existence of a variable for which accuracy may not be secured with a fixed point number depending on the learning. For example, a Qn. m format is described as a bit string of n+m+1 bits (a sign bit (one bit)•an integer part (n bits)•a fraction part (m bits)). The weight of the most significant bit except for the sign bit is $2^{n-1}$, and the weight of the least significant bit is $2^{-m}$. Therefore, an expressible value ranges from $-(2^{n-1})$ to $2^n - 2^{-m}$.

Figure 28:
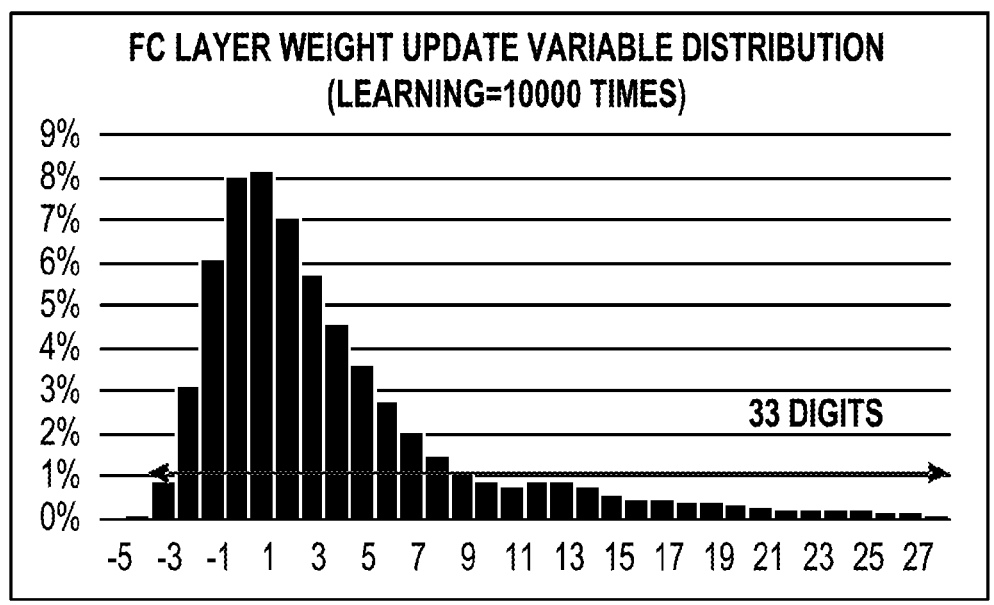
FIG. 28 is a view exemplifying a distribution of digits in binary numbers of numerical values stored in variables used in operations during a processing such as deep learning.
Figure 29:
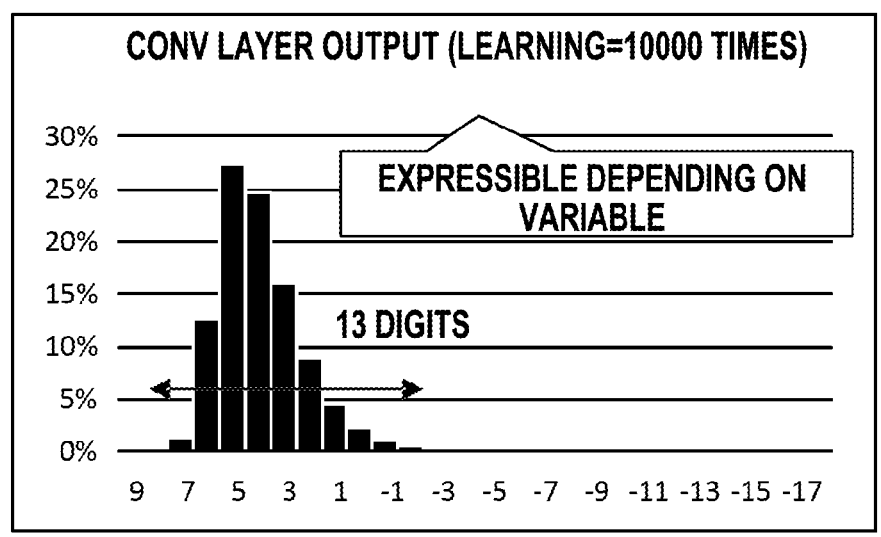
FIG. 29 is a view exemplifying a distribution of digits in binary numbers of numerical values stored in variables used in operations during a processing such as deep learning.
Figure 30:
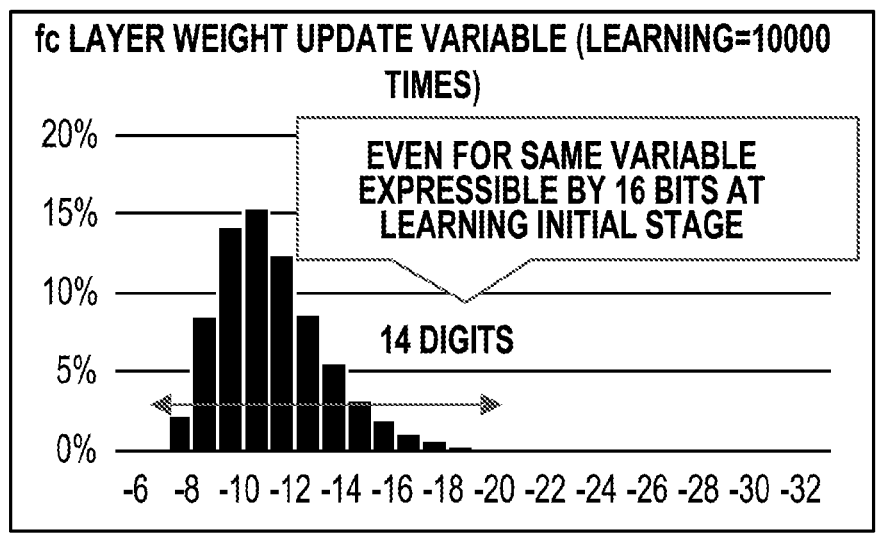
FIG. 30 is a view exemplifying a distribution of digits in binary numbers of numerical values stored in variables used in operations during a processing such as deep learning.

FIGS. 28 to 30 are views exemplifying distributions of digits in binary numbers of numerical values stored in variables used in operations during a processing such as deep learning. FIG. 28 is, for example, a distribution example of digits (the number of bits) of data in variables ΔW for updating a weight in a fully connected layer (fc layer) of deep learning. In this example, the number of times of learning is 10000 times, and digits are distributed as 33 digits.

FIG. 29 is a view exemplifying a distribution of digits (the number of bits) in variables holding data output from a convolution layer (Cony layer). In this example as well, the number of times of learning is 10000 times. Meanwhile, digits are distributed within a range of 13 digits, and expression with a 16-bit fixed point number is possible. When FIG. 29 is compared to FIG. 28, it can be found that a variable expressible even with a fixed point number is present depending on the type of the variable or the type of a processing.

FIG. 30 is also a view exemplifying a distribution of digits (the number of bits) in variables (ΔW) for updating a weight in a fully connected layer (fc layer). In this example, the number of times of learning is 1000, digits are distributed within a range of 13 digits, and expression with a 16-bit fixed point number is possible. When FIG. 30 is compared to FIG. 28, even in a case of the same variable, it can be found that by dividing a stage of learning into, for example, an initial stage of the learning and a stage after the initial stage, there is a variable expressible even with a fixed point number for each separated stage. As described above, it can be found that there are a variable expressible with a fixed point number, and a variable for which sufficient accuracy may not be secured with a fixed point number, depending on the type of a processing, or the stage of the processing.

Figure 31:
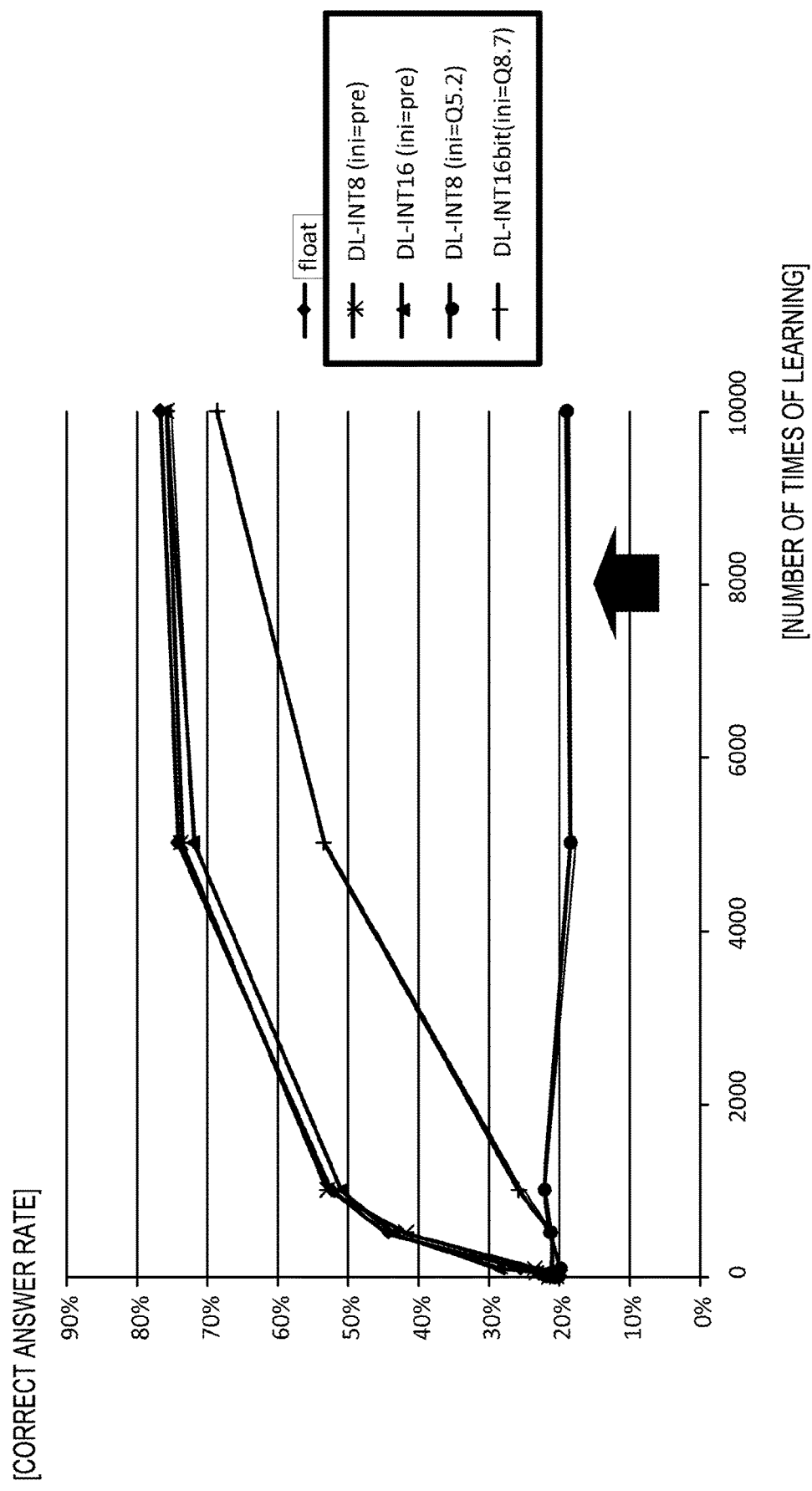
FIG. 31 is a view illustrating a change of a recognition accuracy with respect to the number of times of learning.

As a second problem, for example, it is assumed that learning collapses depending on an initial decimal point position. Therefore, in a learning processing, preliminary learning for determining an initial value may be carried out, thereby causing a labor for the preliminary learning. FIG. 31 is a view illustrating a change of a training accuracy with respect to the number of times of learning. In the drawing, variables in programs executing learning are used as three different types, that is, a floating point number (float), a 8-bit fixed point number (DL-INT8), and 16-bit fixed point number (DL-INT16), and the results of respective programs are illustrated. A case where preliminary learning was executed (ini=pre), a case where preliminary learning was not executed, and a Q5.2 format with an 8-bit fixed point number was employed (ini=Q5.2), and a case where a Q8.7 format with a 16-bit fixed point number was employed (ini=Q8.7) are exemplified. As in the drawing, in the program in which the preliminary learning was not executed, and the Q5.2 format was employed, the result indicates that a correct answer rate was not improved, and the learning collapsed.

Therefore, in the second embodiment below, in addition to the configuration of the processor 10 in the first embodiment, measures for a variable for which sufficient accuracy may not be secured with fixed point number data, and measures for reducing a labor by preliminary learning for determining an initial decimal point position are carried out. More specifically, the processor 10A in the second embodiment performs statistical acquisition at the time of learning with a floating point number (e.g., a 32-bit floating point number (hereinafter, FP32)). Then, the information processing apparatus 1A including the processor 10A switches the floating point number (FP32) to a fixed point number based on the statistical information.

As a result, in relation to the above first problem "existence of a variable for which accuracy may not be secured with a fixed point number," the information processing apparatus 1A secures the accuracy by using a floating point number, thereby stabilizing learning. In relation to the above second problem "a labor by preliminary learning for determining an initial decimal point position," the information processing apparatus 1A uses a floating point number at an initial learning stage, and switches the floating point number to a fixed point number after a predetermined period while eliminating necessity of the preliminary learning. As described above, except for measures for the first and second problems, the constituent elements and operations in the second embodiment are the same as the constituent elements and operations in the first embodiment. Therefore, it is assumed that among the constituent elements in the second embodiment, for the same constituent elements as those in the first embodiment, the constituent elements in the first embodiment are adopted, and the corresponding constituent elements are given the same reference numerals and explanations thereof will be omitted.

<Statistical Information Added in Second Embodiment>

Figure 32:
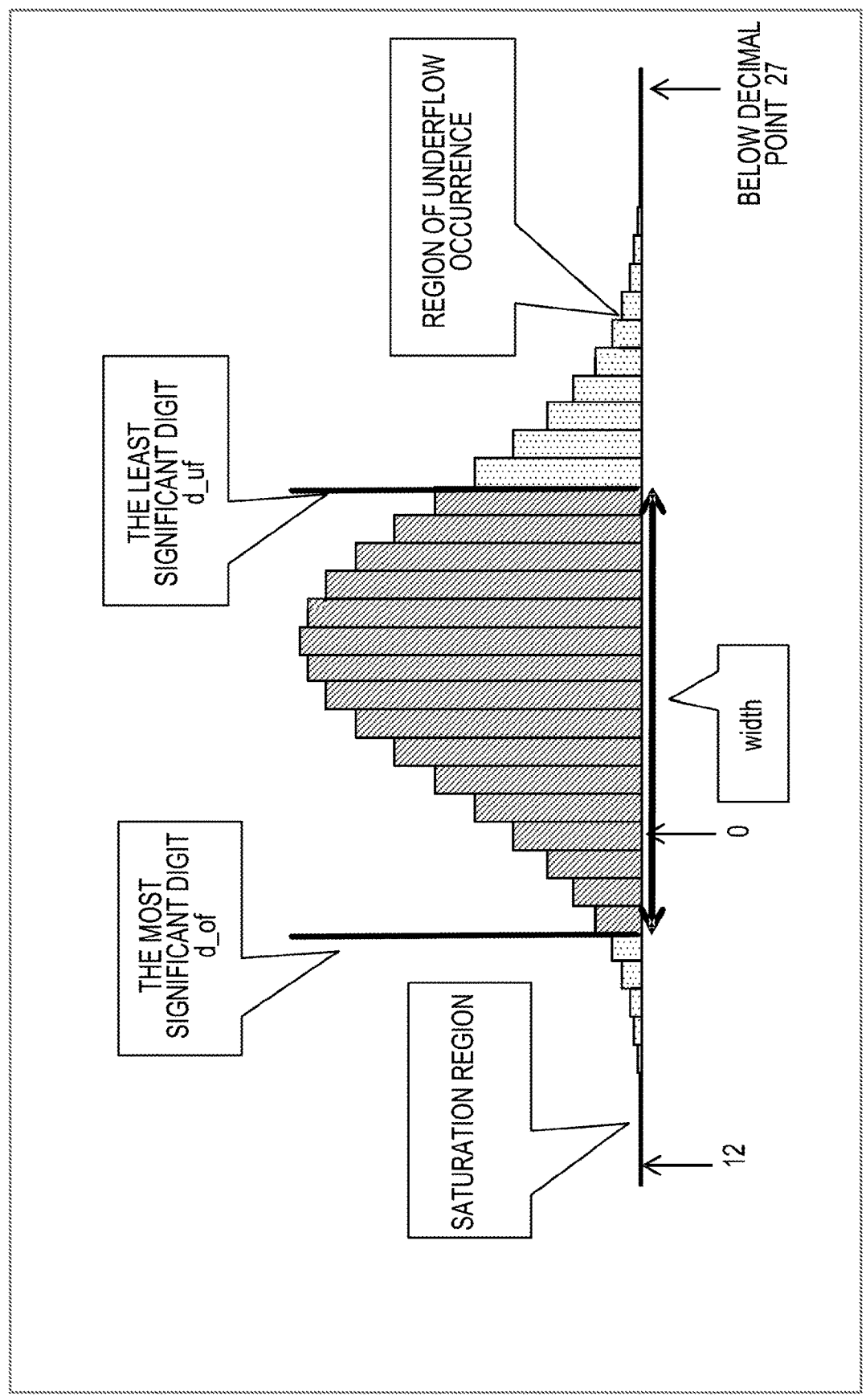
FIG. 32 is a view exemplifying a distribution of variable values of floating point numbers.

FIG. 32 is a view exemplifying a distribution of variable values of floating point numbers. In the drawing, the horizontal axis indicates a range of numerical values, and this case exemplifies, for example, 40 bits, that is, 12 bits to the right of the decimal point, and 27 bits to the left of the decimal point. The vertical axis in the drawing indicates the number of times of occurrences of the most significant digit (the most significant bit) of a floating point number at each numerical value on the horizontal axis. In the following embodiment, as statistical information, a distribution of most significant bits in binary numbers is obtained.

The most significant digit d_of is a position that becomes the most significant digit when a floating point number is converted into a fixed point number. Therefore, when the processor 10A in the second embodiment converts the floating point number into the fixed point number, a numerical value exceeding the most significant digit d_of overflows and is saturated. The most significant digit d_of may be called the most significant digit of the fixed point number.

The least significant digit d_uf is a position that becomes the least significant digit when a floating point number is converted into a fixed point number. Therefore, when the processor 10A in the second embodiment converts the floating point number into the fixed point number, a numerical value less than the least significant digit d_uf underflows and becomes 0 as the fixed point number. The least significant digit d_uf may be called the least significant digit of the fixed point number. Then, the width indicates a bit width for expressing a range of numerical values from the least significant digit d_uf to the most significant digit d_of, with fixed point numbers, and is calculated as width=d_of−d_uf+1.

In the second embodiment, when the bit width exceeds a predetermined reference value, the processor 10A sets a data type of a variable as a floating point number. In this case, the processor 10A may execute operations with a high accuracy even when a dynamic range of variable values is wide, and the values are distributed in a wide range. Meanwhile, when the bit width does not exceed the predetermined reference value, the processor 10A sets a data type of a variable as a fixed point number. In this case, the processor 10A may execute operations with a high accuracy by the fixed point numbers when a dynamic range of variable values is narrow, and the values are distributed within a limited range. Through such a processing, the information processing apparatus 1A including the processor 10A improves the operational accuracy to deal with "existence of a variable for which accuracy may not be secured with a fixed point number" in the above first problem.

When at the initial stage of a training, the processor 10A expresses all parameters and weights in the learning by floating point numbers, it becomes possible to omit "a labor by preliminary learning for determining an initial decimal point position" in the second problem. Then, as the training progresses, the processor 10A determines whether the bit width exceeds a predetermined reference value. Then, when the bit width falls within the predetermined reference value, the processor 10A may convert a floating point number into a fixed point number. Through such a processing, the information processing apparatus 1A including the processor 10A may eliminate a labor by preliminary learning. Besides, when a fixed point number may be used according to acquired statistical information, it is possible to reduce a load of operations and then to suppress an increase in, for example, power consumption caused by floating point number operations.

Here, the most significant digit d_of may be set to have a range in which, for example, an overflow rate (the number of data pieces in a region to be saturated/the total number of data pieces)<a reference value $r_{of}$. That is, the processor 10A may determine the most significant digit d_of such that the overflow rate is less than the reference value $r_{of}$. The condition that the overflow rate is less than the reference value $r_{of}$ is an example in which an overflow rate when floating point number data is processed with fixed point number data satisfies a first condition.

The least significant digit d_uf may be set to have a range in which, for example, an underflow rate (the number of data pieces in a region where underflow occurs/the total number of data pieces)<a reference value $r_{uf}$. That is, the processor 10A may determine the least significant digit d_uf such that the underflow rate is less than the reference value $r_{uf}$. The condition that the underflow rate is less than the reference value $r_{uf}$ is an example in which an underflow rate satisfies a second condition. Therefore, it can be said that the range (width) from the least significant digit d_uf to the most significant digit d_of, which is obtained by determining the most significant digit d_of such that the overflow rate is less than the reference value $r_{of}$, and by determining the least significant digit d_uf such that the underflow rate is less than the reference value $r_{uf}$, is an example of a bit range required when an overflow rate satisfies the first condition and an underflow rate satisfies the second condition.

The reference value $r_{of}$ for the overflow rate and the reference value $r_{uf}$ for the underflow rate may be set as user input values. The user input values are experience values or experimental values. For example, the information processing apparatus 1A may execute learning by varying the reference value $r_{of}$ for the overflow rate and the reference value $r_{uf}$ for the underflow rate a plurality of times before determining a desirable reference value $r_{of}$ for the overflow rate and a desirable reference value $r_{uf}$ for the underflow rate (second modification to be described below).

<Configuration>

Figure 33:
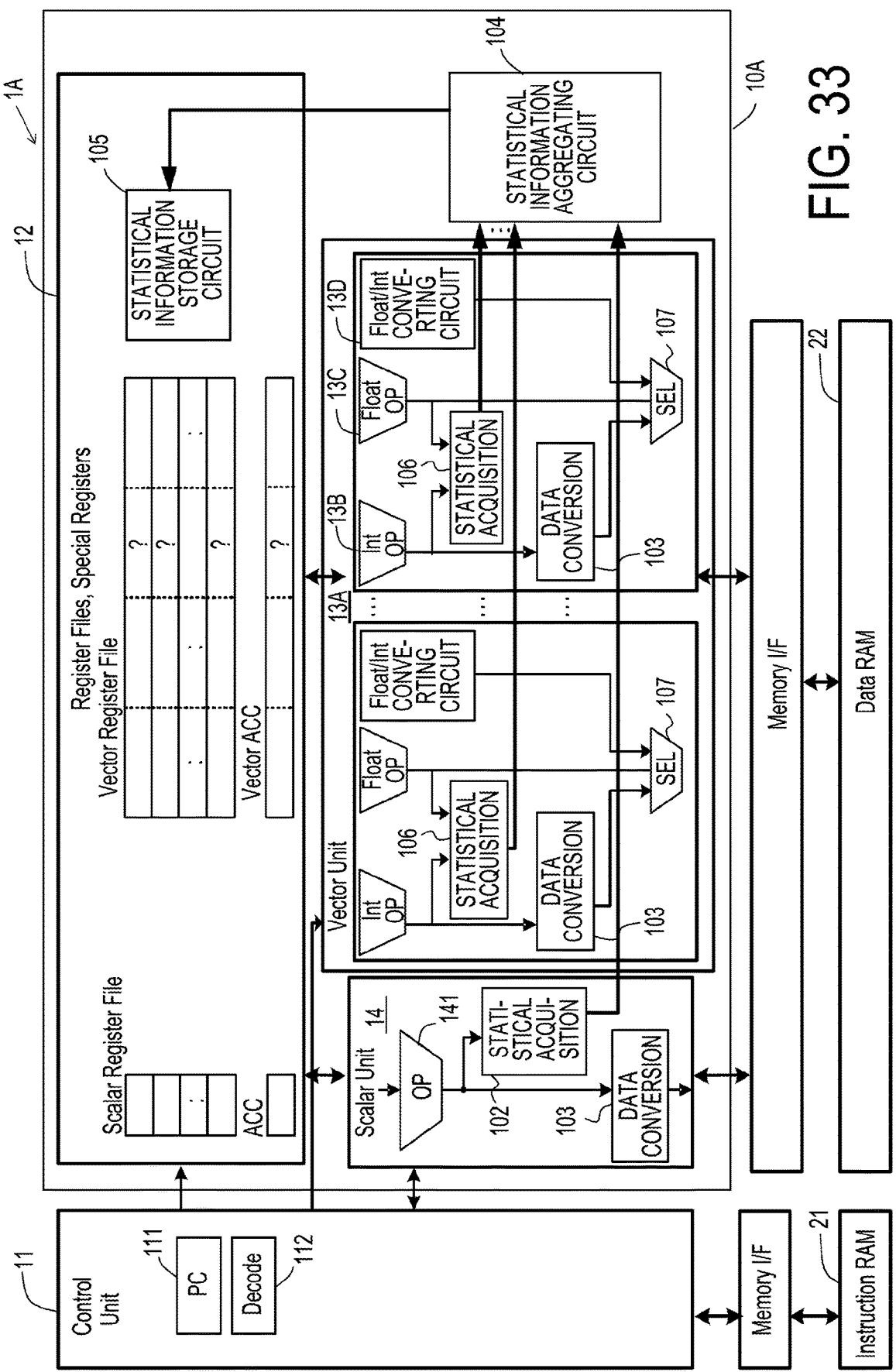
FIG. 33 is a view exemplifying a configuration of an information processing apparatus according to a second embodiment.

FIG. 33 exemplifies the configuration of the information processing apparatus 1A according to the second embodiment. The information processing apparatus 1A includes the processor 10A instead of the processor 10 of the information processing apparatus 1 according to the embodiment. Similarly to the information processing apparatus 1 according to the embodiment, the information processing apparatus 1A includes an instruction memory (IRAM) 21 connected to the processor 10A via a memory interface (Memory I/F), and a data memory (DRAM) 22 connected to the processor 10A via the memory interface (Memory I/F). Among them, configurations of the instruction memory 21 and the data memory 22 are the same as those in the processor 10 of the first embodiment, and thus explanations thereof will be omitted. The instruction memory 21 is an example of a memory. The processor 10A is an example of an arithmetic processing apparatus connected to the memory. In the instruction memory 21, an instruction string of an application program such as deep learning executed by the information processing apparatus 1A is loaded.

The processor 10A includes a control unit 11, a register file 12, a vector unit 13A, and a scalar unit 14. Among them, configurations of the control unit 11, the register file 12, and the scalar unit 14 are the same as those in the processor 10 of the first embodiment, and thus explanations thereof will be omitted.

The vector unit 13A has a plurality of sets each including a vector operation-fixed point number arithmetic circuit 13B, a vector operation-floating point number arithmetic circuit 13C, a Float/Int converting circuit 13D that converts a data format between a floating point number and a fixed point number, a statistical information acquisition circuit 106 (omitted as "statistical acquisition" in the drawing), a data converting circuit 103 and a selection circuit 107. Here, the plurality of sets are, for example, eight sets, but the number of sets of arithmetic circuits within the vector unit 13A is not limited to eight. In the drawing, as an example, the fixed point number arithmetic circuit 13B, the floating point number arithmetic circuit 13C, and the Float/Int converting circuit 13D in one set are denoted by reference numerals. The vector unit 13A executes operations in parallel by a plurality of sets of arithmetic circuits. Among them, the configuration of the data converting circuit 103 is the same as that in the first embodiment, and thus explanations thereof will be omitted.

The vector operation-fixed point number arithmetic circuits 13B are prepared as a plurality of sets, and execute fixed point number operations in parallel, for example, additions. The vector operation-floating point number arithmetic circuits 13C are prepared as a plurality of sets, and execute floating point number operations in parallel, for example, additions. The Float/Int converting circuit 13D includes a first converting circuit that executes conversion from floating point number data into fixed point number data, and a second converting circuit that executes conversion from fixed point number data into floating point number data. The Float/Int converting circuit 13D is an example of a converting circuit that converts floating point number data into fixed point number data.

The first converting circuit that executes conversion from floating point number data into fixed point number data is general. The first converting circuit includes an extraction circuit that extracts a mantissa part from input floating point number data, and a shifting circuit that shifts a bit string of the mantissa part by a numerical value of an exponent part. That is, the first converting circuit extracts a mantissa part from input floating point number data, shifts the mantissa part by a numerical value specified by an exponent part, and outputs the result.

The second converting circuit that executes conversion from fixed point number data into floating point number data includes a circuit that detects a position of the most significant bit having a sign different from fixed point number data (a most significant bit position), an extraction circuit that extracts a bit string by a bit width corresponding to a mantissa part of a floating point number, from a bit string at a lower order than the most significant bit, a detection circuit that detects a shift amount by which the most significant bit position is shifted to a digit first from a decimal point position, and a generation circuit that generates an exponent part in an IEEE754 standard-floating point number format by adding 127 to the detected shift amount.

The circuit that detects a most significant bit position is, for example, the same as the statistical information acquisition circuit 102A (FIG. 14) in the first embodiment, which acquires the most significant bit position. The extraction circuit that extracts a bit string by a bit width corresponding to a mantissa part of a floating point number includes an AND gate that executes an AND operation between input fixed point number data, and a bit 1 array corresponding to a bit string of the mantissa part (a bit string in which as many 1s as bits of the mantissa part are arranged in a portion at a lower order than the most significant bit), and a shifting circuit that shifts and sets the output of the AND gate to the bit position of the mantissa part. Meanwhile, the floating point number is described in the form of a normalized format (mantissa part=1.NNNN . . . , exponent part=MMM . . . ) having one digit to the left of the decimal point. The first digit to the left of the decimal point is omitted in the mantissa part.

The detection circuit that detects a shift amount may detect a shift amount of the shifting circuit that shifts the output of the AND gate to the bit position of the mantissa part. The generation circuit that generates an exponent part in an IEEE754 standard-floating point number format includes an adding circuit that adds 127 to the detected shift amount, and a shifting circuit that shifts and sets the output of the adding circuit to the exponent part of the floating point number. Through the above configuration, the second converting circuit generates a floating point number in which a mantissa part is 1.NNNN . . . , and an exponent part is a shift amount+127, from a fixed point number. Meanwhile, as described above, in the mantissa part, only NNNN . . . to the left of the decimal point is held.

Figure 34:
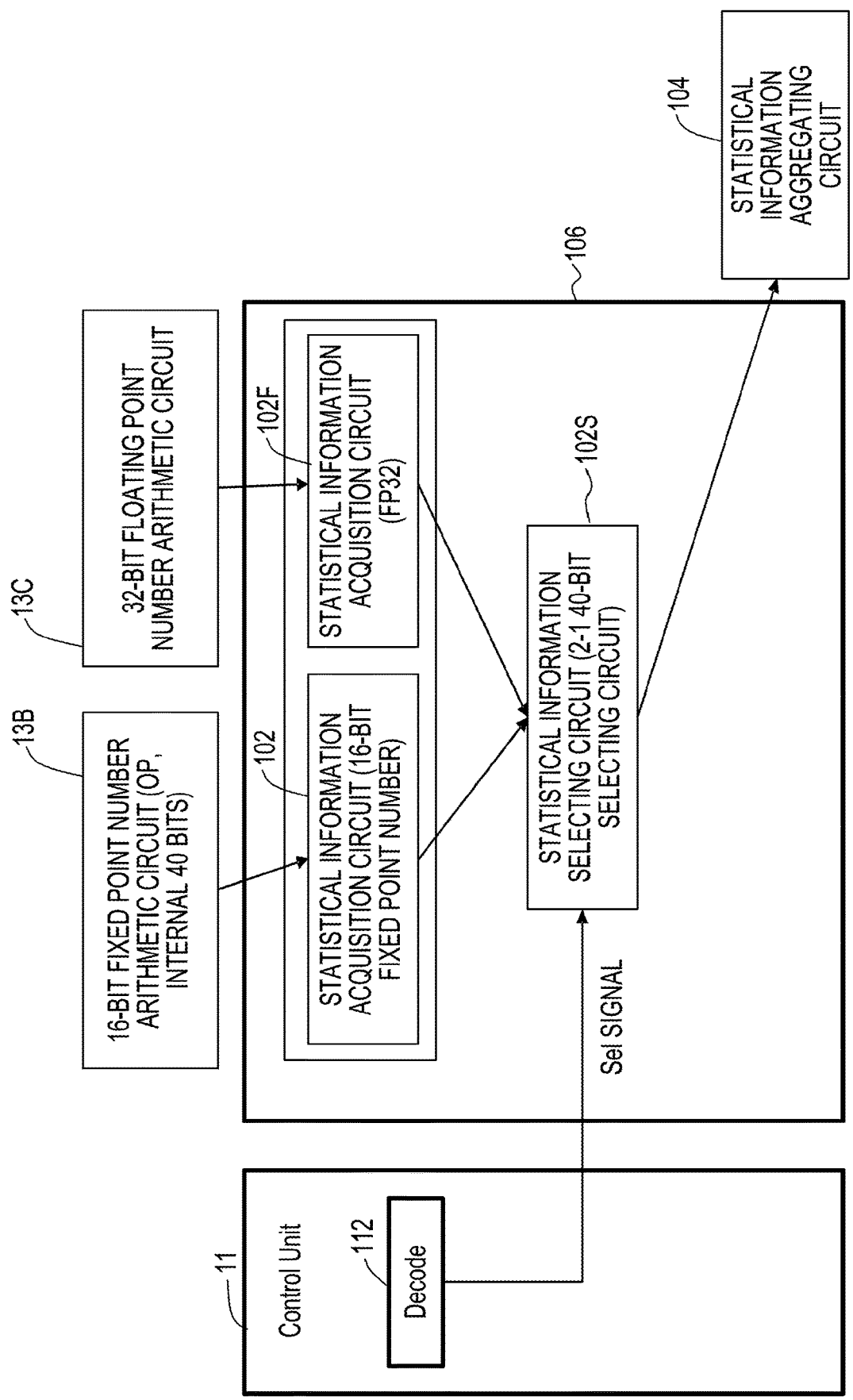
FIG. 34 is a view exemplifying a configuration of a statistical information acquisition circuit in the second embodiment.

FIG. 34 is a view exemplifying the configuration of the statistical information acquisition circuit 106 in the second embodiment. In the drawing, together with the statistical information acquisition circuit 106, the control unit 11, the vector operation-fixed point number arithmetic circuit 13B, the vector operation-floating point number arithmetic circuit 13C, and a statistical information aggregating circuit 104 are also described. As in the drawing, the statistical information acquisition circuit 106 in the second embodiment includes a fixed point number data-statistical information acquisition circuit 102, a floating point number data-statistical information acquisition circuit 102F, and a statistical information selecting circuit 102S. The fixed point number data-statistical information acquisition circuit 102 is the same as the statistical information acquisition circuit 102 in the first embodiment, and thus explanations thereof will be omitted. The floating point number data-statistical information acquisition circuit 102F is a circuit that acquires the most significant digit (binary number) position corresponding to a numerical value of floating point number data except for a sign. A detailed configuration example of the floating point number data-statistical information acquisition circuit 102F will be described below with reference to FIGS. 35 and 36.

The statistical information selecting circuit 102S selects either a signal output from the fixed point number data-statistical information acquisition circuit 102 or a signal output from the floating point number data-statistical information acquisition circuit 102F, in accordance with an instruction from a decoder 112, and outputs the selected signal to the statistical information aggregating circuit 104. Accordingly, for example, when an operation on 16-bit fixed point number data is executed by the vector operation-fixed point number arithmetic circuit 13B, the fixed point number data-statistical information acquisition circuit 102 acquires statistical information with the same configuration and operation as those in the first embodiment. Then, the fixed point number data-statistical information acquisition circuit 102 outputs the acquired statistical information from the statistical information selecting circuit 102S to the statistical information aggregating circuit 104. For example, when an operation on 32-bit floating point number data is executed by the vector operation-floating point number arithmetic circuit 13C, the floating point number data-statistical information acquisition circuit 102F acquires statistical information, and outputs the acquired statistical information from the statistical information selecting circuit 102S to the statistical information aggregating circuit 104. The statistical information selecting circuit 102S switches between a signal output from the fixed point number data-statistical information acquisition circuit 102 and a signal output from the floating point number data-statistical information acquisition circuit 102F, in accordance with a control signal from the decoder 112 of the control unit 11.

Figure 35:
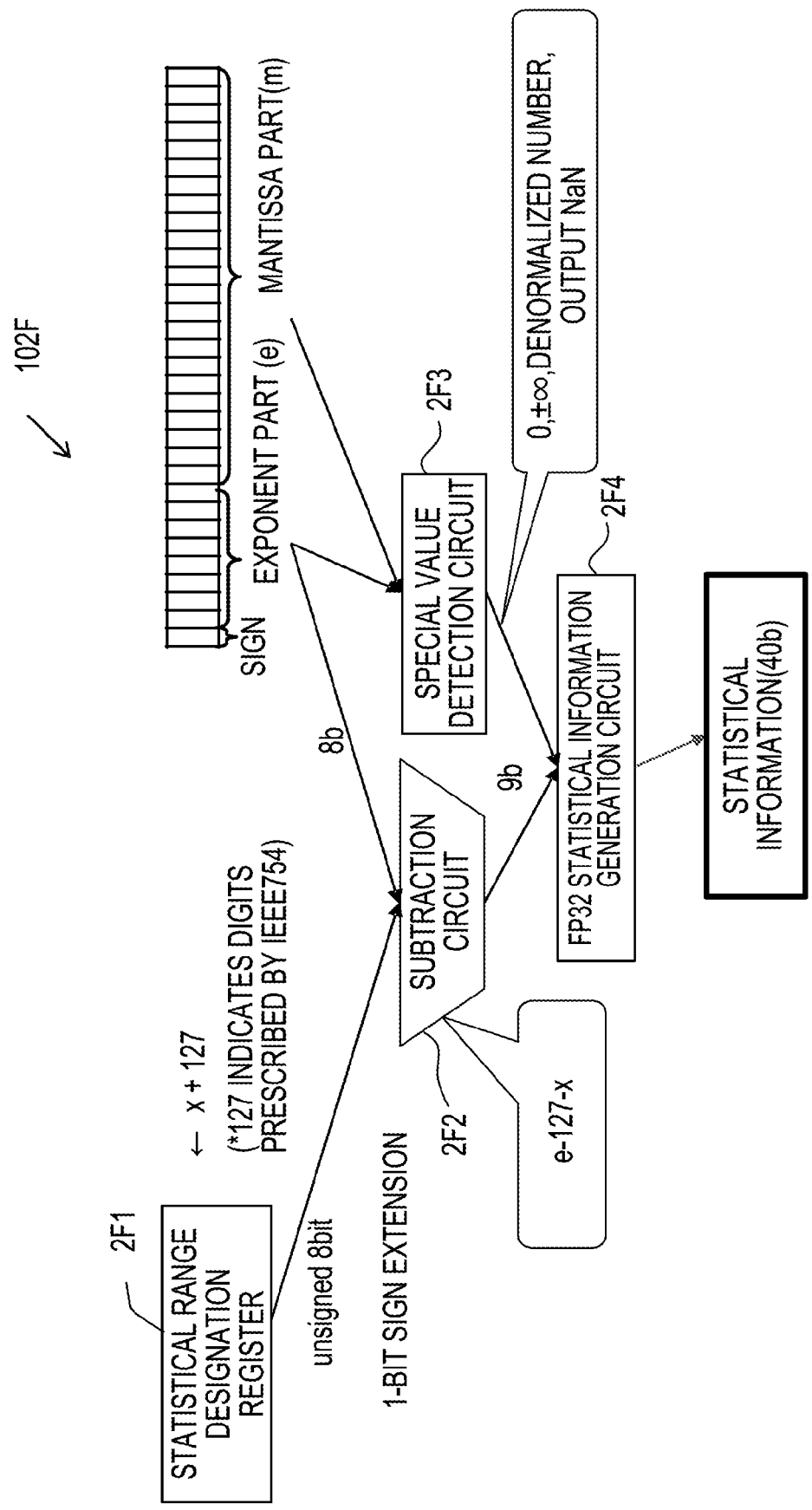
FIG. 35 is a view exemplifying a detailed configuration of a floating point number data-statistical information acquisition circuit.

FIG. 35 is a view exemplifying a detailed configuration of the floating point number data-statistical information acquisition circuit 102F. The statistical information acquisition circuit 102F is an example of an acquisition circuit that acquires statistical information on a distribution of bits in floating point number data.

The statistical information acquisition circuit 102F includes a statistical range designation register 2F1, a subtraction circuit 2F2, a special value detection circuit 2F3, and an FP32 statistical information generation circuit 2F4. In the second embodiment, as floating point numbers, floating point number data in a format prescribed by IEEE754 is assumed. In a floating point number in a format prescribed by IEEE754, a value obtained by adding 127 to an actual value is set in an exponent part. In the second embodiment, as statistical information of the floating point number data, 40 bits are assumed. However, a distribution of values of actual floating point number data may not fall within a range of 40 bits. Therefore, in the second embodiment, the statistical information acquisition circuit 102F accepts designation of a portion (40 bits from a shift amount X as described below) to be acquired as statistical information, in a distribution of values of the floating point numbers, and acquires statistical information in the designated portion.

In the statistical range designation register 2F1, the sum of a shift amount X of a statistical information acquisition range and 127 is set. The shift amount X of the statistical information acquisition range is a value that specifies digits at the least significant side in the statistical information acquisition range. The shift amount X of the statistical information acquisition range is specified as, for example, an operand of an acquisition instruction indicating statistical information acquisition of floating point number data. The statistical range designation register 2F1 is an example of a designation circuit that designates acquisition of a specific part in a distribution of bits in floating point number data.

The subtraction circuit 2F2 subtracts the value (X+127) of the statistical range designation register 2F1 from an exponent part(e) of the floating point number data as a target from which statistical information is to be acquired. As a result, from the exponent part in the floating point number data, an added value (127) prescribed by IEEE754 and the shift amount X are subtracted. The subtraction circuit 2F2 inputs the subtraction result to the FP32 statistical information generation circuit 2F4. Here, the subtraction circuit 2F2 inputs a 1-bit zero extended value from the exponent part (e.g., 8 bits) of the floating point number data, to the FP32 statistical information generation circuit 2F4. Since the exponent part prescribed by IEEE754 is an 8-bit unsigned integer, and a value of the statistical range designation register is also an 8-bit unsigned integer, in order to accurately determine the sign of the subtraction result, 1 bit is extended.

The special value detection circuit 2F3 detects a floating point number 0, a denormalized number (a number in which an exponent part=0, and a mantissa part has a value other than 0), a Not A Number (NAN), and a +− infinite value. Here, each of the floating point number 0, the denormalized number, the NAN, and the +− infinite value is prescribed by IEEE754. The special value detection circuit 2F3 may detect at least one of the floating point number 0, the denormalized number, the NAN, and the +− infinite value.

In IEEE754, the exponent part is, for example, an 8-bit positive number, and a value ranging from 1 to 254 is used. As described above, this value is a value obtained by adding an offset of 127, and represents −126 to +127 of an exponent by a value ranging from 1 to 254. Meanwhile, in IEEE754, a case where an exponent part is 0 and 255 indicates a special meaning. As described above, in a mantissa part of floating point number data, a value to the left of the decimal point is fixed to 1, and in an actual mantissa part, a value to the right of the decimal point is set. That is, the value 1 to the right of the decimal point is an implicit value and is not described in actual data. It can be said that a floating point number in which the value to the right of the decimal point is fixed to 1 is a normalized number. The special value detection circuit 2F3 detects the following special value from such floating point number data.

The floating point number 0 corresponds to a case where an exponent part=0 and a mantissa part=0. The denormalized number is a number in which an exponent part=0 and a mantissa part has a value other than 0. The denormalized number means a numerical value smaller than a normalizable numerical value. The +− infinite value is defined by an exponent part=255 and a mantissa part=0. The NAN is defined by an exponent part=255 and a mantissa part having a value other than 0. Upon detecting these values, the special value detection circuit 2F3 sets 1 to a predetermined signal (bit), and inputs the signal to the FP32 statistical information generation circuit 2F4. The above-described circuit configuration of the special value detection circuit 2F3 may be implemented by a combination logic circuit including an AND gate, an OR gate, and an inverter (NOT).

Figure 36:
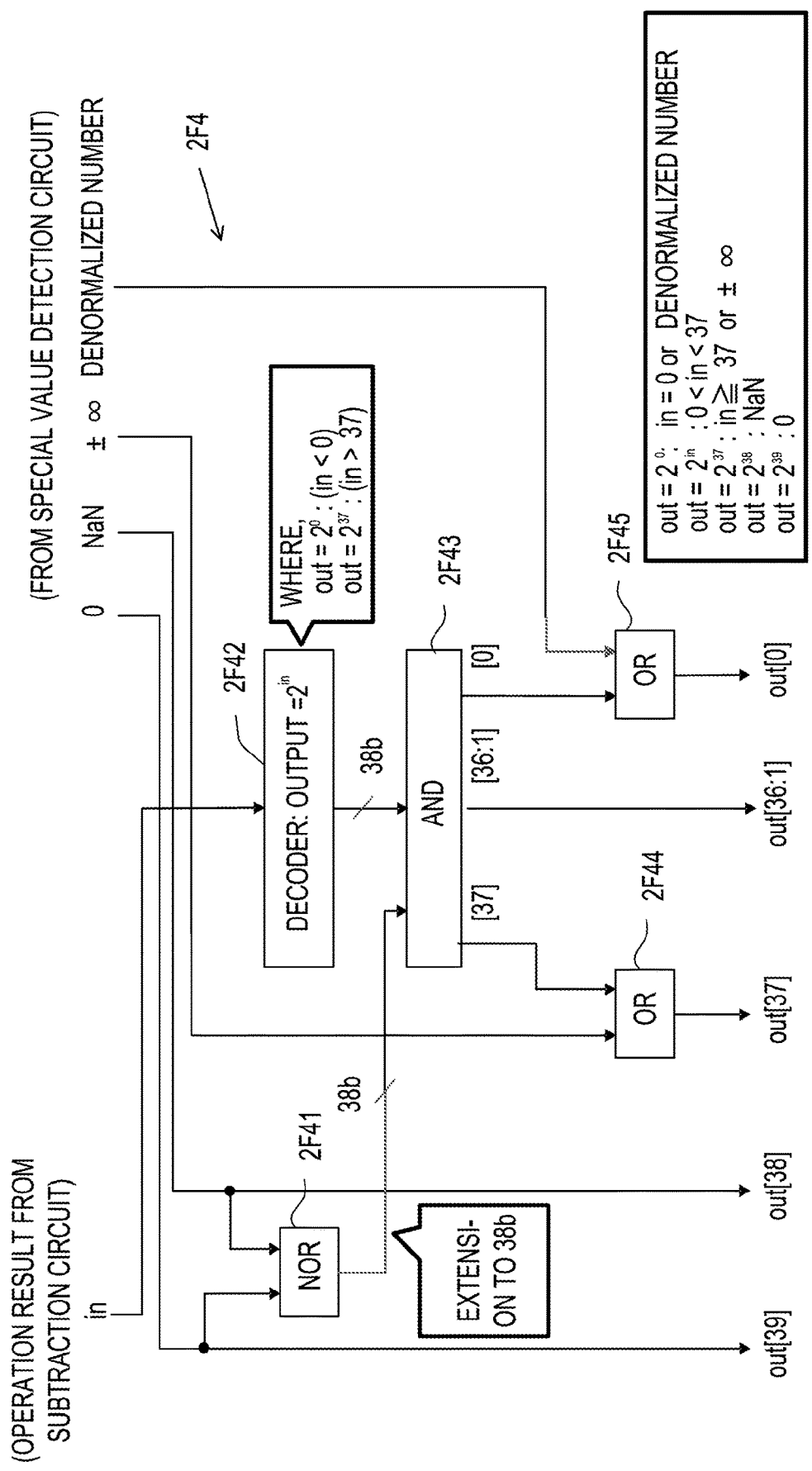
FIG. 36 is a view exemplifying a configuration of an FP32 statistical information generation circuit.

FIG. 36 exemplifies the configuration of the FP32 statistical information generation circuit 2F4. The FP32 statistical information generation circuit 2F4 includes a NOR gate 2F41, a decoder 2F42, an AND gate 2F43, and OR gates 2F44 and 2F45. Here, the output of the FP32 statistical information generation circuit 2F4 is expressed by out[0] to out[39] (corresponding to digits of $2^0$ to $2^{39}$, respectively). The FP32 statistical information generation circuit 2F4 outputs a distribution of the most significant digits, which is statistical information except for special values, to out[1] to out[36]. In a normalized number, since the value to the right of the decimal point is fixed to 1, the distribution of the most significant digits of floating point number data is a distribution of values of exponent parts itself.

Therefore, the decoder 2F42 decodes the subtraction result (the result obtained by subtracting X+127 from the exponent part of the floating point number) from the subtraction circuit 2F2 in FIG. 35, outputs 1 to the corresponding bit, and outputs the result to out[36:1] via the AND gate 2F43. Meanwhile, when the subtraction result from the subtraction circuit 2F2 is negative, the decoder 2F42 outputs 1 to the least significant bit ($2^0$). When the subtraction result from the subtraction circuit 2F2 is larger than 37, the decoder 2F42 outputs 1 to a bit 37 ($2^{37}$). That is, in FIG. 36, the decoder 2F42 decodes and outputs the subtraction result from the subtraction circuit 2F2, to 38 bits of the least significant bit ($2^0$) to the bit 37 ($2^{37}$). It can be said that the above processing by the decoder 2F42 is an example in which a bit position specified by a numerical value of an exponent part in floating point number data is acquired.

A detection signal of 0 or a detection signal of NAN (value 1) is input to the other input of the AND gate 2F43 (other than the input from the decoder 2F42), via the NOR gate 2F41. Therefore, when the special value detection circuit 2F3 in FIG. 35 detects a floating point number 0 or a NAN, statistical information is not output to out[36:1]. When the special value detection circuit 2F3 in FIG. 35 detects a floating point number 0, the detection signal (value 1) is, as it is, output to out[39]. When the special value detection circuit 2F3 detects a NAN, the detection signal (value 1) is, as it is, output to out[38]. To out[37], a detection value (value 1) of +− infinity or a bit 37 decoded by the decoder 2F42 is output, by the OR gate 2F44. To out[0], a detection value of a denormalized number or a bit 0 decoded by the decoder 2F42 is output.

As described above, for the floating point number 0, in the output by the FP32 statistical information generation circuit 2F4, out[39] is set to 1 and other bits are set to 0. For the NAN, in the output by the FP32 statistical information generation circuit 2F4, out[38] is set to 1 and other bits are set to 0. When the subtraction result from the subtraction circuit 2F2 exceeds 37, in the output by the FP32 statistical information generation circuit 2F4, out[37] is set to 1 and other bits are set to 0. Therefore, the FP32 statistical information generation circuit 2F4 may reflect a numerical value exceeding a value range (e.g., 37 bits) prepared as statistical information, in the most significant digit of the statistical information.

When the subtraction result from the subtraction circuit 2F2 is less than 0 or a denormalized number is detected, in the output by the FP32 statistical information generation circuit 2F4, out[0] is set to 1 and other bits are set to 0. Therefore, the FP32 statistical information generation circuit 2F4 may reflect the denormalized number that is a non-normalizable small value, in statistical information. When the subtraction result from the subtraction circuit 2F2 is a value k ranging from 0 to 37, in the output by the FP32 statistical information generation circuit 2F4, out[k] is set to 1 and other bits are set to 0. As described above, it can be said that each bit of out[0] to out[39] is an example of a flag bit that indicates a bit position specified by a numerical value of an exponent part in floating point number data. As illustrated in FIG. 33, out[0] to out[39] are input to the statistical information aggregating circuit 104, and are integrated as in the first embodiment.

<Processing Flow>

Figure 37:
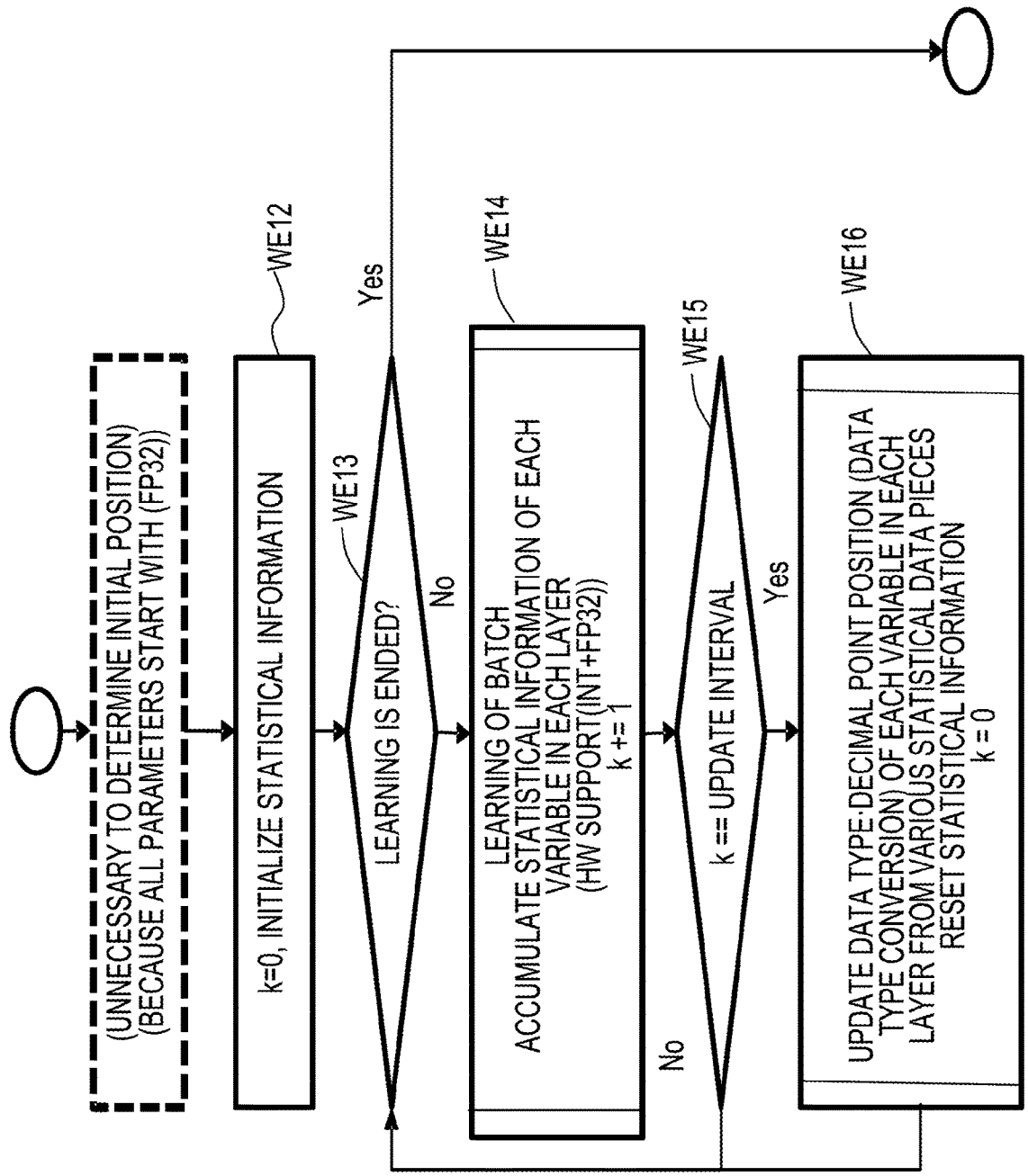
FIG. 37 is a view exemplifying a processing of an application program.

FIG. 37 exemplifies a processing of an application program executed by the information processing apparatus 1A through the processor 10A. The application program is loaded in a main memory device including the instruction memory 21 in the information processing apparatus 1A. Then, each instruction in the loaded application program is acquired by the control unit 11 from a cache of the instruction memory 21, decoded by the decoder 112, and executed by the scalar unit 14 and the vector unit 13A. Therefore, it can be said that the processing by the processor 10A is an example of a processing executed in accordance with an instruction stored in a memory.

Among processings of the application program, processings such as vector product-sum operations and vector additions are executed by the vector unit 13A, and other processings such as branching and scalar operations are executed by the scalar unit 14. In the processing in the second embodiment, unlike in the information processing apparatus 1 in the first embodiment, the information processing apparatus 1A does not need to determine an initial decimal point position. This is because at the initial stage, all parameters and weights are processed with variables of floating point number data. Since in the processing of FIG. 37, all parameters and weights are processed with variables of floating point number data at the initial stage of learning, it can be said that the processing of FIG. 37 is an example in which at the time of start of deep training data processed in the deep learning is computed with floating point numbers.

Then, the information processing apparatus 1A initializes the number of times k to 0. The information processing apparatus 1A initializes a variable storing statistical information within the program (WE12). Then, the information processing apparatus 1A determines whether learning completion conditions are satisfied (WE13). Learning is completed in a case where an error is equal to or less than a reference value or the number of times of learning has reached a prescribed maximum value.

When the learning completion conditions are not satisfied, the information processing apparatus 1A executes the following mini batch. Here, the information processing apparatus 1A accumulates statistical information of each variable of each layer, in a statistical information register or a statistical information register file. Accumulation of the statistical information is executed by hardware (the statistical information acquisition circuit 106, the statistical information acquisition circuit 102, the statistical information acquisition circuit 102F, and the statistical information aggregating circuit 104) of the processor 10A as in the first embodiment. For floating point number data, the processor 10A acquires statistical information by the statistical information acquisition circuit 102F. Then, the information processing apparatus 1A counts up the variable k (WE14).

Then, the information processing apparatus 1A determines whether the number of times k has reached an update interval (WE15). When it is determined that the number of times k has not reached the update interval, the information processing apparatus 1A returns to the processing in WE13. Meanwhile, when it is determined that the number of times k has reached the update interval, the information processing apparatus 1A reads statistical information from a statistical information register or a statistical information register file, or a region of the data memory 22 in which statistical information is saved. Then, the information processing apparatus 1A executes a processing of updating a data type and a decimal point position of each variable in each layer, from various statistical information pieces (WE16). That is, based on the read statistical information, the information processing apparatus 1A determines whether there is any variable changeable into fixed point number data, among variables of floating point number data in each layer, and changes the changeable variable into fixed point number data. When there is a variable already changed into fixed point number data, the information processing apparatus 1A updates a decimal point position of each variable in each layer, based on the read statistical information. Then, the information processing apparatus 1 returns to the processing in WE13. It can be said that the processing in WE16 includes an example in which statistical information is acquired.

Figure 38:
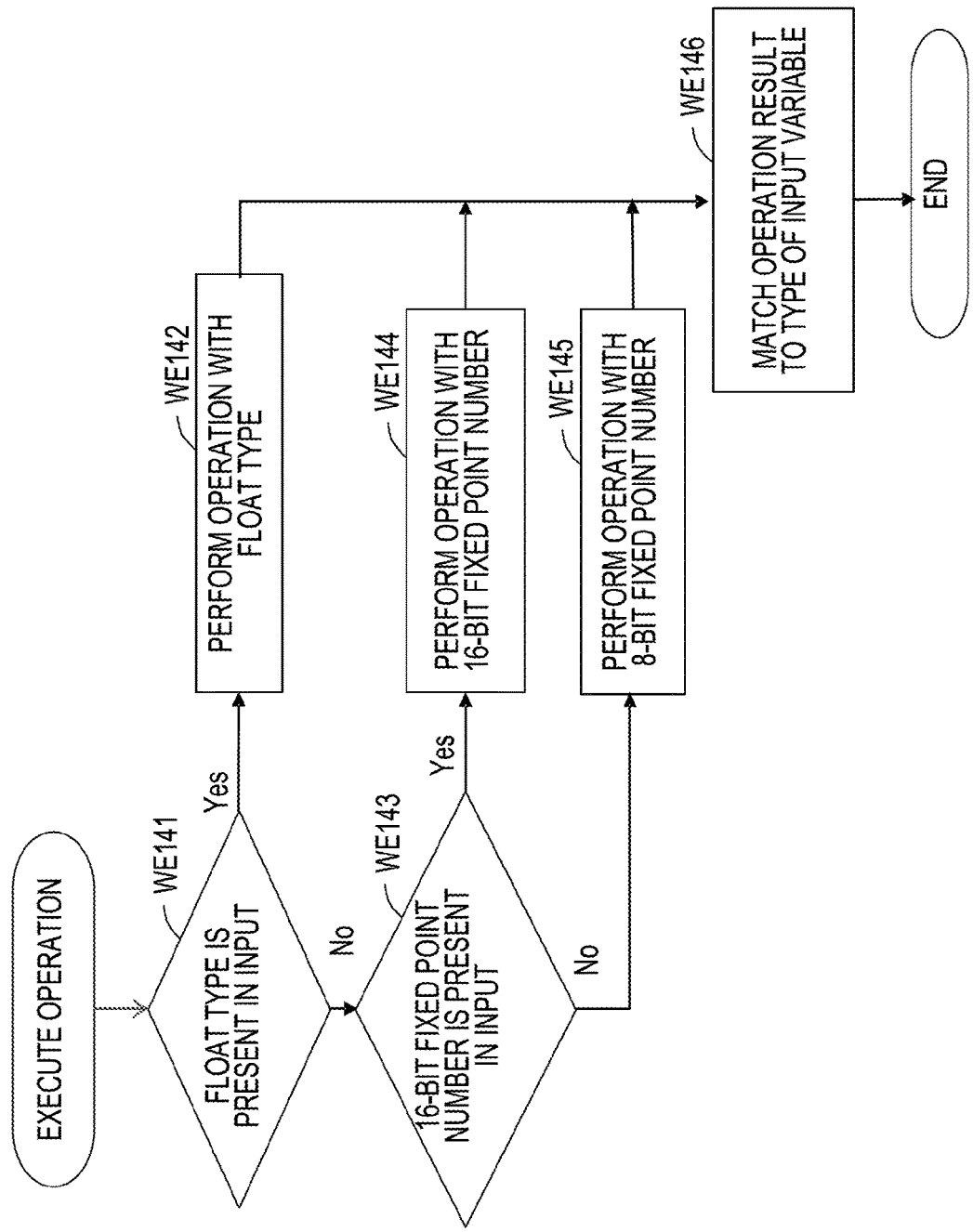
FIG. 38 is a view exemplifying details of type matching at the time of an operation.

FIG. 38 is a view exemplifying details of type matching at the time of an operation executed in a batch learning processing (WE14 in FIG. 37). The application program executed by the information processing apparatus 1A performs an operation after matching of a data type in each layer of deep learning.

More specifically, for each layer, the application program determines whether there is a float type parameter as an input parameter to the corresponding layer (WE141). Then, when it is determined that there is a float type parameter as an input parameter to the corresponding layer ("YES" in WE141), the application program executes an operation with a float type (WE142). When it is determined that there is no float type parameter as an input parameter to the corresponding layer ("NO" in WE141), the application program determines whether there is a 16-bit fixed point number as an input parameter to the corresponding layer (WE143). Then, when it is determined that there is a 16-bit fixed point number as an input parameter to the corresponding layer ("YES" in WE143), the application program executes an operation with a 16-bit fixed point number (WE144). When it is determined that there is no 16-bit fixed point number as an input parameter to the corresponding layer ("NO" in WE143), the application program executes an operation with an 8-bit fixed point number (WE145). Then, after the operation, the application program matches the operation result to the data type of an output variable (WE146).

Although FIG. 38 exemplifies a processing of performing an operation through data type matching for each layer, it is also possible that, for all operations, type matching is performed for each operation or each substitution. For example, when any one of two variables to which a binary operator indicating an operation is applied has a float type, the application program may execute an operation with the float type, and assign the operation result according to the data type of a substitution destination variable. For example, when neither of two variables to which a binary operator indicating an operation is applied has a float type, and one is a 16-bit fixed point number and the other is a 8-bit fixed point number, the application program may execute an operation with a 16-bit fixed point number, and match the operation result to the data type of a substitution destination variable.

Figure 39:
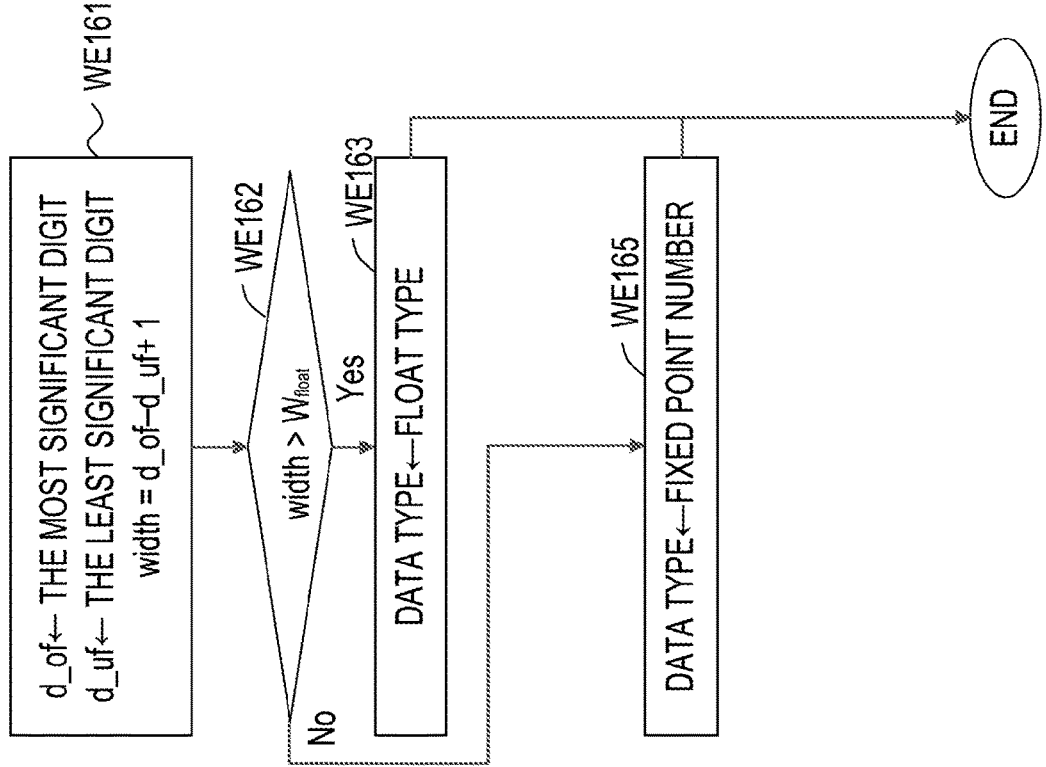
FIG. 39 is a view exemplifying details of a processing of updating a data type.

FIG. 39 is a view exemplifying details of a processing of updating a data type, in the processing of updating a data type and a decimal point position of each variable in each layer from various statistical data pieces (WE16 in FIG. 37). In this processing, the processor 10A of the information processing apparatus 1A calculates a bit width width=d_of-d_uf from the most significant digit d_of and the least significant digit d_uf (WE161). Here, the most significant digit d_of is determined such that a first condition is satisfied, for example, an overflow rate (the number of data pieces in a region to be saturated/the total number of data pieces)<a reference value $r_{of}$. The least significant digit d_uf is determined such that a second condition is satisfied, for example, an underflow rate (the number of data pieces in a region where underflow occurs/the total number of data pieces)<a reference value $r_{uf}$.

Then, it is determined whether the bit width is larger than a reference value $W_{float}$ (WE162). When it is determined that the bit width is larger than the reference value $W_{float}$, the processor 10A sets a data type of a variable as floating point number data (float type). When a data type of a variable is originally floating point number data (float type), the processor 10A maintains the data type of the floating point number data (float type) (WE163).

Meanwhile, when it is determined that the bit width falls within the reference value $W_{float}$, the processor 10A sets a data type of a variable as fixed point number data (WE165). The processor 10A executes the processing in FIG. 39 on each variable in each layer. The case where the bit width falls within the reference value $W_{float}$ is an example of a case where statistical information satisfies a predetermined condition. It can be said that the processing in WE165 is an example in which the floating point number data is converted into fixed point number data by a converting circuit. The case where the bit width falls within the reference value $W_{float}$ is an example in which a bit range satisfies a third condition.

Figure 40:
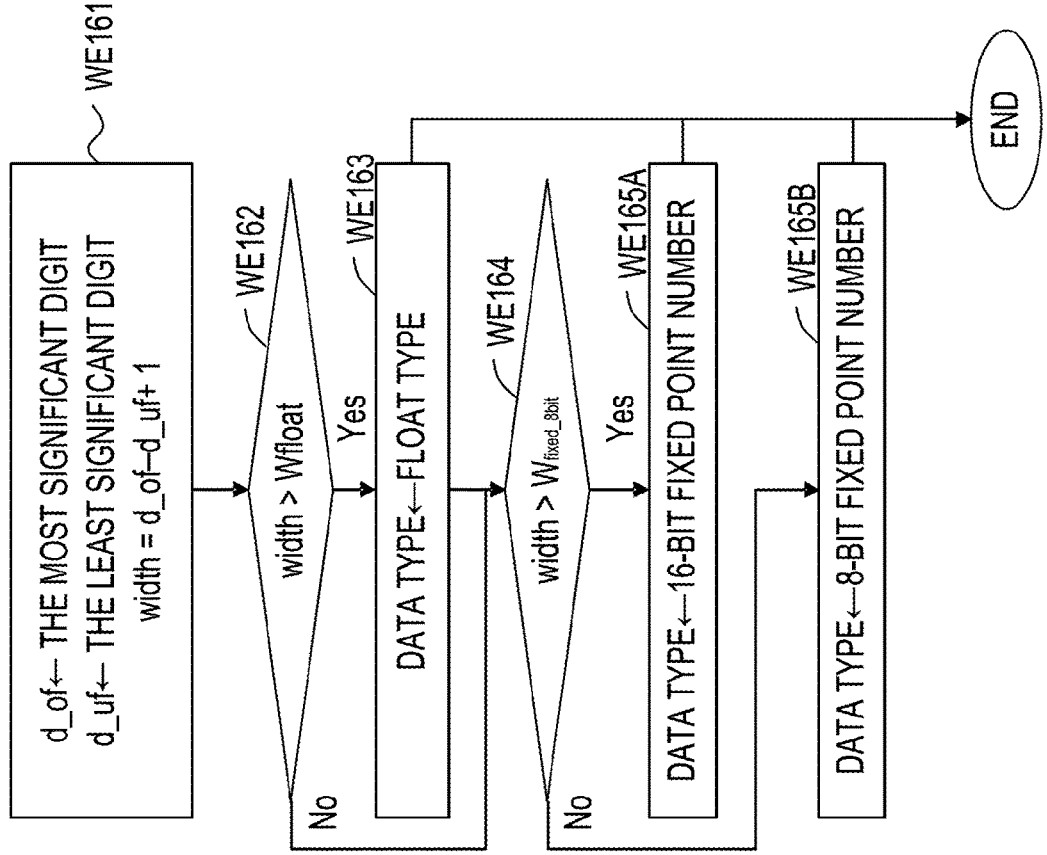
FIG. 40 is a view exemplifying a modification of a processing of updating a data type.

FIG. 40 is a view exemplifying a modification of a processing of updating a data type. In FIG. 40, with respect to FIG. 39, a processing in a case where the bit width falls within the reference value $W_{float}$ is subdivided. That is, when the bit width falls within the reference value $M_{float}$, the processor 10A determines whether the bit width is larger than a reference value $W_{fixed\_8bit}$ (WE164). The reference value $W_{fixed\_8bit}$ is the number of bits in a range processible with an 8-bit fixed point number. Then, when it is determined that the bit width is larger than the reference value $W_{fixed\_8bit}$, the processor 10A sets a data type of a variable as 16-bit fixed point number data (WE165A). Meanwhile, when it is determined that the bit width falls within the reference value $W_{fixed\_8bit}$, the processor 10A sets a data type of a variable as 8-bit fixed point number data (WE165B). The case where the bit width is larger than the reference value $W_{fixed\_8bit}$ is an example of a case in which statistical information satisfies a predetermined fourth condition, and the 16-bit fixed point number data is an example of fixed point number data with a first bit width. The case where the bit width falls within the reference value $W_{fixed\_8bit}$ is an example of a case where statistical information does not satisfy the predetermined fourth condition, and the 8-bit fixed point number data is an example of fixed point number data with a second bit width.

Figure 41:
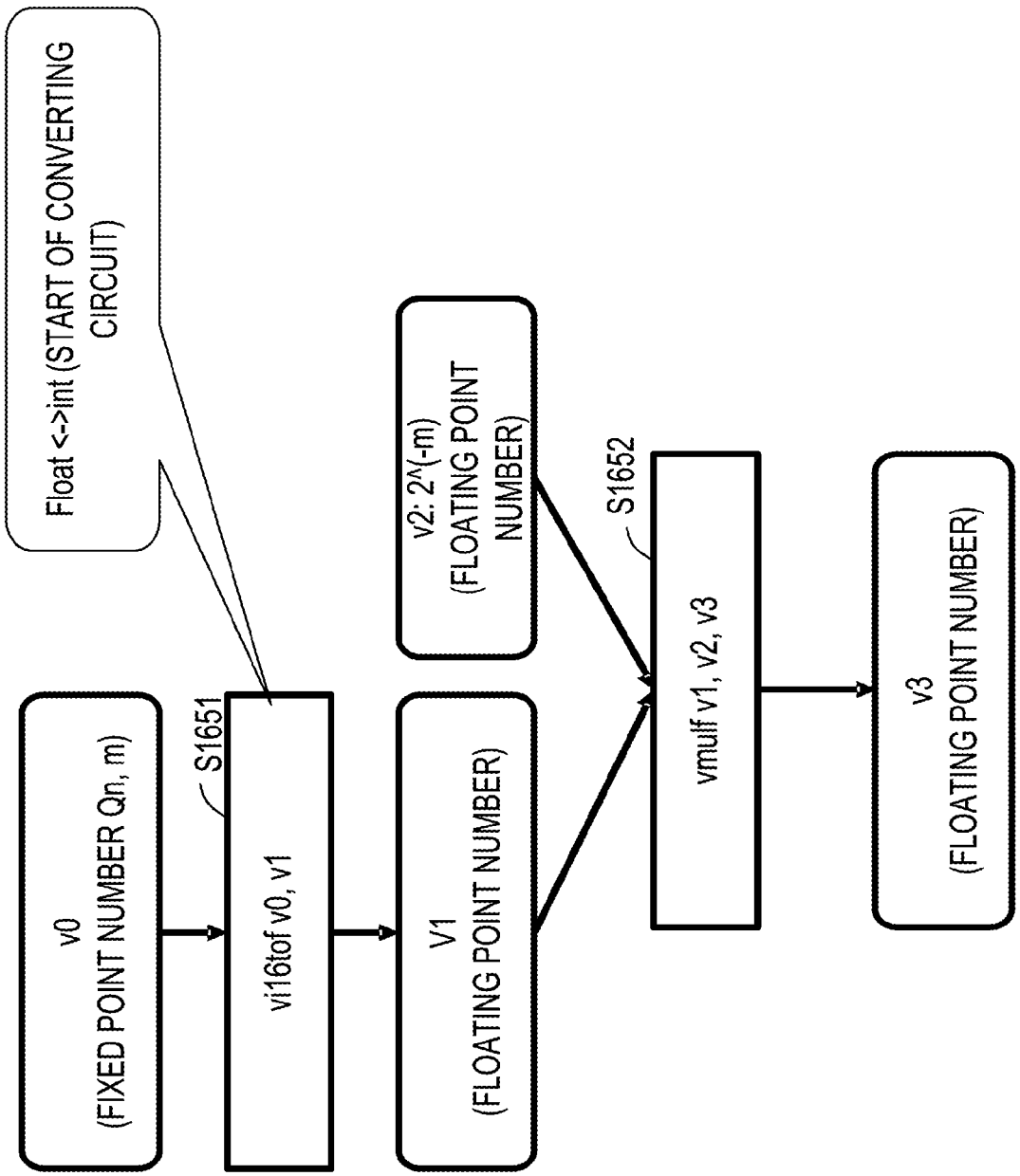
FIG. 41 is a view exemplifying a processing of converting a fixed point number into a floating point number.

FIG. 41 is a view exemplifying a processing of converting a fixed point number into a floating point number according to a program by the processor 10A of the information processing apparatus 1A. This processing example is an example in which a variable v0 is a fixed point number in a Qn. m format (the integer part: n bits, the decimal part: m bits), and is assigned through type conversion into a variable v3 of a floating point number. The program is described in an assembly language corresponding to an instruction of the processor 10A.

First, the processor 10A converts a 16-bit fixed point number variable v0 into a floating point number variable v1 by using a conversion instruction (vi16tof) of a 16-bit integer into a floating point number (S1651). By this processing, the Float/Int converting circuit 13D processes the value of the variable V0, and the fixed point number variable v0 is converted into an IEEE754 format (in the mantissa part, there is one digit to the right of the decimal point, which is omitted). Meanwhile, in this conversion, a decimal point position of Qn. m is not taken into consideration. Thereafter, in order to set the decimal point position of the Qn. m format (the integer part: m bits, the fraction part: n bits), that is, in order to shift a floating decimal point position by m bits from the right of the least significant digit, the processor 10A multiplies the floating point number variable V1 by a floating point number variable $V2=2^{-m}$, thereby obtaining a floating point number V3 (S1652). The processor 10A may store $V2=2^{-m}$ used in multiplication in S1652, in a predetermined register, and then use V2 in returning to the Qn. m format in the subsequent processing. Although a method of converting a 16-bit fixed point number into a floating point number is exemplified herein, this also applies to a case where an 8-bit fixed point number is converted into a floating point number.

Figure 42:
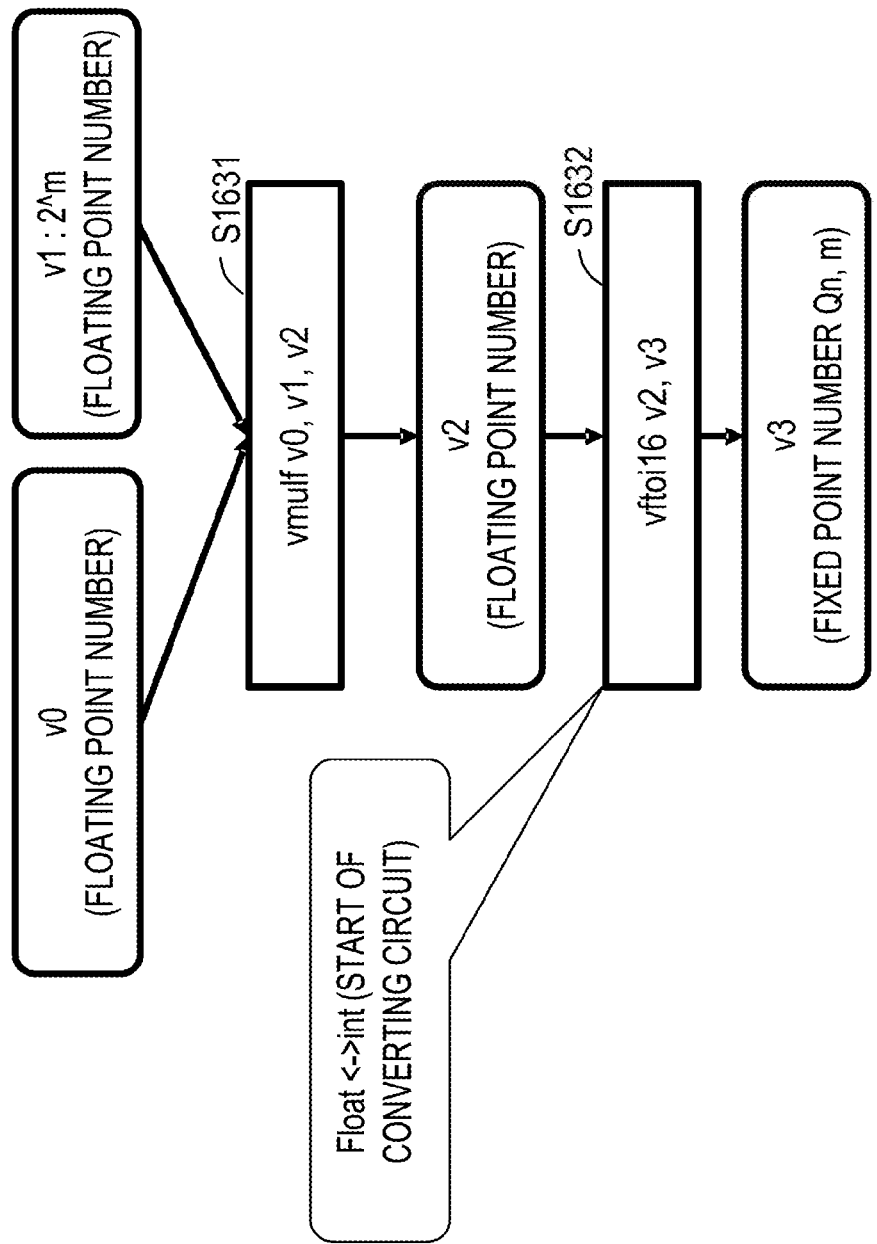
FIG. 42 is a view exemplifying a processing of converting a floating point number into a fixed point number.

FIG. 42 is a view exemplifying a processing of converting a floating point number into a fixed point number according to a program by the processor 10A of the information processing apparatus 1A. This processing example is an example in which a variable v0 is a fixed point number, and is assigned through type conversion into a variable v3 of a fixed point number in a Qn. m format.

First, the processor 10A holds a value $2^m$ corresponding to a decimal point position in conversion into a Qn. m format, in a variable V1, and multiplies a variable v0 by the variable V1, thereby obtaining a floating point number variable V2 (S1631). Accordingly, a position of a floating decimal point is shifted by m bits. Then, the processor 10A converts the variable V2 into a 16-bit integer by a vftoi16 instruction (S1632). By this processing, the Float/Int converting circuit 13D processes the value of the floating point number variable V2, and the floating point number V2 in an IEEE754 format is converted into a fixed point number (binary integer). When a value to be converted is larger than a maximum value of a 16-bit integer, the vftoi16 instruction causes conversion into a maximum value of a 16-bit integer, and when a value to be converted is smaller than a minimum value of a 16-bit integer, the vftoi16 instruction causes conversion into a minimum value of a 16-bit integer. The processor 10A may store $V1=2^m$ as a value used in multiplication in S1631, in a predetermined register, and use V1 in returning from the Qn. m format into the floating point number in the subsequent processing. Although a method of converting a floating point number into a 16-bit fixed point number is exemplified herein, this also applies to a case where a floating point number is converted into an 8-bit fixed point number.

Figure 43:
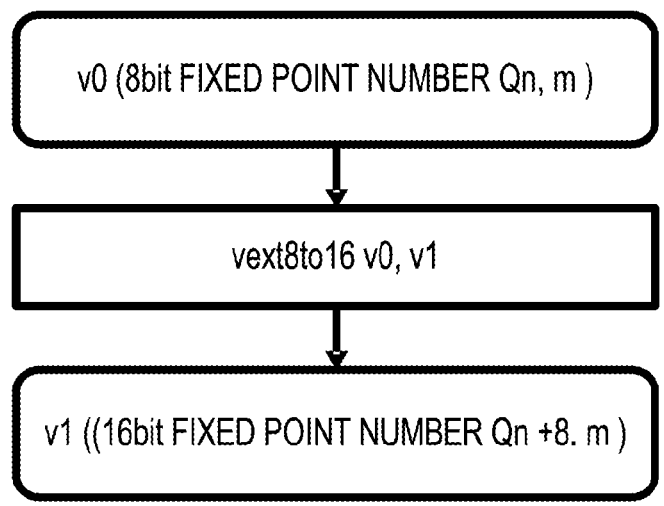
FIG. 43 is an example of a processing by an 8-bit to 16-bit sign extension instruction (vext8to16)
Figure 44:
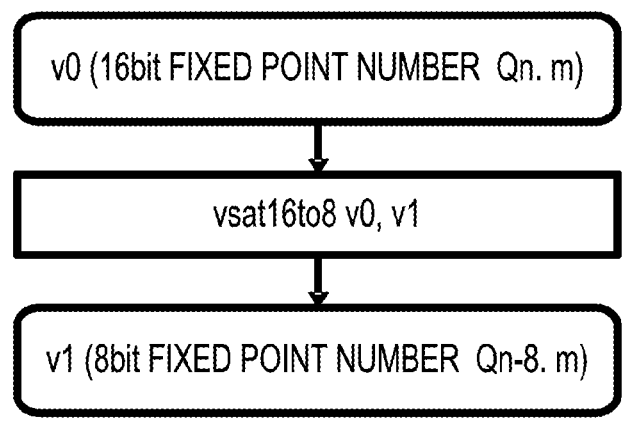
FIG. 44 is an example of a processing by a saturation operation instruction (vsat8)

FIG. 43 is an example of a processing by an 8-bit to 16-bit sign extension instruction (vext8to16) for converting a variable v0 of an 8-bit fixed point number into a variable v1 of a 16-bit fixed point number. FIG. 44 is an example of a processing by a saturation operation instruction (vsat8) for converting a variable v0 of a 16-bit fixed point number into a variable v1 of an 8-bit fixed point number.

<Effect of Second Embodiment>

Figure 45:
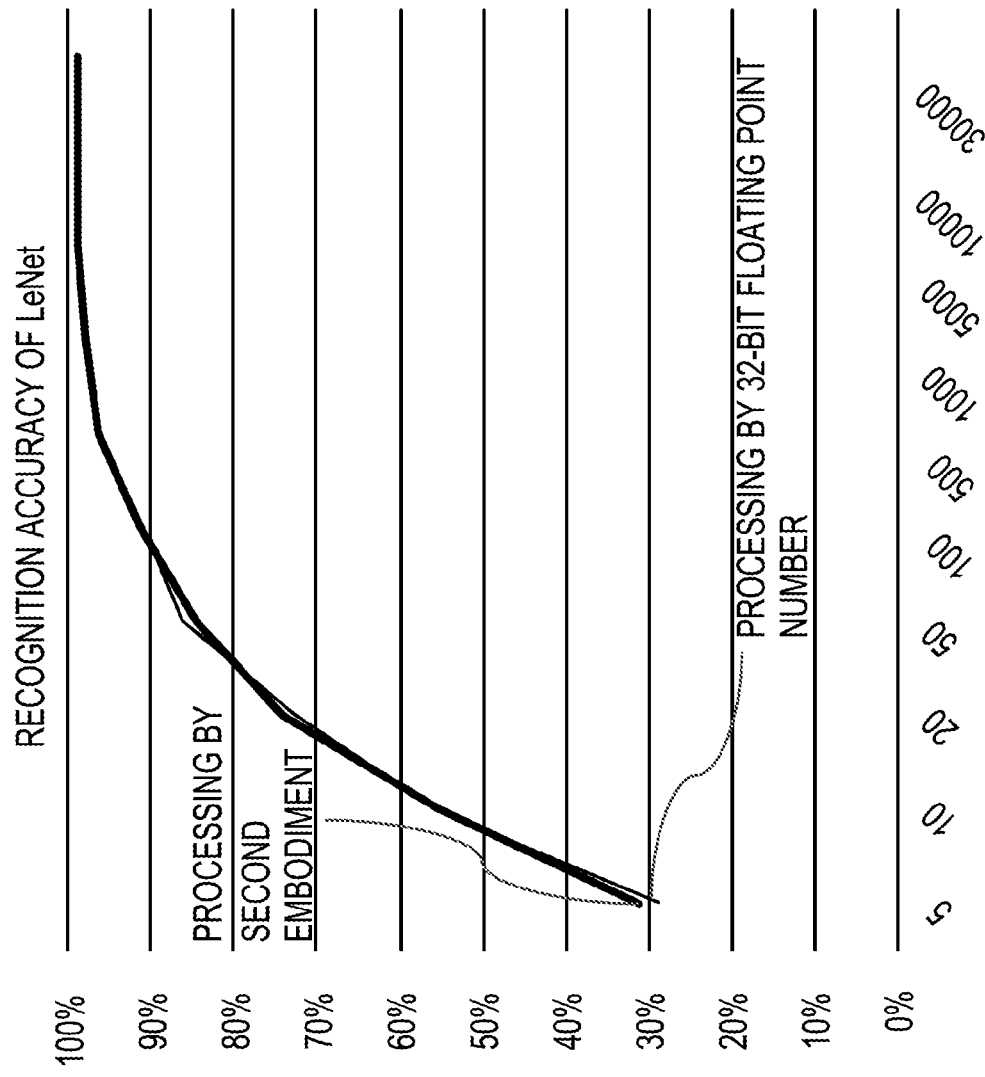
FIG. 45 is a processing example in LeNet.

FIG. 45 is a processing example in LeNet known as a convolution neural network employing inverse error propagation. As in the drawing, there is almost no difference in recognition accuracy between a processing using a 32-bit floating point number and a processing by the second embodiment.

Figure 46:
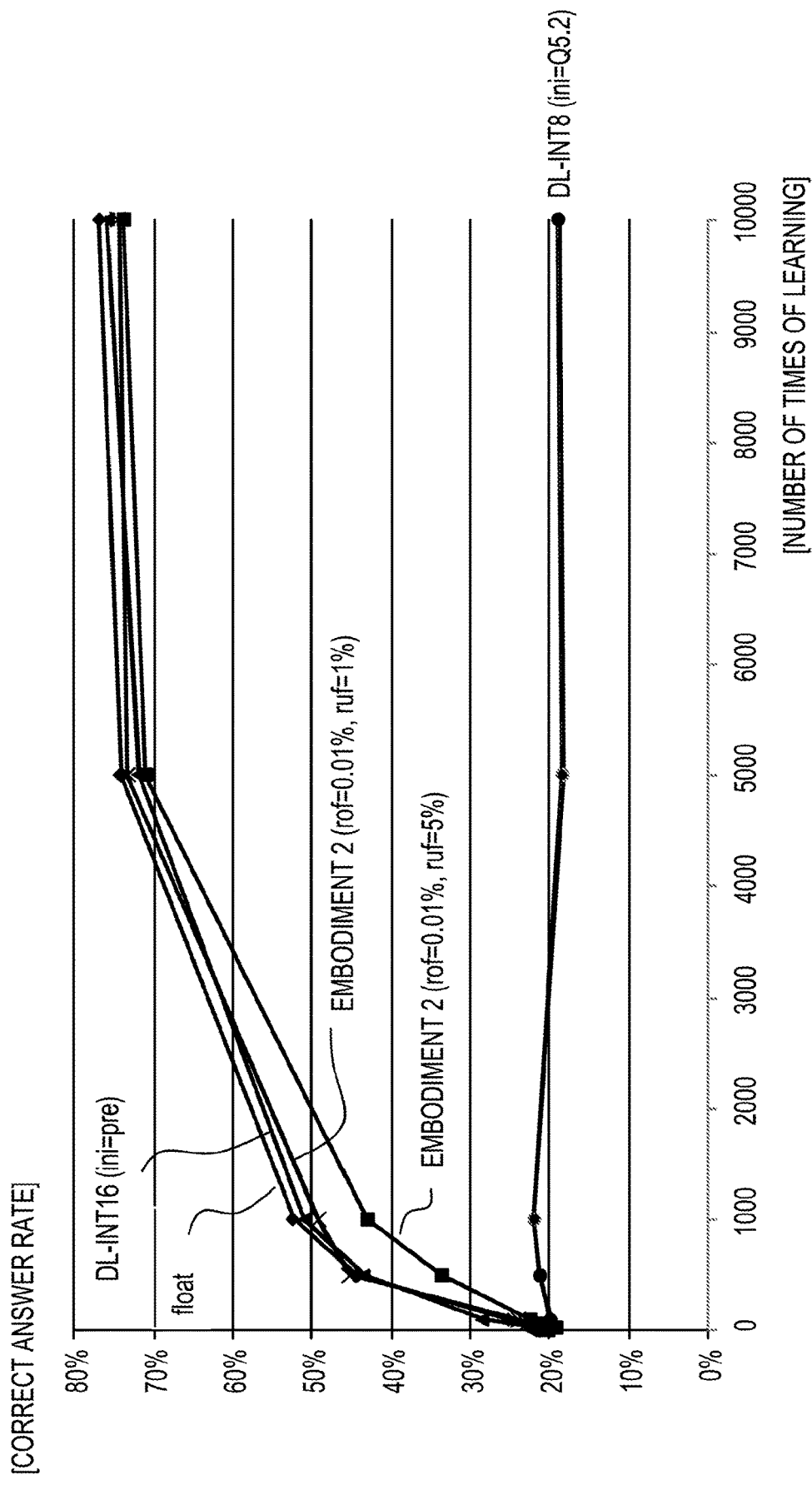
FIG. 46 is an example of a result of comparison between recognition accuracy.

FIG. 46 is an example of a result of comparison between recognition accuracy of a processing by the second embodiment, a processing by floating point numbers (float), a processing example by 16-bit fixed point numbers in a case where preliminary learning was performed (DL-INT16 (ini=pre)), and a processing example by 8-bit fixed point numbers with no preliminary learning (DL-INT8 (ini=Q5.2)). Here, in the processing by the second embodiment, a processing example in which a reference value $r_{of}$ of an overflow rate is set to 0.01%, and a reference value $r_{uf}$ of an underflow rate is set to 1%, and a processing example in which a reference value $r_{of}$ of an overflow rate is set to 0.01%, and a reference value $r_{uf}$ of an underflow rate is set to 5% are illustrated. In the preliminary learning, learning was executed 1000 times. As in the drawing, the recognition accuracy in the two processing examples by the second embodiment are almost the same as those in the processing by floating point numbers (float) and the processing example by 16-bit fixed point numbers in a case where preliminary learning was performed (DL-INT16(ini=pre)).

Figure 47:
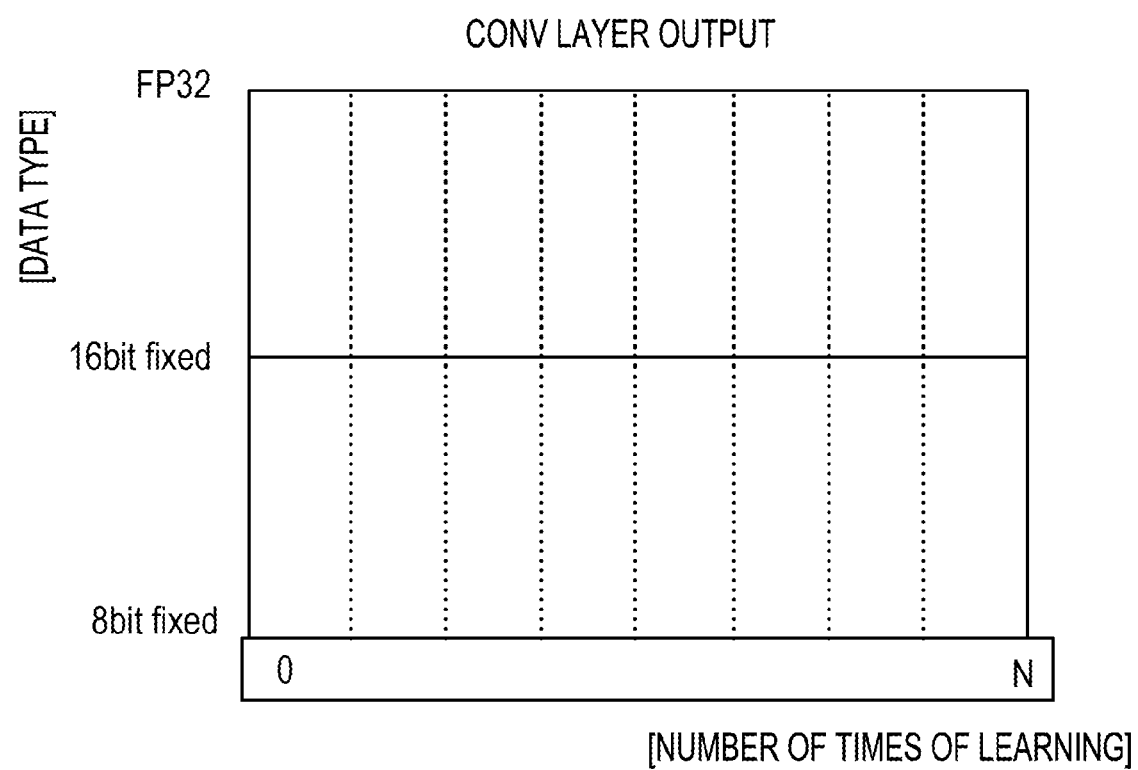
FIG. 47 is a history of a variation of a data type with respect to the number of times of learning.

FIG. 47 is a history of a variation of a data type of a variable holding output data from a convolution layer in deep learning, with respect to the number of times of learning. In the drawing, the horizontal axis indicates the number of times of learning N. In the drawing, the vertical axis exemplifies a type of a data type, that is, a state where an operation is made with a floating point number (FP32), a 16-bit fixed point number (16-bit fixed), or a 8-bit fixed point number (8-bit fixed). In relation to the output data from the convolution layer in this example, the data type of the variable is maintained as a 16-bit fixed point number as it is, and there is no variation in the type.

Figure 48:
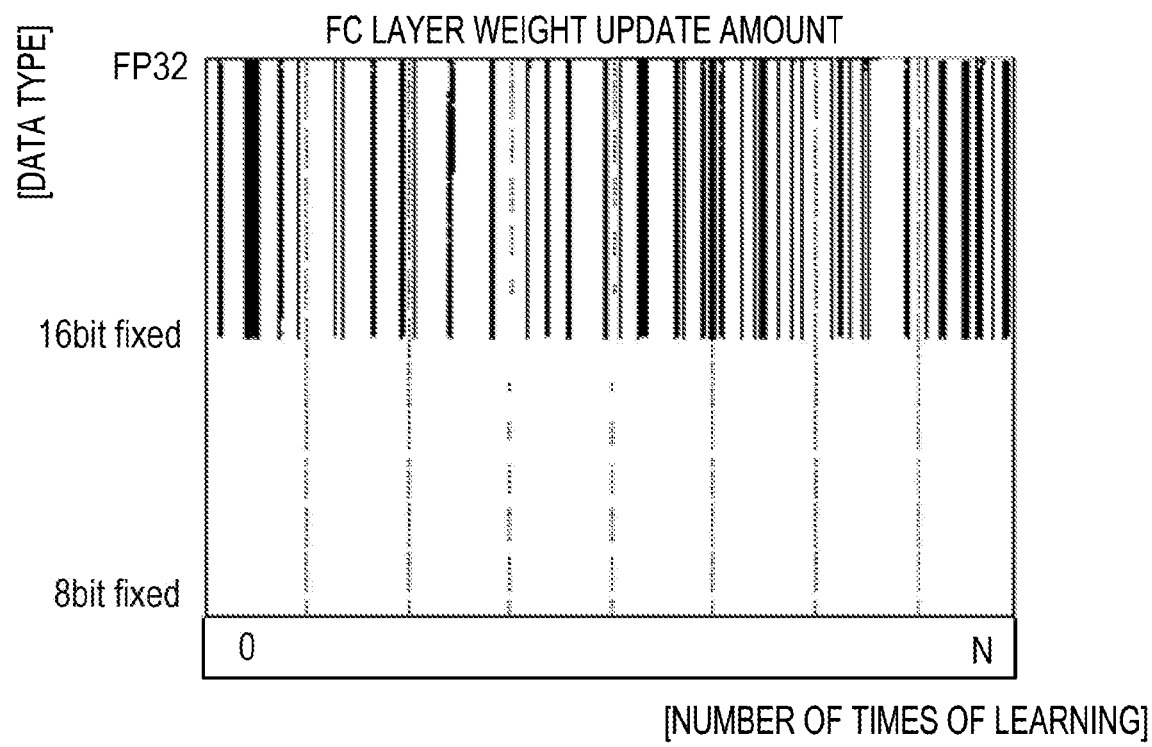
FIG. 48 is a history of a variation of a data type with respect to the number of times of learning.

FIG. 48 is a history of a variation of a data type of a variable holding an update amount of a weight of a fully connected layer (fc layer) in deep learning, with respect to the number of times of learning. In the drawing, the vertical line indicates that the data type of the variable varies between a floating point number (FP32) and a 16-bit fixed point number (16-bit fixed).

Figure 49:
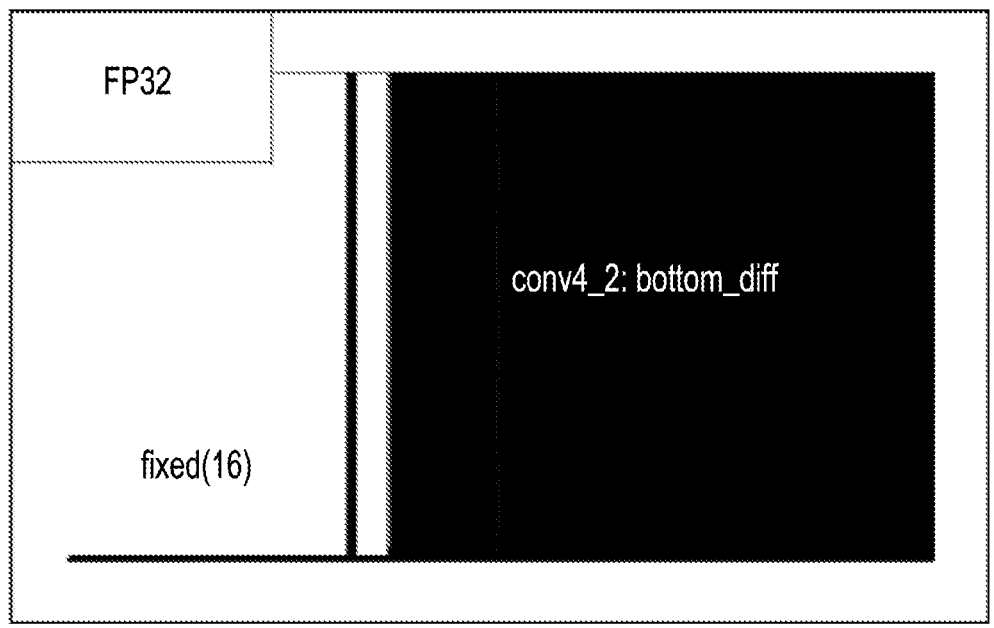
FIG. 49 is a history of a variation of a data type with respect to the number of times of learning.

FIG. 49 is a history of a variation of a data type of a variable holding an error in a convolution layer (conv4_2) in deep learning, with respect to the number of times of learning. In the drawing, a portion in dark color indicates a portion where many data type variations occur. The example of FIG. 49 indicates that the data type of the variable varies between a floating point number (FP32) and a 16-bit fixed point number (16-bit fixed) in the second half of learning.

Figure 50:
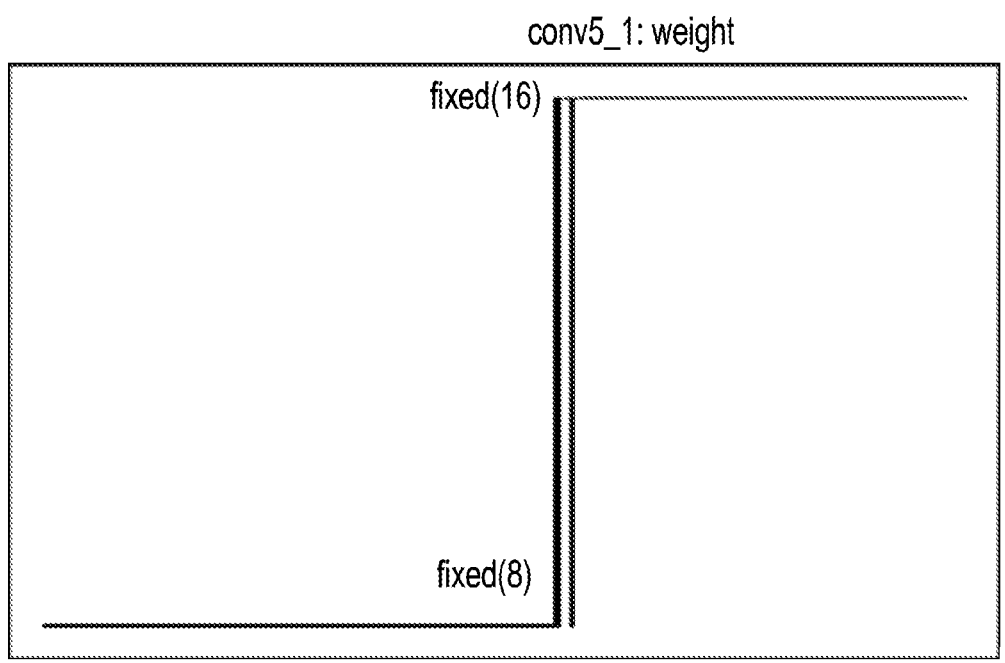
FIG. 50 is a history of a variation of a data type with respect to the number of times of learning.

FIG. 50 is a history of a variation of a data type of a variable holding a weight in a convolution layer (conv5_1) in deep learning, with respect to the number of times of learning. The example of FIG. 50 indicates transition of the data type of the variable from an 8-bit fixed point number (fixed (8)) to a 16-bit fixed point number (fixed (16)) during learning.

<Effect of Second Embodiment>

As described above, the processor 10A of the second embodiment includes the statistical information acquisition circuit 102F that acquires statistical information which is a distribution of values of floating point number data. The information processing apparatus 1A of the second embodiment includes the Float/Int converting circuit 13D that converts floating point number data into fixed point number data, and converts fixed point number data into floating point number data. Therefore, to an application program executing a processing in the processor 10A, the processor 10A may provide a unit that provides statistical information on floating point number data, and converts the floating point number data into fixed point number data according to the provided statistical information. As a result, the processor 10A may execute an operation by the floating point number data, for example, at the initial stage of a processing such as learning, and execute an operation by the fixed point number data when the statistical information satisfies a predetermined condition. Therefore, even in a processing including variables for which sufficient accuracy may not be secured with fixed point number data, the processor 10A and the information processing apparatus 1A including the processor 10A may execute a processing of only variables for which sufficient accuracy may be secured with fixed point number data, with the fixed point number data.

The statistical information acquisition circuit 102F of the second embodiment acquires statistical information which is a distribution of values of floating point number data in a range designated by the statistical range designation register 2F1 (e.g., 40 bits from a bit X designated by a user). Therefore, the statistical information acquisition circuit 102F makes it possible to acquire accurate statistical information with a limited bit width.

The statistical information acquisition circuit 102F of the second embodiment acquires information of a bit position specified by a numerical value of an exponent part in floating point number data, by the decoder 2F42, and thus it is possible to properly acquire a distribution of values of normalized floating point numbers. The processor 10A may integrate information on bit positions acquired by the statistical information acquisition circuit 102F, by the statistical information aggregating circuit 104, and may acquire a distribution of values of floating point number data.

The statistical information acquisition circuit 102F of the second embodiment detects 0, a +− infinite value, a value that may not be expressed by a normalized floating point number (a denormalized number), and a value other than a numerical value (NAN) by the special value detection circuit 2F3, and includes the detected values in the statistical information. Therefore, the processor 10A of the second embodiment may acquire statistical information including special values, and provide a material for determining whether conversion from a floating point number to a fixed point number is possible. For example, the denormalized number is a small value that is not expressible as a normalized floating point number but statistical information may be acquired with a high accuracy through counting in out[0] in FIG. 36. For example, when a value of an exponent part from which a value designated by a statistical range designation register is subtracted exceeds 37, counting in out[37] is made by a processing by the decoder 2F42. For the +− infinite value as well, counting in out[37] is made. Therefore, even values in a large range not processible in the statistical information acquisition circuit 102E are accurately reflected in statistical information.

The information processing apparatus 1A of the second embodiment converts floating point number data into fixed point number data when statistical information acquired by the processor 10A satisfies a predetermined condition exemplified in WE162 of FIG. 39 or in WE162 of FIG. 40. Therefore, even in a processing including variables for which sufficient accuracy may not be secured with fixed point number data, the information processing apparatus 1A may execute a processing of only variables for which sufficient accuracy may be secured with fixed point number data, with the fixed point number data.

Then, the predetermined condition is determined by the most significant digit value d_of in a range where an overflow rate (the number of data pieces in a region to be saturated/the total number of data pieces)<a reference value $r_{of}$, and the least significant digit d_uf in a range where an underflow rate (the number of data pieces in a region where underflow occurs/the total number of data pieces)<a reference value $r_{uf}$. That is, when the bit width width=d_of−$r_{uf}$+1 may be expressed with fixed point number data with a high accuracy, the information processing apparatus 1A converts a floating point number into a fixed point number. Therefore, the information processing apparatus 1A may determine whether conversion from a floating point number into a fixed point number is possible based on whether it is possible to perform a processing with fixed point number data with a high accuracy. The information processing apparatus 1A may control the overflow rate and the underflow rate to a proper range in a processing such as learning.

In the above second embodiment, at the initial stage of a learning processing, a processing is executed on parameters and weights in deep learning with floating point numbers, and then floating point numbers are converted into fixed point numbers when a bit width falls within a reference value $W_{float}$ based on statistical information. Thus, it is possible to avoid collapse of learning without determining an initial value of a weight by preliminary learning. It is possible to reduce a load on the processor 10A, which is caused by operations of floating point numbers.

<First Modification>

In the above second embodiment, it is assumed that a user specifies, for example, reference values $W_{float}$ and $W_{fixed\_8bit}$ for determining a bit width. Also, it is assumed that a user specifies a reference value $r_{of}$ of an overflow rate (the number of data pieces in a region to be saturated/the total number of data pieces), and a reference value $r_{uf}$ of an underflow rate (the number of data pieces in a region where underflow occurs/the total number of data pieces). However, the information processing apparatus 1A may execute, for example, deep learning while varying these reference values $W_{float}$, $W_{fixed\_8bit}$, $r_{of}$, and $r_{uf}$ and determine these reference values from the evaluation result on the recognition accuracy.

Figure 51:
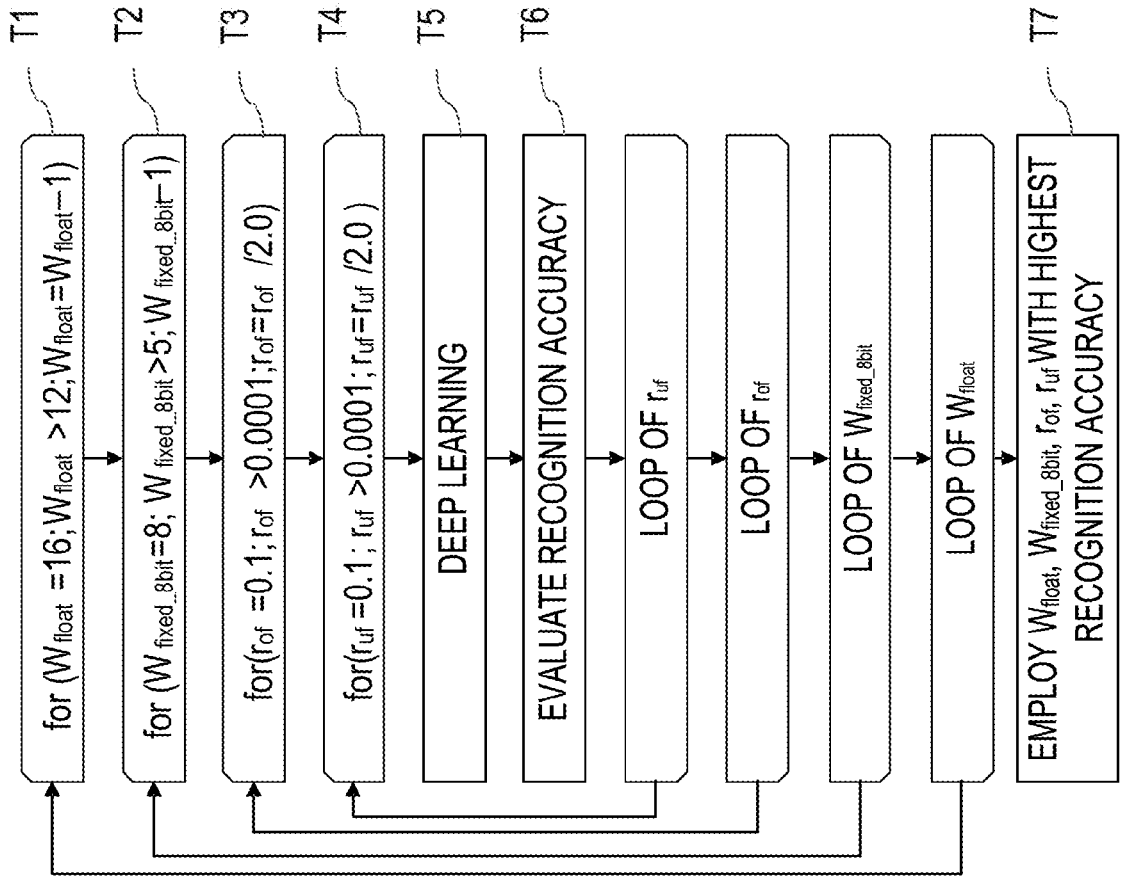
FIG. 51 is a view exemplifying a processing of determining reference values.

FIG. 51 exemplifies a processing of determining reference values $W_{float}$, $W_{fixed\_8bit}$, $r_{of}$, and $r_{uf}$. In the drawing, the processing in T1 is a repetitive control processing of changing the reference value $W_{float}$ one by one within a range of values 16 to 12. The processing in T2 is a repetitive control processing of changing the reference value $W_{fixed\_8bit}$ one by one within a range of values 8 to 5. The processing in T3 is a repetitive control processing of changing the reference value $r_{of}$ by 1/2.0 times within a range of values 0.1 to 0.0001. The processing in T4 is a repetitive control processing of changing the reference value $r_{uf}$ by 1/2.0 times within a range of values 0.1 to 0.0001. Then, the information processing apparatus 1A executes deep learning as well as these controls of repetitions (T5). In the deep learning, the information processing apparatus 1A acquires statistical information according to the second embodiment, determines whether conversion from floating point number data into fixed point number data is possible, and converts floating point number data into fixed point number data when a predetermined condition (WE162) is satisfied.

Then, the information processing apparatus 1A executes evaluation on recognition accuracy (T6). Then, after controls on all repetitions (T1 to T4) are completed, the information processing apparatus 1A may employ reference values $W_{float}$, $W_{fixed\_8bit}$, $r_{of}$, and $r_{uf}$ with the highest recognition accuracy (T7). Through such a processing, the information processing apparatus 1A may employ reference values $W_{float}$, $W_{fixed\_8bit}$, $r_{of}$, and $r_{uf}$ suitable for the corresponding learning processing.

<Second Modification>

In the above embodiment, when a bit width falls within a reference value $W_{float}$, the information processing apparatus 1A converts floating point number data into fixed point number data. However, for example, a case is assumed in which even when a bit width is less than a reference value $W_{float}$, conversion from floating point number data to fixed point number data is not proper.

Figure 52:
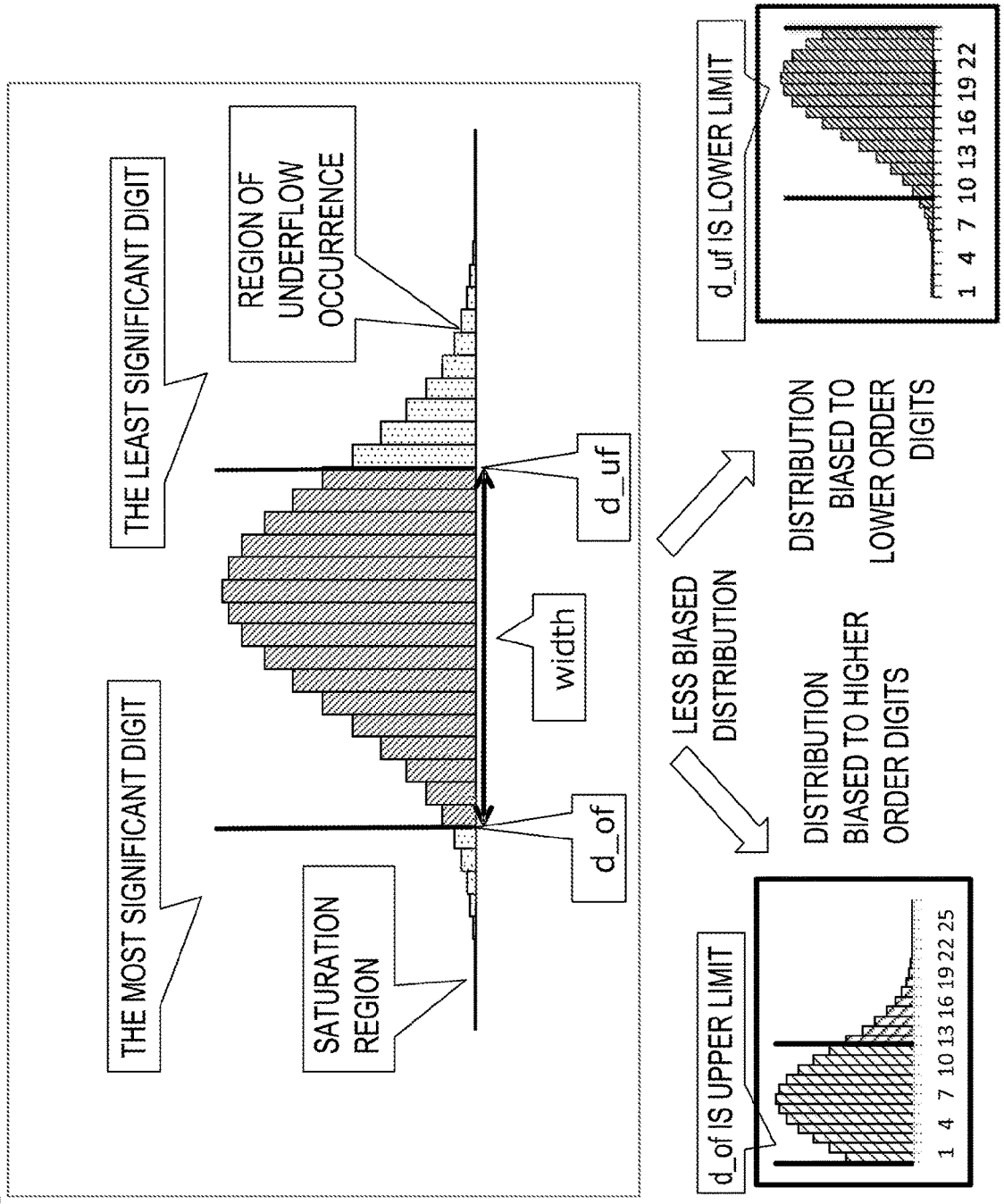
FIG. 52 is an example in which there is a bias in a distribution of floating point number data.

FIG. 52 is an example in which there is a bias in a distribution of floating point number data. For example, as exemplified at the left lower side in FIG. 52, a distribution of floating point number data may be biased to higher order digits. That is, when the most significant digit d_of in a range where an overflow rate (the number of data pieces in a region to be saturated/the total number of data pieces)<a reference value $r_{of}$ exceeds a predetermined upper limit (when the most significant digit d_of is too large), it is difficult to suppress the overflow rate in an operation by fixed point number data.

For example, as exemplified at the right lower side in FIG. 52, a distribution of floating point number data may be biased to lower order digits. That is, when the least significant digit d_uf in a range where an underflow rate (the number of data pieces in a region where underflow occurs/the total number of data pieces)<a reference value $r_{uf}$ exceeds a predetermined lower limit (when the least significant digit d_uf is too small), it is difficult to suppress the underflow rate in an operation by fixed point number data. Therefore, the program executed by the information processing apparatus 1A may not allow execution of conversion from floating point number data to fixed point number data when the most significant digit value d_of exceeds a predetermined limit, or when the least significant digit d_uf exceeds a predetermined limit.

Figure 53:
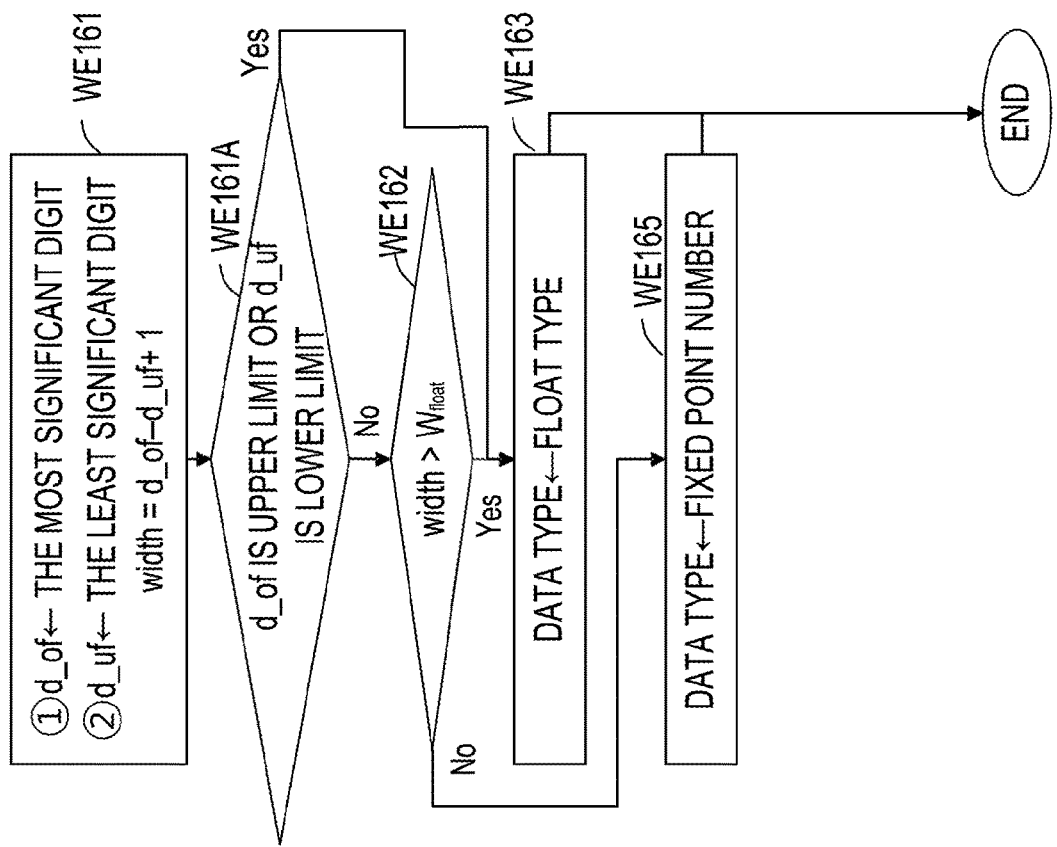
FIG. 53 is a view exemplifying a processing of suppressing conversion from floating point number data into fixed point number data.

FIG. 53 exemplifies a processing of suppressing conversion from floating point number data into fixed point number data. Steps other than determination in WE161A in the drawing are the same as those in FIG. 39. That is, when it is determined that the most significant digit value d_of reaches a predetermined upper limit, or the least significant digit d_uf reaches a predetermined lower limit ("YES" in S161A), the information processing apparatus 1A maintains a data type as a floating point number (Float type), and does not execute conversion from floating point number data into fixed point number data (S163). Through such a processing, the information processing apparatus 1A may exclude a case where even when a bit width is less than a reference value $W_{float}$, conversion from floating point number data to fixed point number data is improper. That is, the information processing apparatus 1A may suppress an increase of an overflow rate or an underflow rate. It can be said that a case where the most significant digit value d_of reaches the predetermined upper limit is an example of a case where the most significant bit position of a bit range in which the overflow rate satisfies a first condition exceeds a predetermined limit. It can be said that a case where the least significant digit d_uf reaches the predetermined lower limit is an example of a case where the least significant bit position of a bit range in which the underflow rate satisfies a second condition exceeds a predetermined limit. Therefore, it can be said that in the case of YES in WE161A, not executing conversion from floating point number data into fixed point number data is an example in which a converting circuit restricts conversion from the floating point number data to the fixed point number data.

As described above, the information processing apparatus 1A detects a state where the most significant digit value d_of in a range where the overflow rate<the reference value $r_{of}$ exceeds the predetermined limit, or the least significant digit d_uf in a range where the underflow rate<the reference value $r_{uf}$ exceeds the predetermined limit. Then, when these states are detected, the information processing apparatus 1A performs an operation by floating point number data, and suppresses conversion from floating point number data to fixed point number data. Accordingly, for example, even when it is possible to determine that expression with a high accuracy is possible with fixed point number data based on the bit width width=d_of–$r_{uf}$+1, in a case where there is a bias in values of floating point number data, it is possible to maintain operational accuracy by suppressing conversion from floating point number data to fixed point number data.

<Third Modification>

In the above first and second embodiments, descriptions have been made on configurations and processings assuming a single processor 10 (10A), that is, assuming that the information processing apparatus 1 has the processor 10, and the information processing apparatus 1A has the processor 10A. However, the first and second embodiments are not limited to the single processor 10 (10A).

Figure 54:
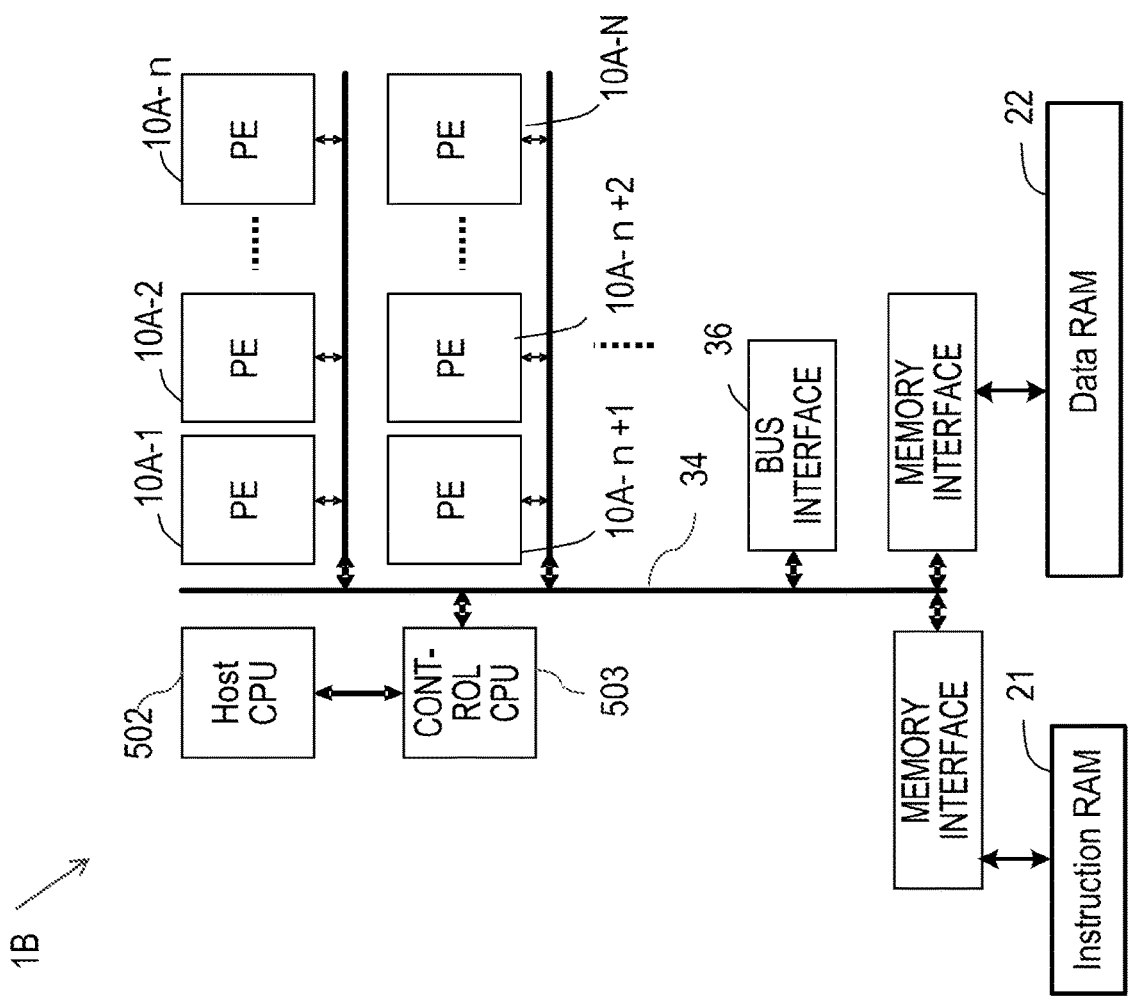
FIG. 54 is a view exemplifying a modification of the information processing apparatus.

FIG. 54 exemplifies a configuration of an information processing apparatus 1B as a modification of the information processing apparatus 1A. The information processing apparatus 1B includes a host CPU 502, a control CPU 503, and a plurality of processing circuits 10A-1 to 10A-N. In the drawing, the processing circuits 10A-1 to 10A-N are described as processor elements (PE). The control CPU 503 is connected to each of the processing circuits 10A-1 to 10A-N via a bus 34. In FIG. 54, an instruction memory 21 and a data memory 22 which are connected to the bus 34 via a bus interface 36 and a memory interface are described. Here, each of the processing circuits 10A-1 to 10A-N has the same configuration as, for example, the processor 10A in the second embodiment.

In the configuration of FIG. 54, each of the processing circuits 10A-1 to 10A-N may execute a learning processing (the entire processing in FIG. 37). The control CPU 503 may execute acquisition of statistical information, determination as to whether conversion from floating point number data to fixed point number data is possible, and conversion from floating point number data to fixed point number data, and then each of the processing circuits 10A-1 to 10A-N may execute an operation in each layer in deep learning.

<Computer-Readable Recording Medium>

A program causing a computer, other machines, or a device (hereinafter, a computer or the like) to implement any one among the above described functions may be recorded in a recording medium readable by the computer or the like. Then, by causing the computer or the like to read and execute the program in the recording medium, the corresponding function may be provided.

Here, the recording medium readable by the computer or the like refers to a recording medium that accumulates information such as data or programs by an electrical, magnetic, optical, mechanical, or chemical action, and then is readable from the computer or the like. Among such recording media, as one removable from the computer or the like, there are, for example, a flexible disk, a magneto-optical disk, a CD-ROM, a CD-R/W, a DVD, a Blu-ray disk, a DAT, a 8 mm tape, and a memory card such as a flash memory. As a recording medium fixed to the computer or the like there are, for example, a hard disk and a read-only memory (ROM). A solid state drive (SSD) may be used as not only a recording medium removable from the computer or the like, but also a recording medium fixed to the computer or the like.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the disclosure. Although the embodiment(s) of the present disclosure has (have) been described in detail, it should be understood that the various changes, substitutions, and alterations could be made hereto without departing from the spirit and scope of the disclosure.

What is claimed is:

1. An information processing apparatus comprising:
a memory; and
a processor coupled to the memory and configured to:
acquire statistical information on a distribution of bits in floating point number data after executing an instruction on the floating point number data, the statistical information being information that is accumulated by repeatedly executing a predetermined number of processes on a variable,
calculate a bit width based on the statistical information,
determine, according to whether the bit width is larger than a reference value, whether to convert to fixed-point number data, and
convert the floating point number data to the fixed point number data when a determination is made to convert to the fixed-point number data.

2. The information processing apparatus according to claim 1, wherein the processor is configured to:
designate acquisition of a specific portion in the distribution of bits in the floating point number data, and
extract the specific portion.

3. The information processing apparatus according to claim 1, wherein the processor is configured to:
acquire a bit position specified by a numerical value of an exponent part in the floating point number data, and
integrate a flag bit that indicates the bit position.

4. The information processing apparatus according to claim 1, wherein the processor is configured to:
detect at least one of 0, an +– infinite value, a value not expressible by a normalized floating point number, and a value other than a numerical value, and
include the detected value in the statistical information.

5. The information processing apparatus according to claim 1, wherein the processor is configured to:
acquire the statistical information according to an instruction stored in the memory, and
convert the floating point number data to the fixed point number data when the statistical information satisfies a predetermined condition.

6. The information processing apparatus according to claim 5, wherein the predetermined condition indicates that a bit range required for an overflow rate to satisfy a first condition and required for an underflow rate to satisfy a second condition satisfies a third condition when the floating point number data is processed with the fixed point number data.

7. The information processing apparatus according to claim 6, wherein the processor is configured to restrict conversion from the floating point number data to the fixed point number data, when a most significant bit position in a bit range where the overflow rate satisfies the first condition exceeds a first predetermined limit, or when a least significant bit position in a bit range where the underflow rate satisfies the second condition exceeds a second predetermined limit.

8. The information processing apparatus according to claim 5, wherein the processor is configured to:
   acquire the statistical information according to an instruction stored in the memory,
   convert the floating point number data into fixed point number data with a first bit width when the statistical information satisfies a predetermined fourth condition, and
   convert the floating point number data into fixed point number data with a second bit width when the statistical information does not satisfy the predetermined fourth condition.

9. The information processing apparatus according to claim 5, wherein
   the memory is configured to store an instruction string for deep learning, and
   the processor is configured to perform an operation on data to be processed in the deep learning, with floating point numbers, at time of start of the deep learning.

10. The information processing apparatus according to claim 1, wherein the processor converts the floating point number data to the fixed point number data when the bit width is equal to or not larger than the reference value.

11. An information processing method executed by a processor included in an information processing apparatus, the method comprising:
   acquiring statistical information on a distribution of bits in floating point number data after executing an instruction on the floating point number data, the statistical information being information that is accumulated by repeatedly executing a predetermined number of processes on a variable;
   calculating a bit width based on the statistical information,
   determining, according to whether the bit width is larger than a reference value, whether to convert to fixed-point number data; and
   converting the floating point number data to the fixed point number data when a determination is made to convert to the fixed-point number data.

12. The method according to claim 11, further comprising:
   designating acquisition of a specific portion in the distribution of bits in the floating point number data; and
   extracting the specific portion.

13. The method according to claim 11, further comprising:
   acquiring a bit position specified by a numerical value of an exponent part in the floating point number data; and
   integrating a flag bit that indicates the bit position.

14. The method according to claim 11, further comprising:
   detecting at least one of 0, an +− infinite value, a value not expressible by a normalized floating point number, and a value other than a numerical value; and
   including the detected value in the statistical information.

15. The method according to claim 11, further comprising:
   acquiring the statistical information according to an instruction stored in a memory; and
   converting the floating point number data to the fixed point number data when the statistical information satisfies a predetermined condition.

16. A non-transitory computer-readable recording medium storing a program that causes a processor included in an information processing apparatus to execute a process, the process comprising:
   acquiring statistical information on a distribution of bits in floating point number data after executing an instruction on the floating point number data, the statistical information being information that is accumulated by repeatedly executing a predetermined number of processes on a variable;
   calculating a bit width based on the statistical information;
   determining, according to whether or not the bit width is larger than a reference value, whether to convert to fixed-point number data; and
   converting the floating point number data to the fixed point number data when a determination is made to convert to the fixed-point number data.

* * * * *